US012086431B1

(12) United States Patent
Dreier et al.

(10) Patent No.: US 12,086,431 B1
(45) Date of Patent: Sep. 10, 2024

(54) SELECTIVE COMMUNICATION PROTOCOL LAYERING FOR SYNCHRONOUS REPLICATION

(71) Applicant: PURE STORAGE, INC., Mountain View, CA (US)

(72) Inventors: Roland Dreier, Mountain View, CA (US); Anatoliy Glagolev, Sunnyvale, CA (US); Logan Jennings, Menlo Park, CA (US); Aaron Dailey, San Jose, CA (US); Nicole Tselentis, Los Altos, CA (US); Daquan Zuo, Mountain View, CA (US)

(73) Assignee: PURE STORAGE, INC., Santa Clara, CA (US)

( * ) Notice: Subject to any disclaimer, the term of this patent is extended or adjusted under 35 U.S.C. 154(b) by 669 days.

(21) Appl. No.: 16/862,678

(22) Filed: Apr. 30, 2020

Related U.S. Application Data

(63) Continuation-in-part of application No. 16/400,665, filed on May 1, 2019, which is a continuation of
(Continued)

(51) Int. Cl.
*G06F 3/06* (2006.01)
*G06F 13/42* (2006.01)
(Continued)

(52) U.S. Cl.
CPC ............ *G06F 3/0631* (2013.01); *G06F 3/067* (2013.01); *G06F 13/42* (2013.01);
(Continued)

(58) Field of Classification Search
CPC ........ G06F 3/0631; G06F 3/067; G06F 30/34; G06F 16/1824; G06F 16/1827;
(Continued)

(56) References Cited

U.S. PATENT DOCUMENTS 5,706,210 A    1/1998  Kumano et al.
5,799,200 A    8/1998  Brant et al.
(Continued)

FOREIGN PATENT DOCUMENTS

EP       0725324 A2    8/1996
WO    2005043415 A1    5/2005
(Continued)

OTHER PUBLICATIONS

International Search Report and Written Opinion, PCT/US2019/033224, mailed Sep. 9, 2019, 11 pages.
(Continued)

*Primary Examiner* — Farley Abad

(57) ABSTRACT

Selective communication protocol layering for synchronous replication, including: initiating, by a first storage system issuing a command in accordance with a first communication protocol, a connection specifying the first storage system to be a target of storage content from a second storage system; receiving, from the second storage system by the first storage system, a connection request in accordance with the first communication protocol, wherein the connection request specifies the first storage system to be a source of storage content to the second storage system; and based on both initiating the connection and receiving the connection request in accordance with the first communication protocol: establishing, by the first storage system and in accordance with a second communication protocol, both a connection for receiving storage content from the second storage system and a connection for sending storage content to the second storage system.

21 Claims, 23 Drawing Sheets

Related U.S. Application Data application No. 16/175,316, filed on Oct. 30, 2018, now Pat. No. 10,310,760, which is a continuation-in-part of application No. 16/050,698, filed on Jul. 31, 2018.

(60) Provisional application No. 62/695,433, filed on Jul. 9, 2018, provisional application No. 62/674,691, filed on May 22, 2018, provisional application No. 62/674,570, filed on May 21, 2018.

(51) Int. Cl.

| | | |
|---|---|---|
| *G06F 16/182* | (2019.01) | |
| *G06F 30/34* | (2020.01) | |
| *H03K 19/0175* | (2006.01) | |
| *H04L 67/1095* | (2022.01) | |
| *H04L 67/1097* | (2022.01) | |

(52) U.S. Cl.
CPC ...... *G06F 16/1824* (2019.01); *G06F 16/1827* (2019.01); *G06F 30/34* (2020.01); *H03K 19/017581* (2013.01); *H04L 67/1095* (2013.01); *H04L 67/1097* (2013.01)

(58) Field of Classification Search
CPC ............ G06F 13/42; H03K 19/017581; H04L 67/1097; H04L 67/10985; H04L 67/1095
See application file for complete search history.

(56) References Cited

U.S. PATENT DOCUMENTS

| | | |
|---|---|---|
| 5,933,598 A | 8/1999 | Scales et al. |
| 6,012,032 A | 1/2000 | Donovan et al. |
| 6,065,087 A | 5/2000 | Keaveny et al. |
| 6,085,333 A | 7/2000 | Dekoning et al. |
| 6,092,140 A | 7/2000 | Tausheck |
| 6,185,631 B1 | 2/2001 | Casper et al. |
| 6,230,218 B1 | 5/2001 | Casper et al. |
| 6,240,446 B1 | 5/2001 | Casper et al. |
| 6,260,079 B1 | 7/2001 | White |
| 6,314,477 B1 | 11/2001 | Cowger et al. |
| 6,336,157 B1 | 1/2002 | Carbonaro et al. |
| 6,338,083 B1 | 1/2002 | Casper et al. |
| 6,341,315 B1 | 1/2002 | Arroyo et al. |
| 6,356,944 B1 | 3/2002 | McCarty |
| 6,453,357 B1 | 9/2002 | Crow et al. |
| 6,463,498 B1 | 10/2002 | Wakeley et al. |
| 6,470,026 B1 | 10/2002 | Pearson et al. |
| 6,473,782 B1 | 10/2002 | Casper et al. |
| 6,477,139 B1 | 11/2002 | Anderson et al. |
| 6,477,171 B1 | 11/2002 | Wakeley et al. |
| 6,493,750 B1 | 12/2002 | Mathew et al. |
| 6,499,066 B1 | 12/2002 | Frazier |
| 6,526,458 B1 | 2/2003 | Steinmetz et al. |
| 6,578,096 B1 | 6/2003 | Steinmetz et al. |
| 6,643,641 B1 | 11/2003 | Snyder |
| 6,647,514 B1 | 11/2003 | Umberger et al. |
| 6,687,766 B1 | 2/2004 | Casper et al. |
| 6,775,693 B1 | 8/2004 | Adams |
| 6,789,162 B1 | 9/2004 | Talagala et al. |
| 6,791,989 B1 | 9/2004 | Steinmetz et al. |
| 6,865,617 B2 | 3/2005 | Zeidner et al. |
| 6,898,184 B1 | 5/2005 | Anderson et al. |
| 6,937,730 B1 | 8/2005 | Buxton |
| 7,089,272 B1 | 8/2006 | Garthwaite et al. |
| 7,107,389 B2 | 9/2006 | Inagaki et al. |
| 7,146,521 B1 | 12/2006 | Nguyen |
| 7,260,112 B2 | 8/2007 | Moretti et al. |
| 7,334,124 B2 | 2/2008 | Pham et al. |
| 7,437,530 B1 | 10/2008 | Rajan |
| 7,493,424 B1 | 2/2009 | Bali et al. |
| 7,539,790 B1 | 5/2009 | Cameron |
| 7,627,643 B1 | 12/2009 | Ignatoff et al. |
| 7,669,000 B2 | 2/2010 | Sharma et al. |
| 7,669,029 B1 | 2/2010 | Mishra et al. |
| 7,689,609 B2 | 3/2010 | Lango et al. |
| 7,711,871 B1 | 5/2010 | Haechten et al. |
| 7,724,918 B2 | 5/2010 | Balakrishnan et al. |
| 7,743,178 B2 | 6/2010 | Warren et al. |
| 7,743,191 B1 | 6/2010 | Liao |
| 7,769,722 B1 | 8/2010 | Bergant et al. |
| 7,853,741 B2 | 12/2010 | Crespi et al. |
| 7,899,780 B1 | 3/2011 | Shmuylovich et al. |
| 7,934,023 B2 | 4/2011 | Basavaiah et al. |
| 7,979,742 B2 | 7/2011 | Uysal et al. |
| 8,042,163 B1 | 10/2011 | Karr et al. |
| 8,055,726 B1 | 11/2011 | Shah |
| 8,086,585 B1 | 12/2011 | Brashers et al. |
| 8,200,887 B2 | 6/2012 | Bennett |
| 8,271,673 B2 | 9/2012 | Arroyo et al. |
| 8,271,700 B1 | 9/2012 | Annem et al. |
| 8,286,030 B1 | 10/2012 | Chatterjee et al. |
| 8,387,136 B2 | 2/2013 | Lee et al. |
| 8,396,981 B1 | 3/2013 | Lee et al. |
| 8,437,189 B1 | 5/2013 | Montierth et al. |
| 8,465,332 B2 | 6/2013 | Hogan et al. |
| 8,489,831 B2 | 7/2013 | Thompson et al. |
| 8,504,766 B2 | 8/2013 | Young |
| 8,527,544 B1 | 9/2013 | Colgrove et al. |
| 8,566,546 B1 | 10/2013 | Marshak et al. |
| 8,578,442 B1 | 11/2013 | Banerjee |
| 8,613,066 B1 | 12/2013 | Brezinski et al. |
| 8,620,970 B2 | 12/2013 | English et al. |
| 8,667,511 B2 | 3/2014 | Khanvilkar et al. |
| 8,676,928 B1 | 3/2014 | Shah |
| 8,732,357 B2 | 5/2014 | Klein et al. |
| 8,738,813 B1 | 5/2014 | Natanzon et al. |
| 8,751,463 B1 | 6/2014 | Chamness |
| 8,762,642 B2 | 6/2014 | Bates et al. |
| 8,769,622 B2 | 7/2014 | Chang et al. |
| 8,800,009 B1 | 8/2014 | Beda et al. |
| 8,806,274 B1 | 8/2014 | Chatterjee et al. |
| 8,812,606 B2 | 8/2014 | Cashman et al. |
| 8,812,860 B1 | 8/2014 | Bray |
| 8,848,727 B2 | 9/2014 | Saraiya et al. |
| 8,850,546 B1 | 9/2014 | Field et al. |
| 8,898,346 B1 | 11/2014 | Simmons |
| 8,904,023 B2 | 12/2014 | Arroyo et al. |
| 8,909,854 B2 | 12/2014 | Yamagishi et al. |
| 8,931,041 B1 | 1/2015 | Banerjee |
| 8,948,199 B2 | 2/2015 | Kagan et al. |
| 8,949,863 B1 | 2/2015 | Coatney et al. |
| 8,984,602 B1 | 3/2015 | Bailey et al. |
| 8,990,905 B1 | 3/2015 | Bailey et al. |
| 9,009,078 B2 | 4/2015 | Dionne |
| 9,015,333 B2 | 4/2015 | Rao et al. |
| 9,052,837 B2 | 6/2015 | Huang et al. |
| 9,081,713 B1 | 7/2015 | Bennett |
| 9,124,569 B2 | 9/2015 | Hussain et al. |
| 9,134,922 B2 | 9/2015 | Rajagopal et al. |
| 9,164,947 B1 | 10/2015 | Borker |
| 9,189,334 B2 | 11/2015 | Bennett |
| 9,195,626 B2 | 11/2015 | Pandit et al. |
| 9,209,973 B2 | 12/2015 | Aikas et al. |
| 9,232,000 B1 | 1/2016 | Pittman |
| 9,237,057 B1 | 1/2016 | Pittman |
| 9,250,823 B1 | 2/2016 | Kamat et al. |
| 9,264,495 B2 | 2/2016 | Rao et al. |
| 9,270,786 B1 | 2/2016 | Pittman |
| 9,300,660 B1 | 3/2016 | Borowiec et al. |
| 9,311,182 B2 | 4/2016 | Bennett |
| 9,407,601 B1 | 8/2016 | Pittman |
| 9,430,412 B2 | 8/2016 | Huang |
| 9,444,822 B1 | 9/2016 | Borowiec et al. |
| 9,455,938 B2 | 9/2016 | Arroyo et al. |
| 9,471,579 B1 | 10/2016 | Natanzon |
| 9,473,589 B1 | 10/2016 | Pittman |
| 9,473,590 B1 | 10/2016 | Pittman |
| 9,473,591 B1 | 10/2016 | Pittman |
| 9,483,433 B2 | 11/2016 | Casper et al. |
| 9,507,532 B1 | 11/2016 | Colgrove et al. |
| 9,509,797 B1 | 11/2016 | Pittman |

(56) References Cited

U.S. PATENT DOCUMENTS

| | | |
|---|---|---|
| 9,514,151 B1 | 12/2016 | Pittman |
| 9,514,324 B1 | 12/2016 | Potlapally et al. |
| 9,531,765 B1 | 12/2016 | Pittman |
| 9,563,383 B2 | 2/2017 | Jin et al. |
| 9,563,423 B1 | 2/2017 | Pittman |
| 9,565,110 B2 | 2/2017 | Mullendore et al. |
| 9,565,269 B2 | 2/2017 | Malwankar et al. |
| 9,591,099 B1 | 3/2017 | Pittman |
| 9,626,309 B1 | 4/2017 | Burke et al. |
| 9,632,870 B2 | 4/2017 | Bennett |
| 9,639,592 B1 | 5/2017 | Natanzon et al. |
| 9,647,905 B1 | 5/2017 | Pittman |
| RE46,439 E | 6/2017 | Schneider et al. |
| 9,672,117 B1 | 6/2017 | Natanzon et al. |
| 9,697,215 B2 | 7/2017 | Sabdar et al. |
| 9,712,427 B1 | 7/2017 | Pittman |
| 9,712,619 B1 | 7/2017 | Malwankar et al. |
| 9,720,626 B2 | 8/2017 | Buzzard et al. |
| 9,785,355 B2 | 10/2017 | Huang |
| 9,785,356 B2 | 10/2017 | Huang |
| 9,807,164 B2 | 10/2017 | Wareing |
| 9,817,606 B1 | 11/2017 | Byrne et al. |
| 9,933,956 B2 | 4/2018 | Ramachandran et al. |
| 9,936,024 B2 | 4/2018 | Malwankar et al. |
| 9,940,293 B1 | 4/2018 | Desai et al. |
| 9,986,028 B2 | 5/2018 | Cayton et al. |
| 9,990,511 B1 | 6/2018 | Dreyfus |
| 10,044,796 B2 | 8/2018 | Cashman et al. |
| 10,146,648 B1 | 12/2018 | Vokaliga et al. |
| 10,152,386 B1 | 12/2018 | Ramachandran et al. |
| 10,175,891 B1 | 1/2019 | Malwankar et al. |
| 10,257,184 B1 | 4/2019 | Mehta et al. |
| 10,310,760 B1 | 6/2019 | Dreier et al. |
| 10,365,978 B1 | 7/2019 | Whitney et al. |
| 10,509,914 B1 | 12/2019 | Desai et al. |
| 10,528,488 B1 | 1/2020 | Lee et al. |
| 10,542,423 B1 | 1/2020 | Chang et al. |
| 10,594,730 B1 | 3/2020 | Summers et al. |
| 10,601,876 B1 | 3/2020 | Levy |
| 10,795,583 B2 * | 10/2020 | Yang .................... G06F 3/0649 |
| 10,901,627 B1 | 1/2021 | BShara et al. |
| 11,455,409 B2 | 9/2022 | Fisher et al. |
| 11,675,503 B1 | 6/2023 | Ekins |
| 2002/0013802 A1 | 1/2002 | Mori et al. |
| 2003/0145172 A1 | 7/2003 | Galbraith et al. |
| 2003/0191783 A1 | 10/2003 | Wolczko et al. |
| 2003/0225961 A1 | 12/2003 | Chow et al. |
| 2004/0080985 A1 | 4/2004 | Chang et al. |
| 2004/0111573 A1 | 6/2004 | Garthwaite |
| 2004/0153844 A1 | 8/2004 | Ghose et al. |
| 2004/0193814 A1 | 9/2004 | Erickson et al. |
| 2004/0260967 A1 | 12/2004 | Guha et al. |
| 2005/0086531 A1 | 4/2005 | Kenrich |
| 2005/0149759 A1 | 7/2005 | Vishwanath et al. |
| 2005/0160416 A1 | 7/2005 | Jamison |
| 2005/0188246 A1 | 8/2005 | Emberty et al. |
| 2005/0216800 A1 | 9/2005 | Bicknell et al. |
| 2005/0251865 A1 | 11/2005 | Mont et al. |
| 2006/0015771 A1 | 1/2006 | Van Gundy et al. |
| 2006/0129817 A1 | 6/2006 | Borneman et al. |
| 2006/0161726 A1 | 7/2006 | Lasser |
| 2006/0230245 A1 | 10/2006 | Gounares et al. |
| 2006/0239075 A1 | 10/2006 | Williams et al. |
| 2007/0022163 A1 | 1/2007 | Wormald et al. |
| 2007/0022227 A1 | 1/2007 | Miki |
| 2007/0028068 A1 | 2/2007 | Golding et al. |
| 2007/0055702 A1 | 3/2007 | Fridella et al. |
| 2007/0100829 A1 | 5/2007 | Allen et al. |
| 2007/0109856 A1 | 5/2007 | Pellicone et al. |
| 2007/0150689 A1 | 6/2007 | Pandit et al. |
| 2007/0168321 A1 | 7/2007 | Saito et al. |
| 2007/0220227 A1 | 9/2007 | Long |
| 2007/0294563 A1 | 12/2007 | Bose |
| 2007/0294564 A1 | 12/2007 | Reddin et al. |
| 2008/0005587 A1 | 1/2008 | Ahlquist |
| 2008/0077825 A1 | 3/2008 | Bello et al. |
| 2008/0162674 A1 | 7/2008 | Dahiya |
| 2008/0195833 A1 | 8/2008 | Park |
| 2008/0270370 A1 | 10/2008 | Castellanos et al. |
| 2008/0270678 A1 | 10/2008 | Cornwell et al. |
| 2008/0282045 A1 | 11/2008 | Biswas et al. |
| 2009/0043958 A1 | 2/2009 | Kaneda et al. |
| 2009/0077340 A1 | 3/2009 | Johnson et al. |
| 2009/0100115 A1 | 4/2009 | Park et al. |
| 2009/0150631 A1 | 6/2009 | Wilsey et al. |
| 2009/0198889 A1 | 8/2009 | Ito et al. |
| 2010/0052625 A1 | 3/2010 | Cagno et al. |
| 2010/0211723 A1 | 8/2010 | Mukaida |
| 2010/0246266 A1 | 9/2010 | Park et al. |
| 2010/0257142 A1 | 10/2010 | Murphy et al. |
| 2010/0262764 A1 | 10/2010 | Liu et al. |
| 2010/0318812 A1 | 12/2010 | Auradkar et al. |
| 2010/0325345 A1 | 12/2010 | Ohno et al. |
| 2010/0332754 A1 | 12/2010 | Lai et al. |
| 2011/0072290 A1 | 3/2011 | Davis et al. |
| 2011/0125955 A1 | 5/2011 | Chen |
| 2011/0131231 A1 | 6/2011 | Haas et al. |
| 2011/0167221 A1 | 7/2011 | Pangal et al. |
| 2012/0023144 A1 | 1/2012 | Rub |
| 2012/0054264 A1 | 3/2012 | Haugh et al. |
| 2012/0079318 A1 | 3/2012 | Colgrove et al. |
| 2012/0131253 A1 | 5/2012 | McKnight et al. |
| 2012/0198269 A1 | 8/2012 | Gupta et al. |
| 2012/0245954 A1 | 9/2012 | Klotz et al. |
| 2012/0303576 A1 | 11/2012 | Calder et al. |
| 2012/0303919 A1 | 11/2012 | Hu et al. |
| 2012/0311000 A1 | 12/2012 | Post et al. |
| 2012/0330959 A1 | 12/2012 | Kretz et al. |
| 2013/0007845 A1 | 1/2013 | Chang et al. |
| 2013/0031414 A1 | 1/2013 | Dhuse et al. |
| 2013/0036272 A1 | 2/2013 | Nelson |
| 2013/0054650 A1 | 2/2013 | O'Byrne |
| 2013/0071087 A1 | 3/2013 | Motiwala et al. |
| 2013/0145447 A1 | 6/2013 | Maron |
| 2013/0191555 A1 | 7/2013 | Liu |
| 2013/0198459 A1 | 8/2013 | Joshi et al. |
| 2013/0205173 A1 | 8/2013 | Yoneda |
| 2013/0219164 A1 | 8/2013 | Hamid |
| 2013/0227201 A1 | 8/2013 | Talagala et al. |
| 2013/0290607 A1 | 10/2013 | Chang et al. |
| 2013/0311434 A1 | 11/2013 | Jones |
| 2013/0318297 A1 | 11/2013 | Jibbe et al. |
| 2013/0332614 A1 | 12/2013 | Brunk et al. |
| 2014/0020083 A1 | 1/2014 | Fetik |
| 2014/0074850 A1 | 3/2014 | Noel et al. |
| 2014/0082715 A1 | 3/2014 | Grajek et al. |
| 2014/0086146 A1 | 3/2014 | Kim et al. |
| 2014/0090009 A1 | 3/2014 | Li et al. |
| 2014/0096220 A1 | 4/2014 | Pinto et al. |
| 2014/0101434 A1 | 4/2014 | Senthurpandi et al. |
| 2014/0164774 A1 | 6/2014 | Nord et al. |
| 2014/0173232 A1 | 6/2014 | Reohr et al. |
| 2014/0181039 A1 | 6/2014 | Harrison et al. |
| 2014/0195636 A1 | 7/2014 | Karve et al. |
| 2014/0201512 A1 | 7/2014 | Seethaler et al. |
| 2014/0201541 A1 | 7/2014 | Paul et al. |
| 2014/0208155 A1 | 7/2014 | Pan |
| 2014/0215108 A1 | 7/2014 | Pandit et al. |
| 2014/0215590 A1 | 7/2014 | Brand |
| 2014/0229654 A1 | 8/2014 | Goss et al. |
| 2014/0230017 A1 | 8/2014 | Saib |
| 2014/0258526 A1 | 9/2014 | Le Sant et al. |
| 2014/0282983 A1 | 9/2014 | Ju et al. |
| 2014/0285917 A1 | 9/2014 | Cudak et al. |
| 2014/0325262 A1 | 10/2014 | Cooper et al. |
| 2014/0351627 A1 | 11/2014 | Best et al. |
| 2014/0373104 A1 | 12/2014 | Gaddam et al. |
| 2014/0373126 A1 | 12/2014 | Hussain et al. |
| 2015/0012607 A1 | 1/2015 | Cayton et al. |
| 2015/0026387 A1 | 1/2015 | Sheredy et al. |
| 2015/0039783 A1 | 2/2015 | Arroyo et al. |
| 2015/0074463 A1 | 3/2015 | Jacoby et al. |
| 2015/0089569 A1 | 3/2015 | Sondhi et al. |
| 2015/0095515 A1 | 4/2015 | Krithivas et al. |

(56) References Cited

U.S. PATENT DOCUMENTS

| | | |
|---|---|---|
| 2015/0113203 A1 | 4/2015 | Dancho et al. |
| 2015/0121137 A1 | 4/2015 | McKnight et al. |
| 2015/0134920 A1 | 5/2015 | Anderson et al. |
| 2015/0149822 A1 | 5/2015 | Coronado et al. |
| 2015/0193169 A1 | 7/2015 | Sundaram et al. |
| 2015/0220917 A1 | 8/2015 | Aabye et al. |
| 2015/0261446 A1 | 9/2015 | Lee |
| 2015/0363278 A1 | 12/2015 | Harris et al. |
| 2015/0365385 A1 | 12/2015 | Hore |
| 2015/0378606 A1 | 12/2015 | Huang |
| 2015/0378640 A1 | 12/2015 | Huang |
| 2015/0378888 A1 | 12/2015 | Zhang et al. |
| 2015/0379107 A1 | 12/2015 | Rank et al. |
| 2016/0004452 A1 | 1/2016 | Hayes et al. |
| 2016/0041942 A1 | 2/2016 | Pandit et al. |
| 2016/0063269 A1 | 3/2016 | Liden et al. |
| 2016/0085718 A1 | 3/2016 | Huang |
| 2016/0098323 A1 | 4/2016 | Mutha et al. |
| 2016/0127468 A1 | 5/2016 | Malwankar et al. |
| 2016/0127492 A1 | 5/2016 | Malwankar et al. |
| 2016/0132645 A1 | 5/2016 | Charpentier et al. |
| 2016/0132721 A1 | 5/2016 | Bostick et al. |
| 2016/0188731 A1 | 6/2016 | Dai et al. |
| 2016/0188893 A1 | 6/2016 | Ghafourifar |
| 2016/0210075 A1 | 7/2016 | Frank et al. |
| 2016/0224259 A1 | 8/2016 | Ahrens et al. |
| 2016/0335454 A1 | 11/2016 | Choe et al. |
| 2016/0350009 A1 | 12/2016 | Cerreta et al. |
| 2016/0352720 A1 | 12/2016 | Hu et al. |
| 2016/0352830 A1 | 12/2016 | Borowiec et al. |
| 2016/0352834 A1 | 12/2016 | Borowiec et al. |
| 2017/0031779 A1 | 2/2017 | Helliker et al. |
| 2017/0047114 A1 | 2/2017 | Song et al. |
| 2017/0054805 A1* | 2/2017 | Langas ................. G06F 3/0671 |
| 2017/0093972 A1 | 3/2017 | Paulzagade et al. |
| 2017/0116343 A1 | 4/2017 | Wu et al. |
| 2017/0134427 A1 | 5/2017 | Hutchins et al. |
| 2017/0147829 A1 | 5/2017 | Cismas et al. |
| 2017/0149897 A1 | 5/2017 | Malwankar et al. |
| 2017/0222799 A1 | 8/2017 | Telford |
| 2017/0235490 A1 | 8/2017 | Tan |
| 2017/0235762 A1 | 8/2017 | Sharpe et al. |
| 2017/0242599 A1 | 8/2017 | Patnaik et al. |
| 2018/0007040 A1 | 1/2018 | Thom et al. |
| 2018/0081562 A1 | 3/2018 | Vasudevan |
| 2018/0095915 A1 | 4/2018 | Prabhakar et al. |
| 2018/0150477 A1 | 5/2018 | Jewell et al. |
| 2018/0173420 A1 | 6/2018 | Li et al. |
| 2018/0253360 A1 | 9/2018 | B |
| 2019/0026038 A1 | 1/2019 | Voigt |
| 2019/0034381 A1 | 1/2019 | Burstein et al. |
| 2019/0073490 A1 | 3/2019 | Agrawal et al. |
| 2019/0075130 A1 | 3/2019 | Petry et al. |
| 2019/0075218 A1 | 3/2019 | Ribani et al. |
| 2019/0156180 A1 | 5/2019 | Nomura et al. |
| 2019/0294565 A1* | 9/2019 | Pinto ..................... G06F 13/28 |
| 2019/0354403 A1 | 11/2019 | Ayyagari et al. |
| 2019/0354628 A1 | 11/2019 | Grunwald et al. |
| 2019/0354708 A1 | 11/2019 | Fisher et al. |
| 2020/0026547 A1 | 1/2020 | Bryant et al. |
| 2020/0053090 A1 | 2/2020 | Kliger et al. |
| 2020/0081704 A1 | 3/2020 | Bafna et al. |
| 2020/0110672 A1 | 4/2020 | Srinivasan |
| 2020/0110675 A1 | 4/2020 | Wang et al. |
| 2020/0142634 A1 | 5/2020 | Surcouf et al. |
| 2021/0243193 A1 | 8/2021 | Padmanabhan |
| 2022/0166802 A1 | 5/2022 | Roozbehani et al. |
| 2022/0215111 A1 | 7/2022 | Ekins |

FOREIGN PATENT DOCUMENTS

| | | |
|---|---|---|
| WO | 2012087648 A2 | 6/2012 |
| WO | 2013071087 A1 | 5/2013 |
| WO | 2014110137 A1 | 7/2014 |
| WO | 2016015008 A1 | 1/2016 |
| WO | 2016100790 A1 | 6/2016 |
| WO | 2016190938 A1 | 12/2016 |
| WO | 2016195759 A1 | 12/2016 |
| WO | 2016195958 A1 | 12/2016 |
| WO | 2016195961 A1 | 12/2016 |
| WO | 2019226597 A1 | 11/2019 |

OTHER PUBLICATIONS

Martins et al., "Survey of data replication in P2P systems", Inria, XP-002501325, dated Dec. 2006, 44 pages, URL: http://hal.infria.fr/docs/00/12/22/82/PDF/Survey_of_data_replication_in_P2P_systems.PDF.

Muntimadugu et al., "Red Hat Gluster Storage 3.2 Administration Guide", URL: https://access.rehat.com/documentation/en-us/red_hat_gluster_storage/3.2/pdf/administration_guide/Red_Hat_Gluster_Storage-3.2-Administration_Guide-en-US.pdf, sections 5.8 and 11.4, dated Aug. 2017, retrieved on Aug. 29, 2018, 465 pages.

Touchette, "Stretched Cluster: ActiveCluster Makes It Simple for All—Pure Storage", dated Dec. 27, 2017, printed Aug. 27, 2019, 11 pages, URL: https://blog.purestorage.com/activecluster-simple-stretch-clustering.

Ludeman, "From the Pure Storage Blog: Rapid Copy/Clone Automation for Oracle," http://www.vlss-llc.com/blog/from-the-pure-storage-blog-rapid-copyclone-automation-for-oracle, published Apr. 13, 2018, by VLS, 3 pages.

Bellamy-McIntyre et al., "OpenID and the Enterprise: A Model-based Analysis of Single Sign-On Authentication", 15th IEEE International Enterprise Distributed Object Computing Conference (EDOC), Aug. 29, 2011, pp. 129-138, IEEE Computer Society, USA, DOI: 10.1109/EDOC.2011.26, ISBN: 978-1-4577-0362-1.

Cidon et al., "Tiered Replication: A Cost-effective Alternative to Full Cluster Geo-replication", USENIX Association, The Advanced Computing Systems Association, 2015 USENIX Annual Technical Conference, https://www.usenix.org/conference/atc15/technical-session/presentation/cidon, Jul. 2015, 14 pages.

ETSI, "Network Function Virtualisation (NFV); Resiliency Requirements", ETSI GS NFCV-REL 001, V1.1.1, Jan. 2015, 82 pages, etsi.org (online), URL: www.etsi.org/deliver/etsi_gs/NFV-REL/001_099/001/01.01.01_60/gs_NFV-REL001v010101p.pdf.

Faith, "dictzip file format", GitHub.com (online), accessed Jul. 28, 2015, 1 page, URL: github.com/fidlej/idzip.

Google Search of "storage array define" performed on Nov. 4, 2015 for U.S. Appl. No. 14/725,278, Results limited to entries dated before 2012, 1 page.

Hota et al., "Capability-based Cryptographic Data Access Control in Cloud Computing", International Journal of Advanced Networking and Applications, col. 1, Issue 1, Aug. 2011, 10 pages, Eswar Publications, India.

Hu et al., "Container Marking: Combining Data Placement, Garbage Collection and Wear Levelling for Flash", 19th Annual IEEE International Symposium on Modelling, Analysis, and Simulation of Computer and Telecommunications Systems, Jul. 25-27, 2011, 11 pages, ISBN: 978-0-7695-4430-4, DOI: 10.1109/MASCOTS.2011.50.

International Search Report and Written Opinion, PCT/IB2017/053491, Sep. 27, 2017, 9 pages.

International Search Report and Written Opinion, PCT/US2016/015006, Apr. 29, 2016, 12 pages.

International Search Report and Written Opinion, PCT/US2016/015008, May 4, 2016, 12 pages.

International Search Report and Written Opinion, PCT/US2016/016333, Jun. 8, 2016, 12 pages.

International Search Report and Written Opinion, PCT/US2016/020410, Jul. 8, 2016, 12 pages.

International Search Report and Written Opinion, PCT/US2016/032052, Aug. 30, 2016, 17 pages.

International Search Report and Written Opinion, PCT/US2016/032084, Jul. 18, 2016, 12 pages.

International Search Report and Written Opinion, PCT/US2016/035492, Aug. 17, 2016, 10 pages.

(56) References Cited

OTHER PUBLICATIONS

International Search Report and Written Opinion, PCT/US2016/036693, Aug. 29, 2016, 10 pages.
International Search Report and Written Opinion, PCT/US2016/038758, Oct. 7, 2016, 10 pages.
International Search Report and Written Opinion, PCT/US2016/040393, Sep. 22, 2016, 10 pages.
International Search Report and Written Opinion, PCT/US2016/044020, Sep. 30, 2016, 11 pages.
International Search Report and Written Opinion, PCT/US2016/044874, Oct. 7, 2016, 11 pages.
International Search Report and Written Opinion, PCT/US2016/044875, Oct. 5, 2016, 13 pages.
International Search Report and Written Opinion, PCT/US2016/044876, Oct. 21, 2016, 12 pages.
International Search Report and Written Opinion, PCT/US2016/044877, Sep. 29, 2016, 13 pages.
Kong, "Using PCI Express as the Primary System Interconnect in Multiroot Compute, Storage, Communications and Embedded Systems", White Paper, IDT.com (online), Aug. 28, 2008, 12 pages, URL: www.idt.com/document/whp/idt-pcie-multi-root-white-paper.
Li et al., "Access Control for the Services Oriented Architecture", Proceedings of the 2007 ACM Workshop on Secure Web Services (SWS '07), Nov. 2007, pp. 9-17, ACM New York, NY.
Microsoft, "Hybrid for SharePoint Server 2013—Security Reference Architecture", Microsoft (online), Oct. 2014, 53 pages, URL: hybrid.office.com/img/Security_Reference_Architecture.pdf.
Microsoft, "Hybrid Identity Management", Microsoft (online), Apr. 2014, 2 pages, URL: download.microsoft.com/download/E/A/E/EAE57CD1-A80B-423C-96BB-142FAAC630B9/Hybrid_Identity_Datasheet.pdf.
Microsoft, "Hybrid Identity", Microsoft (online), Apr. 2014, 36 pages, URL: www.aka.ms/HybridIdentityWp.
Muntimadugu et al., "Red Hat Gluster Storage 3.2 Administration Guide", URL: https://access.redhat.com/documentation/en-us/red_hat_gluster_storage/3.2/pdf/administration_guide/Red_Hat_Gluster_Storage-3.2-Administration_Guide-en-US.pdf, sections 5.8 and 11.4, dated Aug. 2017, retrieved on Aug. 29, 2018, 5 pages.
Nazir et al., "The Impact of the Implementation Cost of Replication in Data Grid Job Scheduling, Mathematical and Computational Applications (MDPI)", http://www.mdpi.com/2297-8747/23/2/28/pdf, DOI:10.3390/mca2302002, vol. 23, Issue 2, Published May 25, 2018, 19 pages.
PCMAG, "Storage Array Definition", Published May 10, 2013, URL: http://web.archive.org/web/20130510121646/http://www.pcmag.com/encyclopedia/term/52091/storage-array, 2 pages.
Storer et al., "Secure Data Deduplication", Proceedings of the 4th ACM International Workshop on Storage Security and Survivability (StorageSS'08), Oct. 2008, 10 pages, ACM New York, NY. USA, DOI: 10.1145/1456469.1456471.
Sweere, "Creating Storage Class Persistent Memory with NVDIMM", Published in Aug. 2013, Flash Memory Summit 2013, URL: http://ww.flashmemorysummit.com/English/Collaterals/Proceedings/2013/20130814_T2_Sweere.pdf, 22 pages.
Techopedia, "What is a disk array", techopedia.com (online), Jan. 13, 2012, 1 page, URL: web.archive.org/web/20120113053358/http://www.techopedia.com/definition/1009/disk-array.
Webopedia, "What is a disk array", webopedia.com (online), May 26, 2011, 2 pages, URL: web/archive.org/web/20110526081214/http://www.webopedia.com/TERM/D/disk_array.html.
Wikipedia, "Convergent Encryption", Wikipedia.org (online), accessed Sep. 8, 2015, 2 pages, URL: en.wikipedia.org/wiki/Convergent_encryption.

\* cited by examiner

Initiating Storage System 400

Allocate Storage Resources On An Initiating Storage System For A Data Transfer, Where A Command Protocol To Implement The Data Transfer Specifies An Exchange Of Multiple Messages 410

Message 462
Data 470

Storage Resources 460

Receive, From A Target Storage System And Into The Allocated Storage Resources At The Initiating Storage System, Data Within A Single Message Corresponding To The Command Protocol That Specifies An Exchange Of Multiple Messages To Implement The Data Transfer 412

In Response To Receiving The Data Within The Single Message Correspoding To The Command Protocol That Specifies An Exchange Of Multiple Messages To Implement The Data Transfer, Generate A Status Message Indicating Receipt Of The Data 414

Status 464

Target Storage System 402

Data 470

FIG. 4B

SELECTIVE COMMUNICATION PROTOCOL LAYERING FOR SYNCHRONOUS REPLICATION

CROSS-REFERENCE TO RELATED APPLICATIONS

This application is a continuation-in-part of and claims priority from U.S. patent application Ser. No. 16/400,665, filed May 1, 2019, which is a continuation of and claims priority from U.S. Pat. No. 10,310,760, issued Jun. 4, 2019, which is a continuation-in-part of and claims priority from U.S. patent application Ser. No. 16/050,698, filed Jul. 31, 2018, which claims the benefit of earlier-filed U.S. Provisional Patent Application Ser. No. 62/695,433, filed Jul. 9, 2018 and U.S. Provisional Patent Application Ser. No. 62/674,570, filed May 21, 2018; and is a non-provisional application for patent entitled to a filing date and claiming the benefit of earlier-filed U.S. Provisional Patent Application Ser. No. 62/674,691, filed May 22, 2018.

BRIEF DESCRIPTION OF DRAWINGS

FIG. 4B sets forth a flow chart illustrating an example method of layering communication protocols in accordance with some embodiments of the present disclosure.

DESCRIPTION OF EMBODIMENTS

Figure 1A:
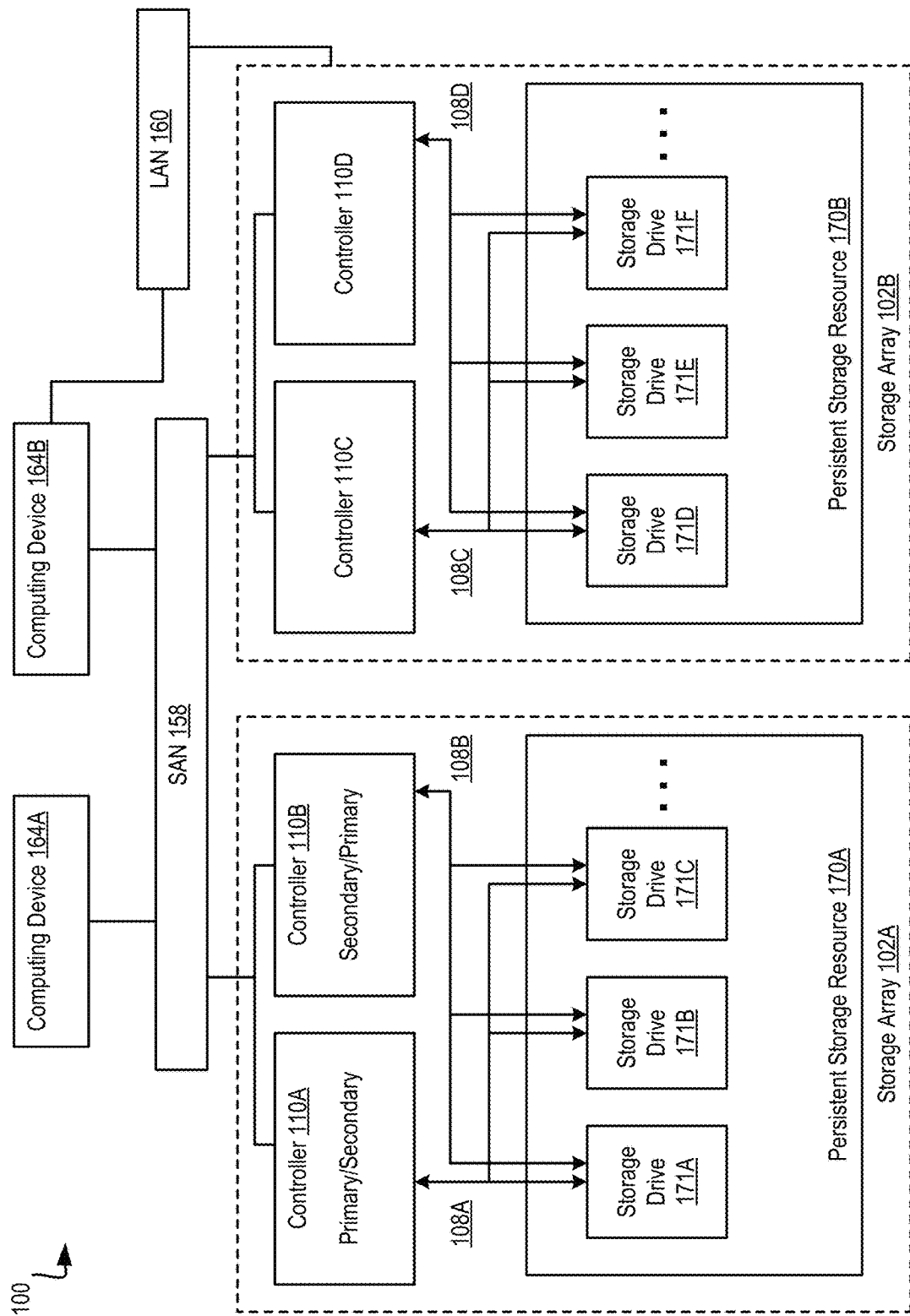
FIG. 1A illustrates a first example system for data storage in accordance with some implementations.

Example methods, apparatus, and products for selective communication protocol layering for synchronous replication in accordance with embodiments of the present disclosure are described with reference to the accompanying drawings, beginning with FIG. 1A. FIG. 1A illustrates an example system for data storage, in accordance with some implementations. System 100 (also referred to as "storage system" herein) includes numerous elements for purposes of illustration rather than limitation. It may be noted that system 100 may include the same, more, or fewer elements configured in the same or different manner in other implementations.

System 100 includes a number of computing devices 164A-B. Computing devices (also referred to as "client devices" herein) may be embodied, for example, a server in a data center, a workstation, a personal computer, a notebook, or the like. Computing devices 164A-B may be coupled for data communications to one or more storage arrays 102A-B through a storage area network ('SAN') 158 or a local area network ('LAN') 160.

The SAN 158 may be implemented with a variety of data communications fabrics, devices, and protocols. For example, the fabrics for SAN 158 may include Fibre Channel, Ethernet, Infiniband, Serial Attached Small Computer System Interface ('SAS'), or the like. Data communications protocols for use with SAN 158 may include Advanced Technology Attachment ('ATA'), Fibre Channel Protocol, Small Computer System Interface ('SCSI'), Internet Small Computer System Interface ('iSCSI'), HyperSCSI, Non-Volatile Memory Express ('NVMe') over Fabrics, or the like. It may be noted that SAN 158 is provided for illustration, rather than limitation. Other data communication couplings may be implemented between computing devices 164A-B and storage arrays 102A-B.

The LAN 160 may also be implemented with a variety of fabrics, devices, and protocols. For example, the fabrics for LAN 160 may include Ethernet (802.3), wireless (802.11), or the like. Data communication protocols for use in LAN 160 may include Transmission Control Protocol ('TCP'), User Datagram Protocol ('UDP'), Internet Protocol ('IP'), HyperText Transfer Protocol ('HTTP'), Wireless Access Protocol ('WAP'), Handheld Device Transport Protocol ('HDTP'), Session Initiation Protocol ('SIP'), Real Time Protocol ('RTP'), or the like.

Storage arrays 102A-B may provide persistent data storage for the computing devices 164A-B. Storage array 102A may be contained in a chassis (not shown), and storage array 102B may be contained in another chassis (not shown), in implementations. Storage array 102A and 102B may include one or more storage array controllers 110A-D (also referred to as "controller" herein). A storage array controller 110A-D may be embodied as a module of automated computing machinery comprising computer hardware, computer software, or a combination of computer hardware and software. In some implementations, the storage array controllers 110A-D may be configured to carry out various storage tasks. Storage tasks may include writing data received from the computing devices 164A-B to storage array 102A-B, erasing data from storage array 102A-B, retrieving data from storage array 102A-B and providing data to computing devices 164A-B, monitoring and reporting of disk utilization and performance, performing redundancy operations, such as Redundant Array of Independent Drives ('RAID') or RAID-like data redundancy operations, compressing data, encrypting data, and so forth.

Storage array controller 110A-D may be implemented in a variety of ways, including as a Field Programmable Gate Array ('FPGA'), a Programmable Logic Chip ('PLC'), an Application Specific Integrated Circuit ('ASIC'), System-on-Chip ('SOC'), or any computing device that includes discrete components such as a processing device, central processing unit, computer memory, or various adapters. Storage array controller 110A-D may include, for example, a data communications adapter configured to support communications via the SAN 158 or LAN 160. In some implementations, storage array controller 110A-D may be independently coupled to the LAN 160. In implementations, storage array controller 110A-D may include an I/O controller or the like that couples the storage array controller 110A-D for data communications, through a midplane (not shown), to a persistent storage resource 170A-B (also referred to as a "storage resource" herein). The persistent storage resource 170A-B main include any number of storage drives 171A-F (also referred to as "storage devices" herein) and any number of non-volatile Random Access Memory ('NVRAM') devices (not shown).

In some implementations, the NVRAM devices of a persistent storage resource 170A-B may be configured to receive, from the storage array controller 110A-D, data to be stored in the storage drives 171A-F. In some examples, the data may originate from computing devices 164A-B. In some examples, writing data to the NVRAM device may be carried out more quickly than directly writing data to the storage drive 171A-F. In implementations, the storage array controller 110A-D may be configured to utilize the NVRAM devices as a quickly accessible buffer for data destined to be written to the storage drives 171A-F. Latency for write requests using NVRAM devices as a buffer may be improved relative to a system in which a storage array controller 110A-D writes data directly to the storage drives 171A-F. In some implementations, the NVRAM devices may be implemented with computer memory in the form of high bandwidth, low latency RAM. The NVRAM device is referred to as "non-volatile" because the NVRAM device may receive or include a unique power source that maintains the state of the RAM after main power loss to the NVRAM device. Such a power source may be a battery, one or more capacitors, or the like. In response to a power loss, the NVRAM device may be configured to write the contents of the RAM to a persistent storage, such as the storage drives 171A-F.

In implementations, storage drive 171A-F may refer to any device configured to record data persistently, where "persistently" or "persistent" refers as to a device's ability to maintain recorded data after loss of power. In some implementations, storage drive 171A-F may correspond to non-disk storage media. For example, the storage drive 171A-F may be one or more solid-state drives ('SSDs'), flash memory based storage, any type of solid-state non-volatile memory, or any other type of non-mechanical storage device. In other implementations, storage drive 171A-F may include mechanical or spinning hard disk, such as hard-disk drives ('HDD').

In some implementations, the storage array controllers 110A-D may be configured for offloading device management responsibilities from storage drive 171A-F in storage array 102A-B. For example, storage array controllers 110A-D may manage control information that may describe the state of one or more memory blocks in the storage drives 171A-F. The control information may indicate, for example, that a particular memory block has failed and should no longer be written to, that a particular memory block contains boot code for a storage array controller 110A-D, the number of program-erase ('P/E') cycles that have been performed on a particular memory block, the age of data stored in a particular memory block, the type of data that is stored in a particular memory block, and so forth. In some implementations, the control information may be stored with an associated memory block as metadata. In other implementations, the control information for the storage drives 171A-F may be stored in one or more particular memory blocks of the storage drives 171A-F that are selected by the storage array controller 110A-D. The selected memory blocks may be tagged with an identifier indicating that the selected memory block contains control information. The identifier may be utilized by the storage array controllers 110A-D in conjunction with storage drives 171A-F to quickly identify the memory blocks that contain control information. For example, the storage controllers 110A-D may issue a command to locate memory blocks that contain control information. It may be noted that control information may be so large that parts of the control information may be stored in multiple locations, that the control information may be stored in multiple locations for purposes of redundancy, for example, or that the control information may otherwise be distributed across multiple memory blocks in the storage drive 171A-F.

In implementations, storage array controllers 110A-D may offload device management responsibilities from storage drives 171A-F of storage array 102A-B by retrieving, from the storage drives 171A-F, control information describing the state of one or more memory blocks in the storage drives 171A-F. Retrieving the control information from the storage drives 171A-F may be carried out, for example, by the storage array controller 110A-D querying the storage drives 171A-F for the location of control information for a particular storage drive 171A-F. The storage drives 171A-F may be configured to execute instructions that enable the storage drive 171A-F to identify the location of the control information. The instructions may be executed by a controller (not shown) associated with or otherwise located on the storage drive 171A-F and may cause the storage drive 171A-F to scan a portion of each memory block to identify the memory blocks that store control information for the storage drives 171A-F. The storage drives 171A-F may respond by sending a response message to the storage array controller 110A-D that includes the location of control information for the storage drive 171A-F. Responsive to receiving the response message, storage array controllers 110A-D may issue a request to read data stored at the address associated with the location of control information for the storage drives 171A-F.

In other implementations, the storage array controllers 110A-D may further offload device management responsibilities from storage drives 171A-F by performing, in response to receiving the control information, a storage drive management operation. A storage drive management operation may include, for example, an operation that is typically performed by the storage drive 171A-F (e.g., the controller (not shown) associated with a particular storage drive 171A-F). A storage drive management operation may include, for example, ensuring that data is not written to failed memory blocks within the storage drive 171A-F, ensuring that data is written to memory blocks within the storage drive 171A-F in such a way that adequate wear leveling is achieved, and so forth.

In implementations, storage array 102A-B may implement two or more storage array controllers 110A-D. For example, storage array 102A may include storage array controllers 110A and storage array controllers 110B. At a given instance, a single storage array controller 110A-D (e.g., storage array controller 110A) of a storage system 100 may be designated with primary status (also referred to as "primary controller" herein), and other storage array controllers 110A-D (e.g., storage array controller 110A) may be designated with secondary status (also referred to as "secondary controller" herein). The primary controller may have particular rights, such as permission to alter data in persistent storage resource 170A-B (e.g., writing data to persistent storage resource 170A-B). At least some of the rights of the primary controller may supersede the rights of the secondary controller. For instance, the secondary controller may not have permission to alter data in persistent storage resource 170A-B when the primary controller has the right. The status of storage array controllers 110A-D may change. For example, storage array controller 110A may be designated with secondary status, and storage array controller 110B may be designated with primary status.

In some implementations, a primary controller, such as storage array controller 110A, may serve as the primary controller for one or more storage arrays 102A-B, and a second controller, such as storage array controller 110B, may serve as the secondary controller for the one or more storage arrays 102A-B. For example, storage array controller 110A may be the primary controller for storage array 102A and storage array 102B, and storage array controller 110B may be the secondary controller for storage array 102A and 102B. In some implementations, storage array controllers 110C and 110D (also referred to as "storage processing modules") may neither have primary or secondary status. Storage array controllers 110C and 110D, implemented as storage processing modules, may act as a communication interface between the primary and secondary controllers (e.g., storage array controllers 110A and 110B, respectively) and storage array 102B. For example, storage array controller 110A of storage array 102A may send a write request, via SAN 158, to storage array 102B. The write request may be received by both storage array controllers 110C and 110D of storage array 102B. Storage array controllers 110C and 110D facilitate the communication, e.g., send the write request to the appropriate storage drive 171A-F. It may be noted that in some implementations storage processing modules may be used to increase the number of storage drives controlled by the primary and secondary controllers.

In implementations, storage array controllers 110A-D are communicatively coupled, via a midplane (not shown), to one or more storage drives 171A-F and to one or more NVRAM devices (not shown) that are included as part of a storage array 102A-B. The storage array controllers 110A-D may be coupled to the midplane via one or more data communication links and the midplane may be coupled to the storage drives 171A-F and the NVRAM devices via one or more data communications links. The data communications links described herein are collectively illustrated by data communications links 108A-D and may include a Peripheral Component Interconnect Express ('PCIe') bus, for example.

Figure 1B:
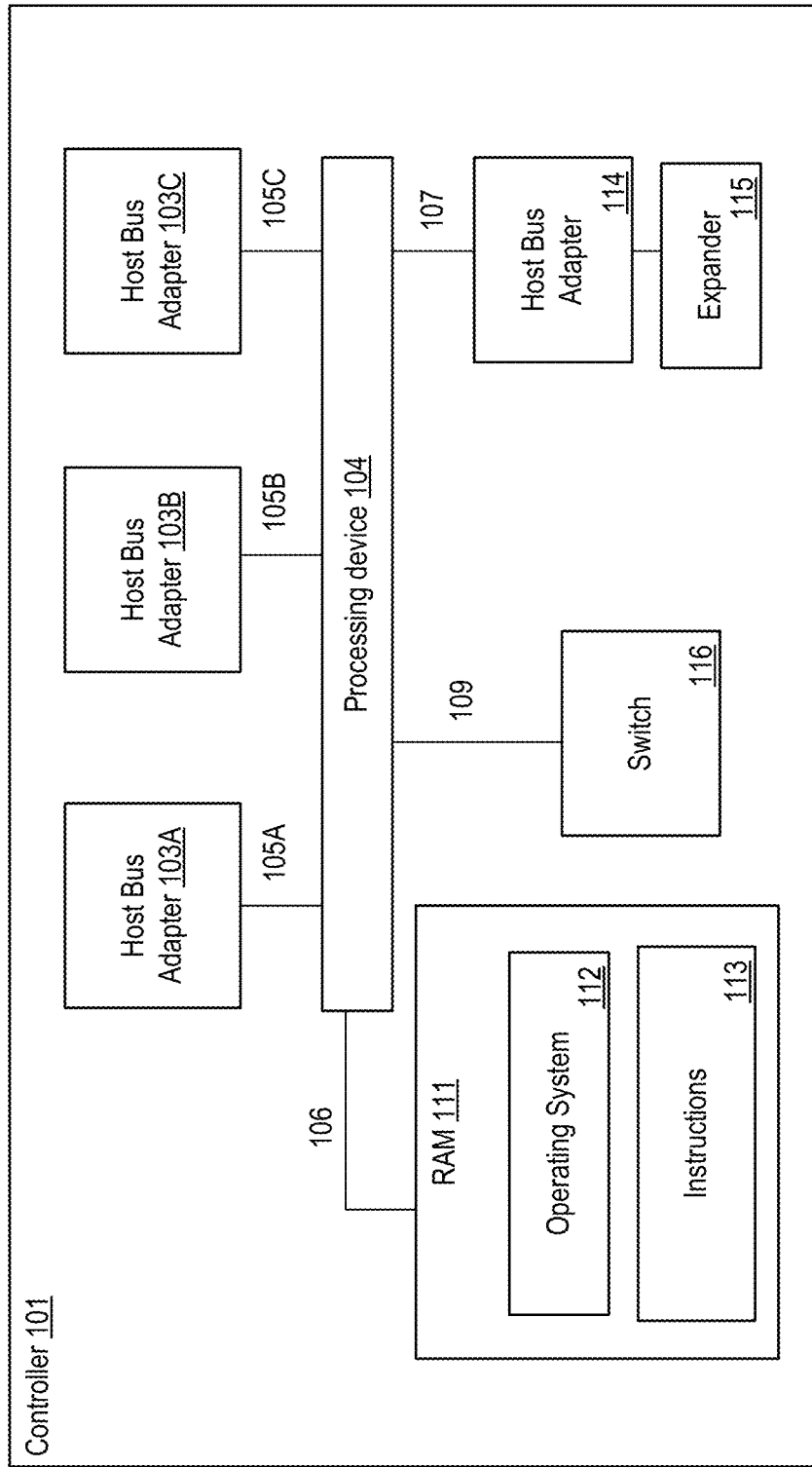
FIG. 1B illustrates a second example system for data storage in accordance with some implementations.

FIG. 1B illustrates an example system for data storage, in accordance with some implementations. Storage array controller 101 illustrated in FIG. 1B may similar to the storage array controllers 110A-D described with respect to FIG. 1A. In one example, storage array controller 101 may be similar to storage array controller 110A or storage array controller 110B. Storage array controller 101 includes numerous elements for purposes of illustration rather than limitation. It may be noted that storage array controller 101 may include the same, more, or fewer elements configured in the same or different manner in other implementations. It may be noted that elements of FIG. 1A may be included below to help illustrate features of storage array controller 101.

Storage array controller 101 may include one or more processing devices 104 and random access memory ('RAM') 111. Processing device 104 (or controller 101) represents one or more general-purpose processing devices such as a microprocessor, central processing unit, or the like. More particularly, the processing device 104 (or controller 101) may be a complex instruction set computing ('CISC') microprocessor, reduced instruction set computing ('RISC') microprocessor, very long instruction word ('VLIW') microprocessor, or a processor implementing other instruction sets or processors implementing a combination of instruction sets. The processing device 104 (or controller 101) may also be one or more special-purpose processing devices such as an application specific integrated circuit ('ASIC'), a field programmable gate array ('FPGA'), a digital signal processor ('DSP'), network processor, or the like.

The processing device 104 may be connected to the RAM 111 via a data communications link 106, which may be embodied as a high speed memory bus such as a Double-Data Rate 4 ('DDR4') bus. Stored in RAM 111 is an operating system 112. In some implementations, instructions 113 are stored in RAM 111. Instructions 113 may include computer program instructions for performing operations in in a direct-mapped flash storage system. In one embodiment, a direct-mapped flash storage system is one that that addresses data blocks within flash drives directly and without an address translation performed by the storage controllers of the flash drives.

In implementations, storage array controller 101 includes one or more host bus adapters 103A-C that are coupled to the processing device 104 via a data communications link 105A-C. In implementations, host bus adapters 103A-C may be computer hardware that connects a host system (e.g., the storage array controller) to other network and storage arrays. In some examples, host bus adapters 103A-C may be a Fibre Channel adapter that enables the storage array controller 101 to connect to a SAN, an Ethernet adapter that enables the storage array controller 101 to connect to a LAN, or the like. Host bus adapters 103A-C may be coupled to the processing device 104 via a data communications link 105A-C such as, for example, a PCIe bus.

In implementations, storage array controller 101 may include a host bus adapter 114 that is coupled to an expander 115. The expander 115 may be used to attach a host system to a larger number of storage drives. The expander 115 may, for example, be a SAS expander utilized to enable the host bus adapter 114 to attach to storage drives in an implementation where the host bus adapter 114 is embodied as a SAS controller.

In implementations, storage array controller 101 may include a switch 116 coupled to the processing device 104 via a data communications link 109. The switch 116 may be a computer hardware device that can create multiple endpoints out of a single endpoint, thereby enabling multiple devices to share a single endpoint. The switch 116 may, for example, be a PCIe switch that is coupled to a PCIe bus (e.g., data communications link 109) and presents multiple PCIe connection points to the midplane.

In implementations, storage array controller 101 includes a data communications link 107 for coupling the storage array controller 101 to other storage array controllers. In some examples, data communications link 107 may be a QuickPath Interconnect (QPI) interconnect.

A traditional storage system that uses traditional flash drives may implement a process across the flash drives that are part of the traditional storage system. For example, a higher level process of the storage system may initiate and control a process across the flash drives. However, a flash drive of the traditional storage system may include its own storage controller that also performs the process. Thus, for the traditional storage system, a higher level process (e.g., initiated by the storage system) and a lower level process (e.g., initiated by a storage controller of the storage system) may both be performed.

To resolve various deficiencies of a traditional storage system, operations may be performed by higher level processes and not by the lower level processes. For example, the flash storage system may include flash drives that do not include storage controllers that provide the process. Thus, the operating system of the flash storage system itself may initiate and control the process. This may be accomplished by a direct-mapped flash storage system that addresses data blocks within the flash drives directly and without an address translation performed by the storage controllers of the flash drives.

The operating system of the flash storage system may identify and maintain a list of allocation units across multiple flash drives of the flash storage system. The allocation units may be entire erase blocks or multiple erase blocks. The operating system may maintain a map or address range that directly maps addresses to erase blocks of the flash drives of the flash storage system.

Direct mapping to the erase blocks of the flash drives may be used to rewrite data and erase data. For example, the operations may be performed on one or more allocation units that include a first data and a second data where the first data is to be retained and the second data is no longer being used by the flash storage system. The operating system may initiate the process to write the first data to new locations within other allocation units and erasing the second data and marking the allocation units as being available for use for subsequent data. Thus, the process may only be performed by the higher level operating system of the flash storage system without an additional lower level process being performed by controllers of the flash drives.

Advantages of the process being performed only by the operating system of the flash storage system include increased reliability of the flash drives of the flash storage system as unnecessary or redundant write operations are not being performed during the process. One possible point of novelty here is the concept of initiating and controlling the process at the operating system of the flash storage system. In addition, the process can be controlled by the operating system across multiple flash drives. This is contrast to the process being performed by a storage controller of a flash drive.

A storage system can consist of two storage array controllers that share a set of drives for failover purposes, or it could consist of a single storage array controller that provides a storage service that utilizes multiple drives, or it could consist of a distributed network of storage array controllers each with some number of drives or some amount of Flash storage where the storage array controllers in the network collaborate to provide a complete storage service and collaborate on various aspects of a storage service including storage allocation and garbage collection.

Figure 1C:
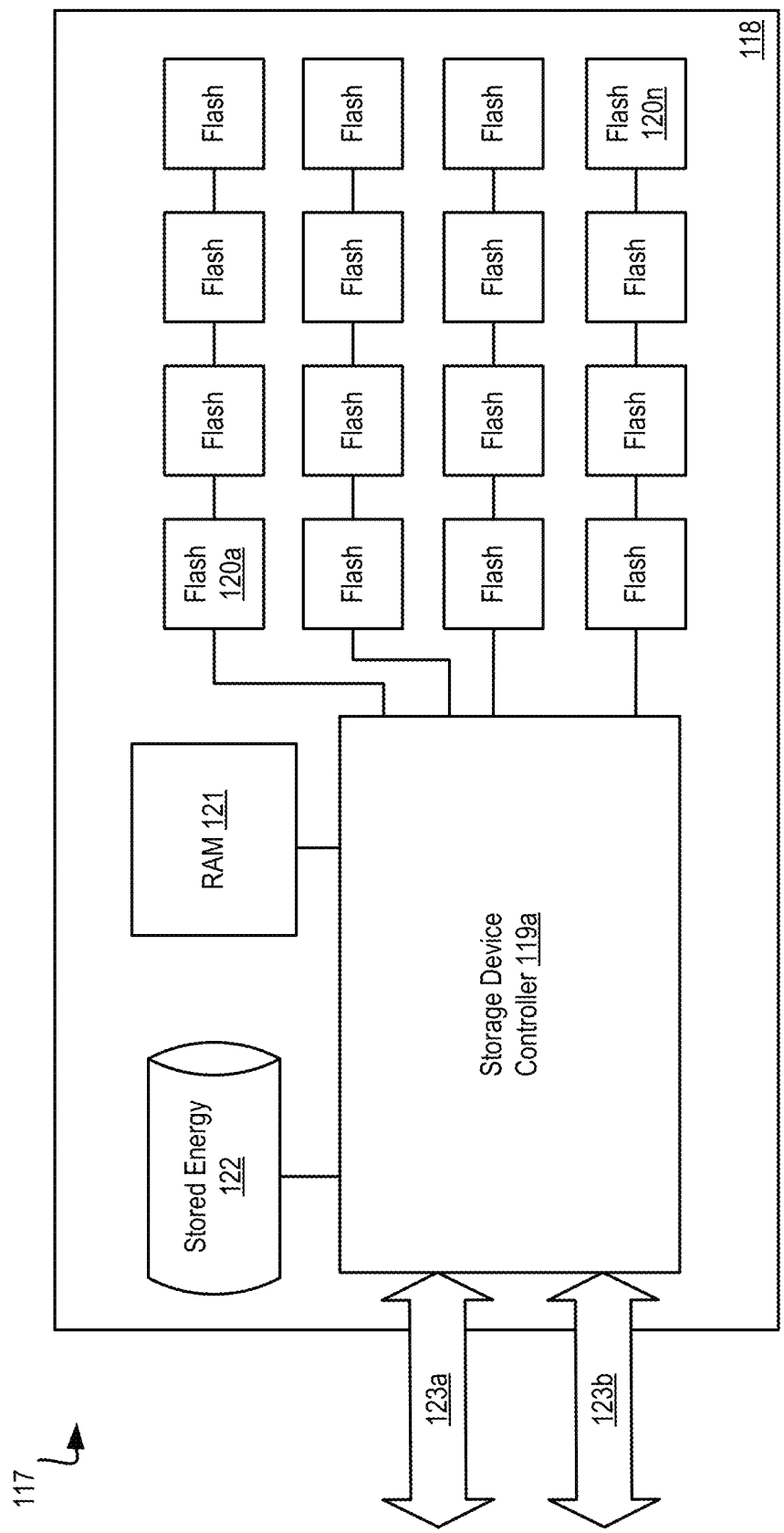
FIG. 1C illustrates a third example system for data storage in accordance with some implementations.

FIG. 1C illustrates a third example system 117 for data storage in accordance with some implementations. System 117 (also referred to as "storage system" herein) includes numerous elements for purposes of illustration rather than limitation. It may be noted that system 117 may include the same, more, or fewer elements configured in the same or different manner in other implementations.

In one embodiment, system 117 includes a dual Peripheral Component Interconnect ('PCI') flash storage device 118 with separately addressable fast write storage. System 117 may include a storage controller 119. In one embodiment, storage controller 119A-D may be a CPU, ASIC, FPGA, or any other circuitry that may implement control structures necessary according to the present disclosure. In one embodiment, system 117 includes flash memory devices (e.g., including flash memory devices 120a-n), operatively coupled to various channels of the storage device controller 119. Flash memory devices 120a-n, may be presented to the controller 119A-D as an addressable collection of Flash pages, erase blocks, and/or control elements sufficient to allow the storage device controller 119A-D to program and retrieve various aspects of the Flash. In one embodiment, storage device controller 119A-D may perform operations on flash memory devices 120a-n including storing and retrieving data content of pages, arranging and erasing any blocks, tracking statistics related to the use and reuse of Flash memory pages, erase blocks, and cells, tracking and predicting error codes and faults within the Flash memory, controlling voltage levels associated with programming and retrieving contents of Flash cells, etc.

In one embodiment, system 117 may include RAM 121 to store separately addressable fast-write data. In one embodiment, RAM 121 may be one or more separate discrete devices. In another embodiment, RAM 121 may be integrated into storage device controller 119A-D or multiple storage device controllers. The RAM 121 may be utilized for other purposes as well, such as temporary program memory for a processing device (e.g., a CPU) in the storage device controller 119.

In one embodiment, system 117 may include a stored energy device 122, such as a rechargeable battery or a capacitor. Stored energy device 122 may store energy sufficient to power the storage device controller 119, some amount of the RAM (e.g., RAM 121), and some amount of Flash memory (e.g., Flash memory 120a-120n) for sufficient time to write the contents of RAM to Flash memory. In one embodiment, storage device controller 119A-D may write the contents of RAM to Flash Memory if the storage device controller detects loss of external power.

In one embodiment, system 117 includes two data communications links 123a, 123b. In one embodiment, data communications links 123a, 123b may be PCI interfaces. In another embodiment, data communications links 123a, 123b may be based on other communications standards (e.g., HyperTransport, InfiniBand, etc.). Data communications links 123a, 123b may be based on non-volatile memory express ('NVMe') or NVMe over fabrics ('NVMf') specifications that allow external connection to the storage device controller 119A-D from other components in the storage system 117. It should be noted that data communications links may be interchangeably referred to herein as PCI buses for convenience.

System 117 may also include an external power source (not shown), which may be provided over one or both data communications links 123a, 123b, or which may be provided separately. An alternative embodiment includes a separate Flash memory (not shown) dedicated for use in storing the content of RAM 121. The storage device controller 119A-D may present a logical device over a PCI bus which may include an addressable fast-write logical device, or a distinct part of the logical address space of the storage device 118, which may be presented as PCI memory or as persistent storage. In one embodiment, operations to store into the device are directed into the RAM 121. On power failure, the storage device controller 119A-D may write stored content associated with the addressable fast-write logical storage to Flash memory (e.g., Flash memory 120a-n) for long-term persistent storage.

In one embodiment, the logical device may include some presentation of some or all of the content of the Flash memory devices 120a-n, where that presentation allows a storage system including a storage device 118 (e.g., storage system 117) to directly address Flash memory pages and directly reprogram erase blocks from storage system components that are external to the storage device through the PCI bus. The presentation may also allow one or more of the external components to control and retrieve other aspects of the Flash memory including some or all of: tracking statistics related to use and reuse of Flash memory pages, erase blocks, and cells across all the Flash memory devices; tracking and predicting error codes and faults within and across the Flash memory devices; controlling voltage levels associated with programming and retrieving contents of Flash cells; etc.

In one embodiment, the stored energy device 122 may be sufficient to ensure completion of in-progress operations to the Flash memory devices 120a-120n stored energy device 122 may power storage device controller 119A-D and associated Flash memory devices (e.g., 120a-n) for those operations, as well as for the storing of fast-write RAM to Flash memory. Stored energy device 122 may be used to store accumulated statistics and other parameters kept and tracked by the Flash memory devices 120a-n and/or the storage device controller 119. Separate capacitors or stored energy devices (such as smaller capacitors near or embedded within the Flash memory devices themselves) may be used for some or all of the operations described herein.

Various schemes may be used to track and optimize the life span of the stored energy component, such as adjusting voltage levels over time, partially discharging the storage energy device 122 to measure corresponding discharge characteristics, etc. If the available energy decreases over time, the effective available capacity of the addressable fast-write storage may be decreased to ensure that it can be written safely based on the currently available stored energy.

Figure 1D:
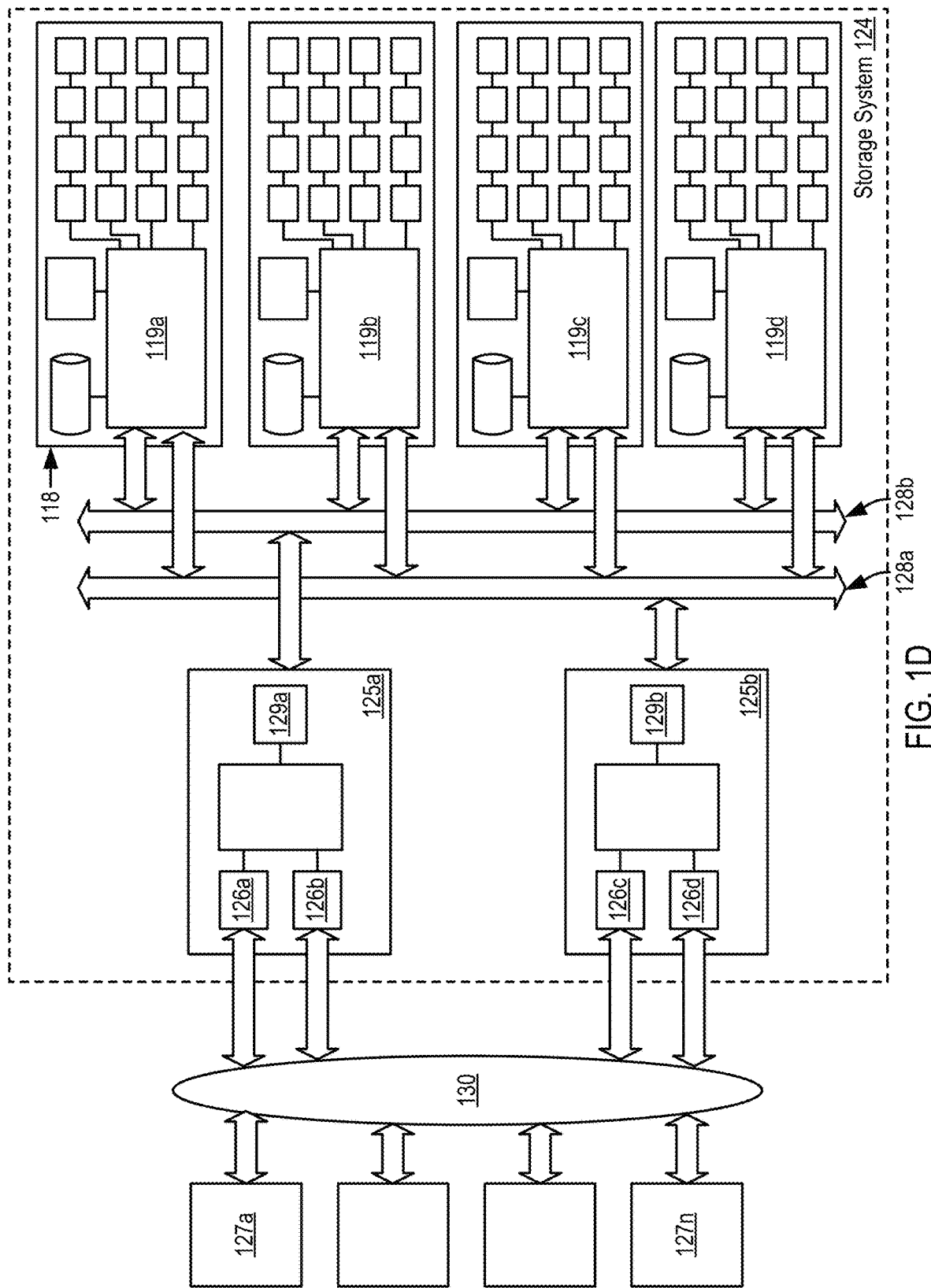
FIG. 1D illustrates a fourth example system for data storage in accordance with some implementations.

FIG. 1D illustrates a third example system 124 for data storage in accordance with some implementations. In one embodiment, system 124 includes storage controllers 125a, 125b. In one embodiment, storage controllers 125a, 125b are operatively coupled to Dual PCI storage devices 119a, 119b and 119c, 119d, respectively. Storage controllers 125a, 125b may be operatively coupled (e.g., via a storage network 130) to some number of host computers 127a-n.

In one embodiment, two storage controllers (e.g., 125a and 125b) provide storage services, such as a SCS) block storage array, a file server, an object server, a database or data analytics service, etc. The storage controllers 125a, 125b may provide services through some number of network interfaces (e.g., 126a-d) to host computers 127a-n outside of the storage system 124. Storage controllers 125a, 125b may provide integrated services or an application entirely within the storage system 124, forming a converged storage and compute system. The storage controllers 125a, 125b may utilize the fast write memory within or across storage devices 119a-d to journal in progress operations to ensure the operations are not lost on a power failure, storage controller removal, storage controller or storage system shutdown, or some fault of one or more software or hardware components within the storage system 124.

In one embodiment, controllers 125a, 125b operate as PCI masters to one or the other PCI buses 128a, 128b. In another embodiment, 128a and 128b may be based on other communications standards (e.g., HyperTransport, InfiniBand, etc.). Other storage system embodiments may operate storage controllers 125a, 125b as multi-masters for both PCI buses 128a, 128b. Alternately, a PCI/NVMe/NVMf switching infrastructure or fabric may connect multiple storage controllers. Some storage system embodiments may allow storage devices to communicate with each other directly rather than communicating only with storage controllers. In one embodiment, a storage device controller 119a may be operable under direction from a storage controller 125a to synthesize and transfer data to be stored into Flash memory devices from data that has been stored in RAM (e.g., RAM 121 of FIG. 1C). For example, a recalculated version of RAM content may be transferred after a storage controller has determined that an operation has fully committed across the storage system, or when fast-write memory on the device has reached a certain used capacity, or after a certain amount of time, to ensure improve safety of the data or to release addressable fast-write capacity for reuse. This mechanism may be used, for example, to avoid a second transfer over a bus (e.g., 128a, 128b) from the storage controllers 125a, 125b. In one embodiment, a recalculation may include compressing data, attaching indexing or other metadata, combining multiple data segments together, performing erasure code calculations, etc.

In one embodiment, under direction from a storage controller 125a, 125b, a storage device controller 119a, 119b may be operable to calculate and transfer data to other storage devices from data stored in RAM (e.g., RAM 121 of FIG. 1C) without involvement of the storage controllers 125a, 125b. This operation may be used to mirror data stored in one controller 125a to another controller 125b, or it could be used to offload compression, data aggregation, and/or erasure coding calculations and transfers to storage devices to reduce load on storage controllers or the storage controller interface 129a, 129b to the PCI bus 128a, 128b.

A storage device controller 119A-D may include mechanisms for implementing high availability primitives for use by other parts of a storage system external to the Dual PCI storage device 118. For example, reservation or exclusion primitives may be provided so that, in a storage system with two storage controllers providing a highly available storage service, one storage controller may prevent the other storage controller from accessing or continuing to access the storage device. This could be used, for example, in cases where one controller detects that the other controller is not functioning properly or where the interconnect between the two storage controllers may itself not be functioning properly.

In one embodiment, a storage system for use with Dual PCI direct mapped storage devices with separately addressable fast write storage includes systems that manage erase blocks or groups of erase blocks as allocation units for storing data on behalf of the storage service, or for storing metadata (e.g., indexes, logs, etc.) associated with the storage service, or for proper management of the storage system itself. Flash pages, which may be a few kilobytes in size, may be written as data arrives or as the storage system is to persist data for long intervals of time (e.g., above a defined threshold of time). To commit data more quickly, or to reduce the number of writes to the Flash memory devices, the storage controllers may first write data into the separately addressable fast write storage on one more storage devices.

In one embodiment, the storage controllers 125a, 125b may initiate the use of erase blocks within and across storage devices (e.g., 118) in accordance with an age and expected remaining lifespan of the storage devices, or based on other statistics. The storage controllers 125a, 125b may initiate garbage collection and data migration data between storage devices in accordance with pages that are no longer needed as well as to manage Flash page and erase block lifespans and to manage overall system performance.

In one embodiment, the storage system 124 may utilize mirroring and/or erasure coding schemes as part of storing data into addressable fast write storage and/or as part of writing data into allocation units associated with erase blocks. Erasure codes may be used across storage devices, as well as within erase blocks or allocation units, or within and across Flash memory devices on a single storage device, to provide redundancy against single or multiple storage device failures or to protect against internal corruptions of Flash memory pages resulting from Flash memory operations or from degradation of Flash memory cells. Mirroring and erasure coding at various levels may be used to recover from multiple types of failures that occur separately or in combination.

The embodiments depicted with reference to FIGS. 2A-G illustrate a storage cluster that stores user data, such as user data originating from one or more user or client systems or other sources external to the storage cluster. The storage cluster distributes user data across storage nodes housed within a chassis, or across multiple chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster may be contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as PCIe, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system ('NFS'), common internet file system ('CIFS'), small computer system interface ('SCSI') or hypertext transfer protocol ('HTTP'). Translation from the client protocol may occur at the switch, chassis external communication bus or within each storage node. In some embodiments, multiple chassis may be coupled or connected to each other through an aggregator switch. A portion and/or all of the coupled or connected chassis may be designated as a storage cluster. As discussed above, each chassis can have multiple blades, each blade has a media access control ('MAC') address, but the storage cluster is presented to an external network as having a single cluster IP address and a single MAC address in some embodiments.

Each storage node may be one or more storage servers and each storage server is connected to one or more non-volatile solid state memory units, which may be referred to as storage units or storage devices. One embodiment includes a single storage server in each storage node and between one to eight non-volatile solid state memory units, however this one example is not meant to be limiting. The storage server may include a processor, DRAM and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded CPU, solid state storage controller, and a quantity of solid state mass storage, e.g., between 2-32 terabytes ('TB') in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory ('MRAM') that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

Figure 2A:
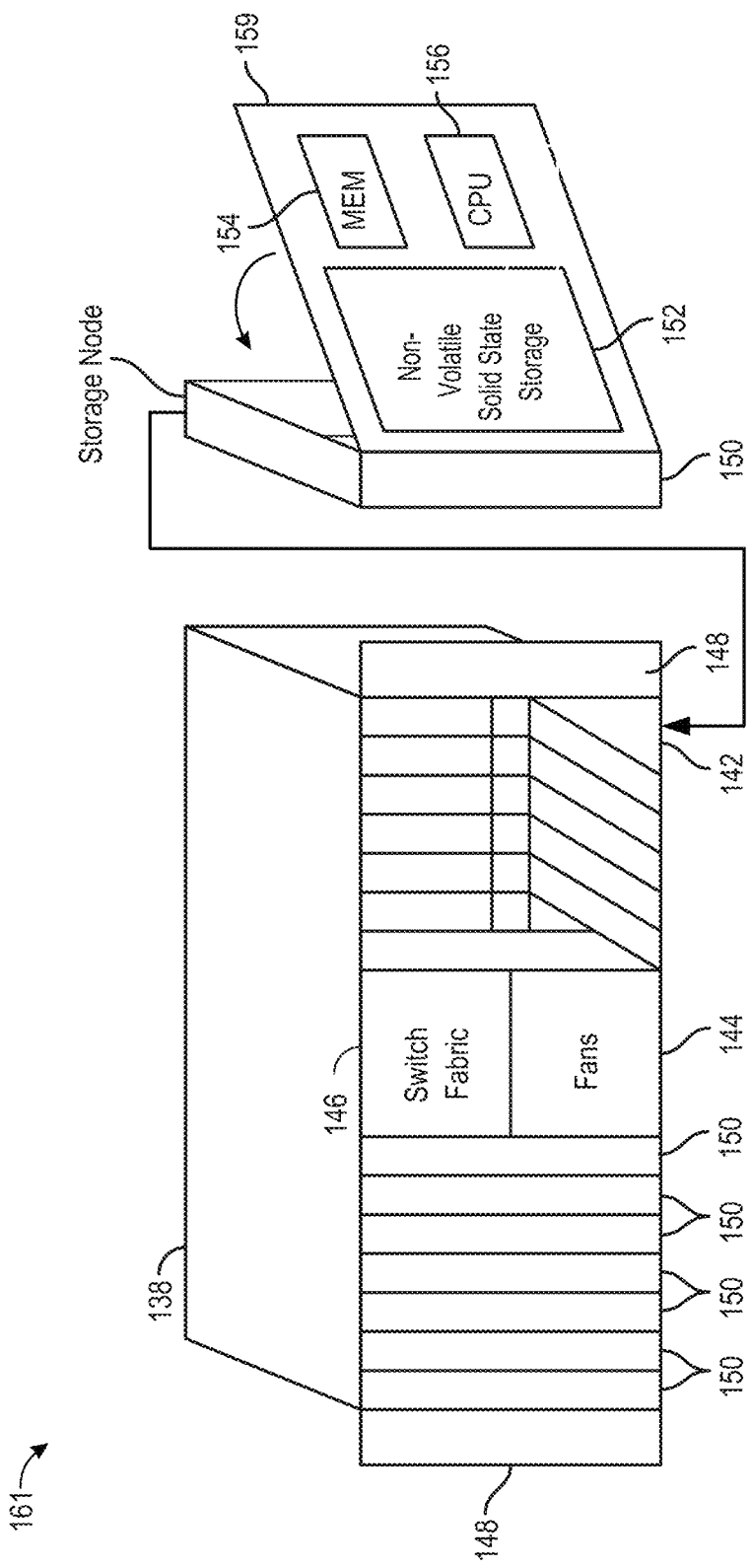
FIG. 2A is a perspective view of a storage cluster with multiple storage nodes and internal storage coupled to each storage node to provide network attached storage, in accordance with some embodiments.

FIG. 2A is a perspective view of a storage cluster 161, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 161, each having one or more storage nodes 150, in a flexible and reconfigurable arrangement of both the physical components and the amount of storage memory provided thereby. The storage cluster 161 is designed to fit in a rack, and one or more racks can be set up and populated as desired for the storage memory. The storage cluster 161 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in herein, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 159 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 2A, storage cluster 161 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2B:
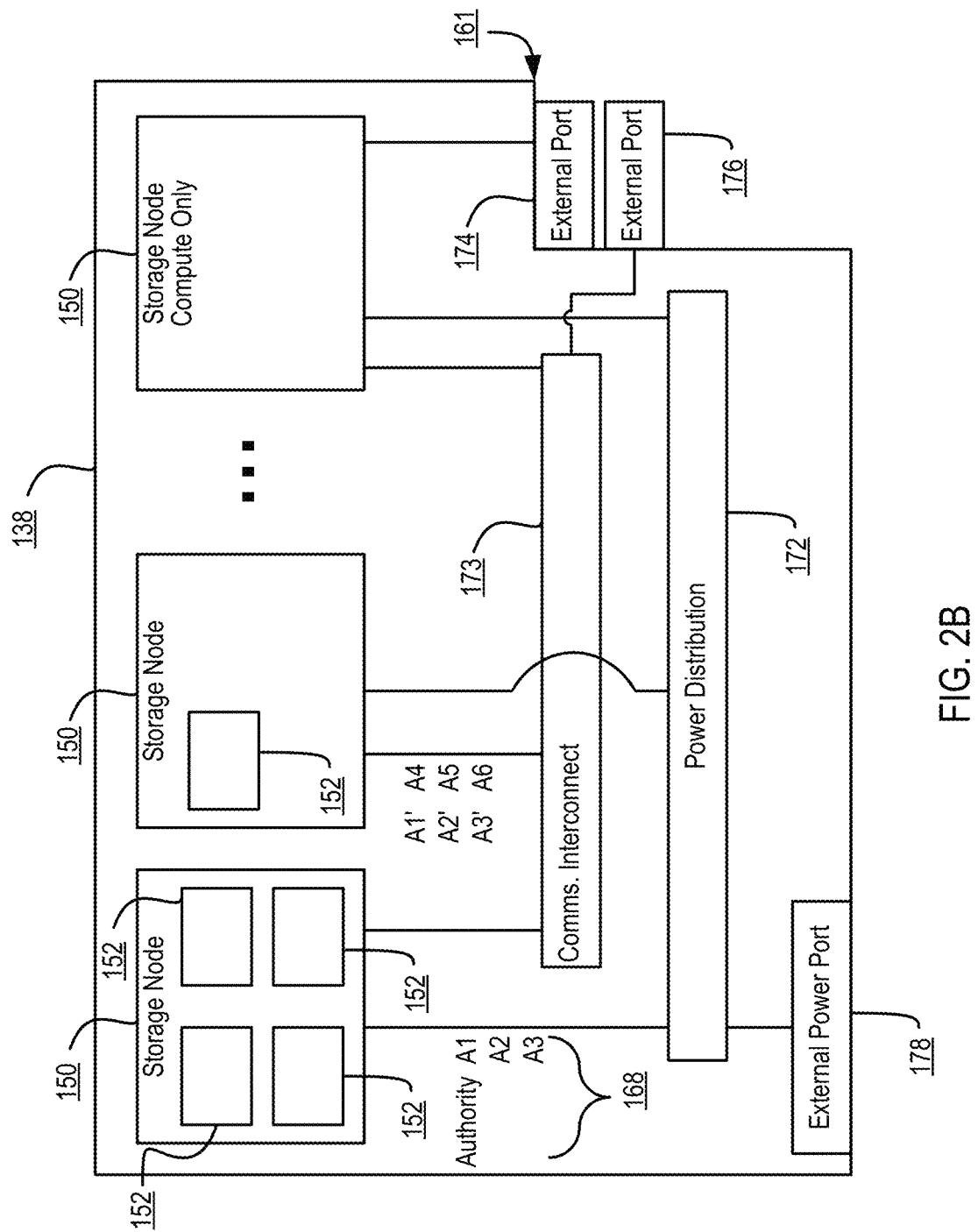
FIG. 2B is a block diagram showing an interconnect switch coupling multiple storage nodes in accordance with some embodiments.

FIG. 2B is a block diagram showing a communications interconnect 173 and power distribution bus 172 coupling multiple storage nodes 150. Referring back to FIG. 2A, the communications interconnect 173 can be included in or implemented with the switch fabric 146 in some embodiments. Where multiple storage clusters 161 occupy a rack, the communications interconnect 173 can be included in or implemented with a top of rack switch, in some embodiments. As illustrated in FIG. 2B, storage cluster 161 is enclosed within a single chassis 138. External port 176 is coupled to storage nodes 150 through communications interconnect 173, while external port 174 is coupled directly to a storage node. External power port 178 is coupled to power distribution bus 172. Storage nodes 150 may include varying amounts and differing capacities of non-volatile solid state storage 152 as described with reference to FIG. 2A. In addition, one or more storage nodes 150 may be a compute only storage node as illustrated in FIG. 2B. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 2A and 2B, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIGS. 2E and 2G) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (file names) which link to an inode. Inodes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage unit 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check ('LDPC') code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudo randomly assigning entities to authorities, by splitting entities into ranges based upon an externally produced key, or by placing a single entity into each authority. Examples of pseudorandom schemes are linear hashing and the Replication Under Scalable Hashing ('RUSH') family of hashes, including Controlled Replication Under Scalable Hashing ('CRUSH'). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being transmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing, i.e., the system supports non-disruptive upgrades.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 2C:
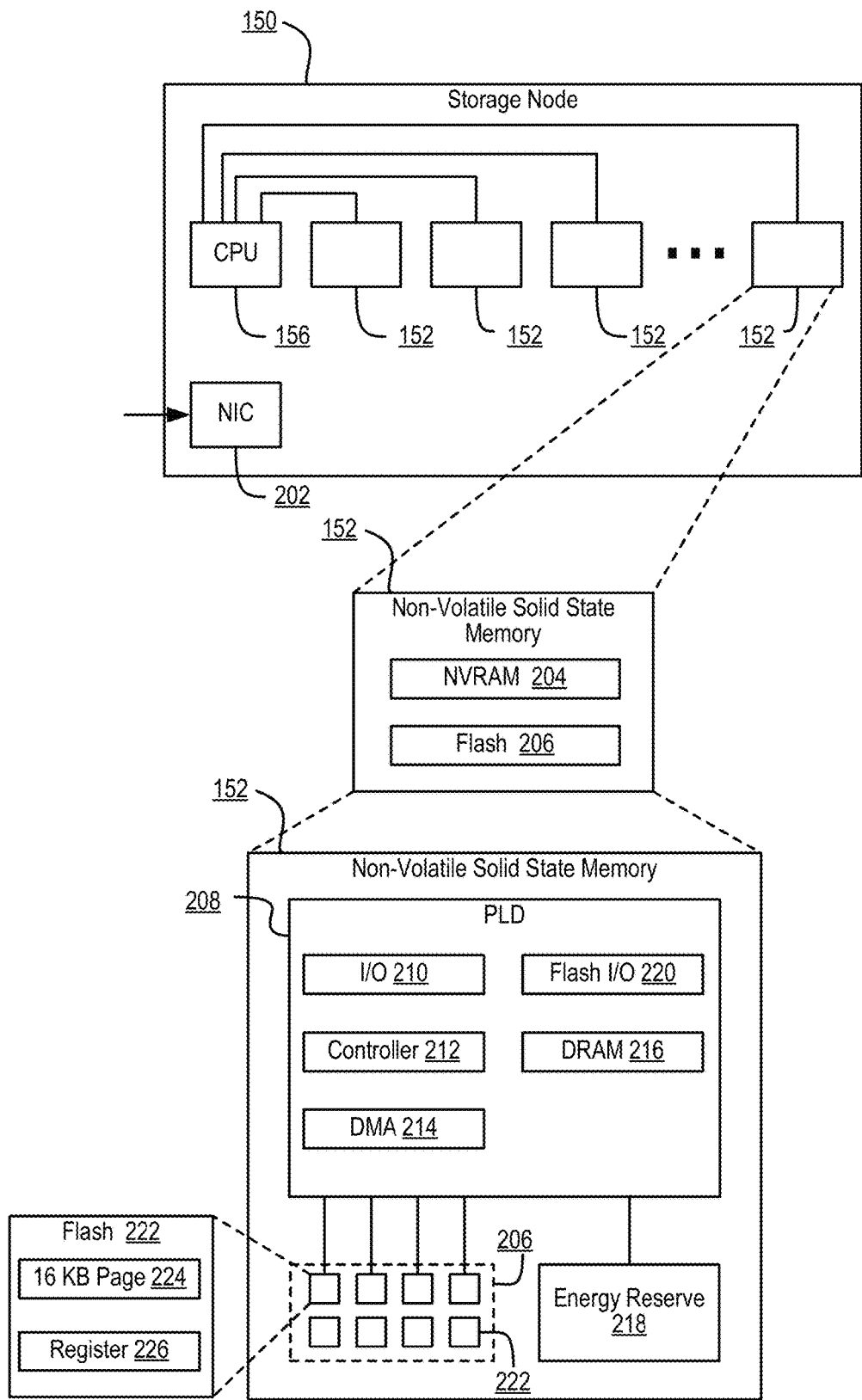
FIG. 2C is a multiple level block diagram, showing contents of a storage node and contents of one of the non-volatile solid state storage units in accordance with some embodiments.

FIG. 2C is a multiple level block diagram, showing contents of a storage node 150 and contents of a non-volatile solid state storage 152 of the storage node 150. Data is communicated to and from the storage node 150 by a network interface controller ('NIC') 202 in some embodiments. Each storage node 150 has a CPU 156, and one or more non-volatile solid state storage 152, as discussed above. Moving down one level in FIG. 2C, each non-volatile solid state storage 152 has a relatively fast non-volatile solid state memory, such as nonvolatile random access memory ('NVRAM') 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 2C, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device ('PLD') 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 161, in various embodiments as disclosed herein, can be contrasted with storage arrays in general. The storage nodes 150 are part of a collection that creates the storage cluster 161. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 161, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 2D:
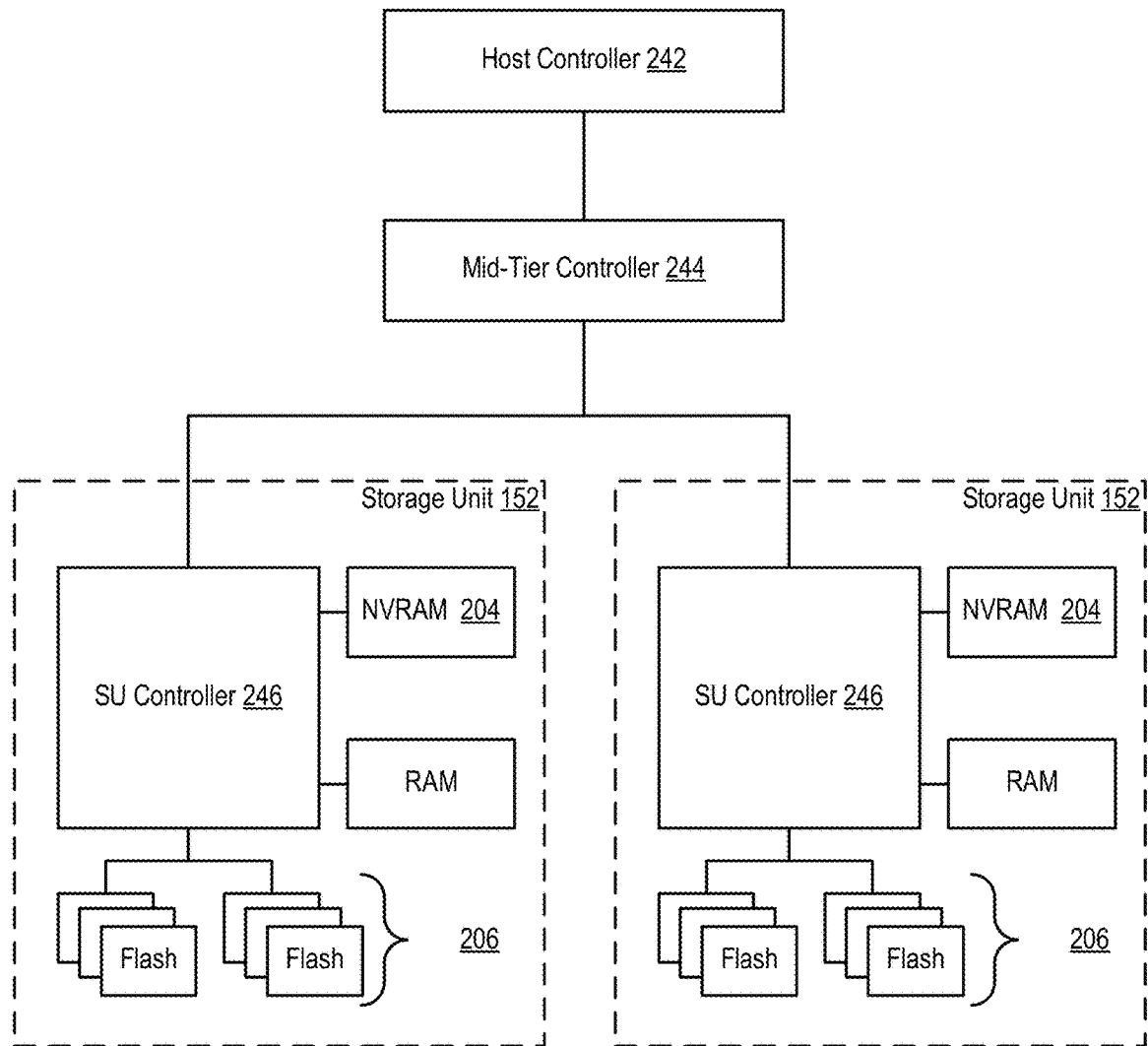
FIG. 2D shows a storage server environment, which uses embodiments of the storage nodes and storage units of some previous figures in accordance with some embodiments.

FIG. 2D shows a storage server environment, which uses embodiments of the storage nodes 150 and storage units 152 of FIGS. 2A-C. In this version, each storage unit 152 has a processor such as controller 212 (see FIG. 2C), an FPGA (field programmable gate array), flash memory 206, and NVRAM 204 (which is super-capacitor backed DRAM 216, see FIGS. 2B and 2C) on a PCIe (peripheral component interconnect express) board in a chassis 138 (see FIG. 2A). The storage unit 152 may be implemented as a single board containing storage, and may be the largest tolerable failure domain inside the chassis. In some embodiments, up to two storage units 152 may fail and the device will continue with no data loss.

The physical storage is divided into named regions based on application usage in some embodiments. The NVRAM 204 is a contiguous block of reserved memory in the storage unit 152 DRAM 216, and is backed by NAND flash. NVRAM 204 is logically divided into multiple memory regions written for two as spool (e.g., spool_region). Space within the NVRAM 204 spools is managed by each authority 168 independently. Each device provides an amount of storage space to each authority 168. That authority 168 further manages lifetimes and allocations within that space. Examples of a spool include distributed transactions or notions. When the primary power to a storage unit 152 fails, onboard super-capacitors provide a short duration of power hold up. During this holdup interval, the contents of the NVRAM 204 are flushed to flash memory 206. On the next power-on, the contents of the NVRAM 204 are recovered from the flash memory 206.

As for the storage unit controller, the responsibility of the logical "controller" is distributed across each of the blades containing authorities 168. This distribution of logical control is shown in FIG. 2D as a host controller 242, mid-tier controller 244 and storage unit controller(s) 246. Management of the control plane and the storage plane are treated independently, although parts may be physically co-located on the same blade. Each authority 168 effectively serves as an independent controller. Each authority 168 provides its own data and metadata structures, its own background workers, and maintains its own lifecycle.

Figure 2E:
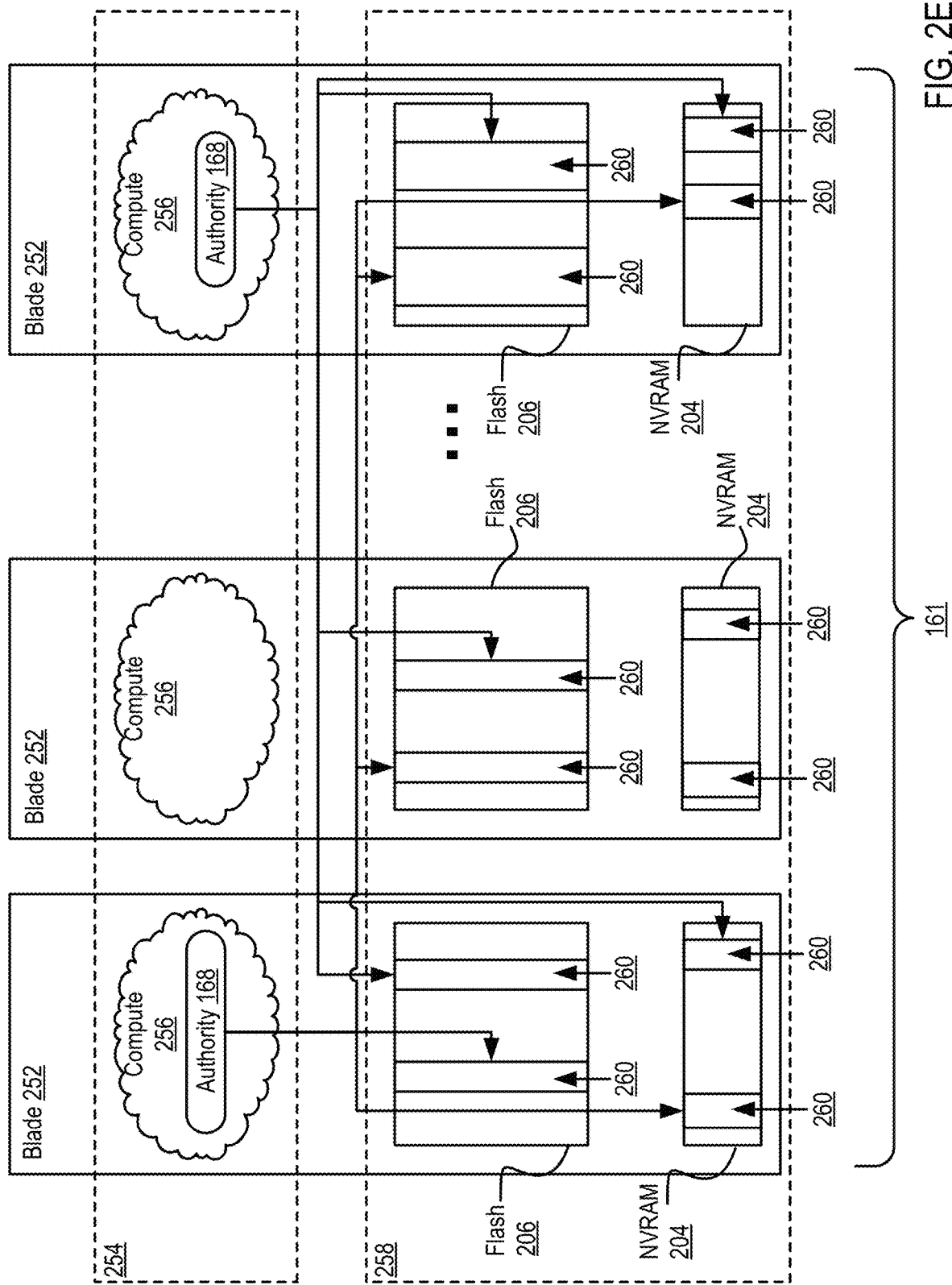
FIG. 2E is a blade hardware block diagram, showing a control plane, compute and storage planes, and authorities interacting with underlying physical resources, in accordance with some embodiments.

FIG. 2E is a blade 252 hardware block diagram, showing a control plane 254, compute and storage planes 256, 258, and authorities 168 interacting with underlying physical resources, using embodiments of the storage nodes 150 and storage units 152 of FIGS. 2A-C in the storage server environment of FIG. 2D. The control plane 254 is partitioned into a number of authorities 168 which can use the compute resources in the compute plane 256 to run on any of the blades 252. The storage plane 258 is partitioned into a set of devices, each of which provides access to flash 206 and NVRAM 204 resources.

In the compute and storage planes 256, 258 of FIG. 2E, the authorities 168 interact with the underlying physical resources (i.e., devices). From the point of view of an authority 168, its resources are striped over all of the physical devices. From the point of view of a device, it provides resources to all authorities 168, irrespective of where the authorities happen to run. Each authority 168 has allocated or has been allocated one or more partitions 260 of storage memory in the storage units 152, e.g. partitions 260 in flash memory 206 and NVRAM 204. Each authority 168 uses those allocated partitions 260 that belong to it, for writing or reading user data. Authorities can be associated with differing amounts of physical storage of the system. For example, one authority 168 could have a larger number of partitions 260 or larger sized partitions 260 in one or more storage units 152 than one or more other authorities 168.

Figure 2F:
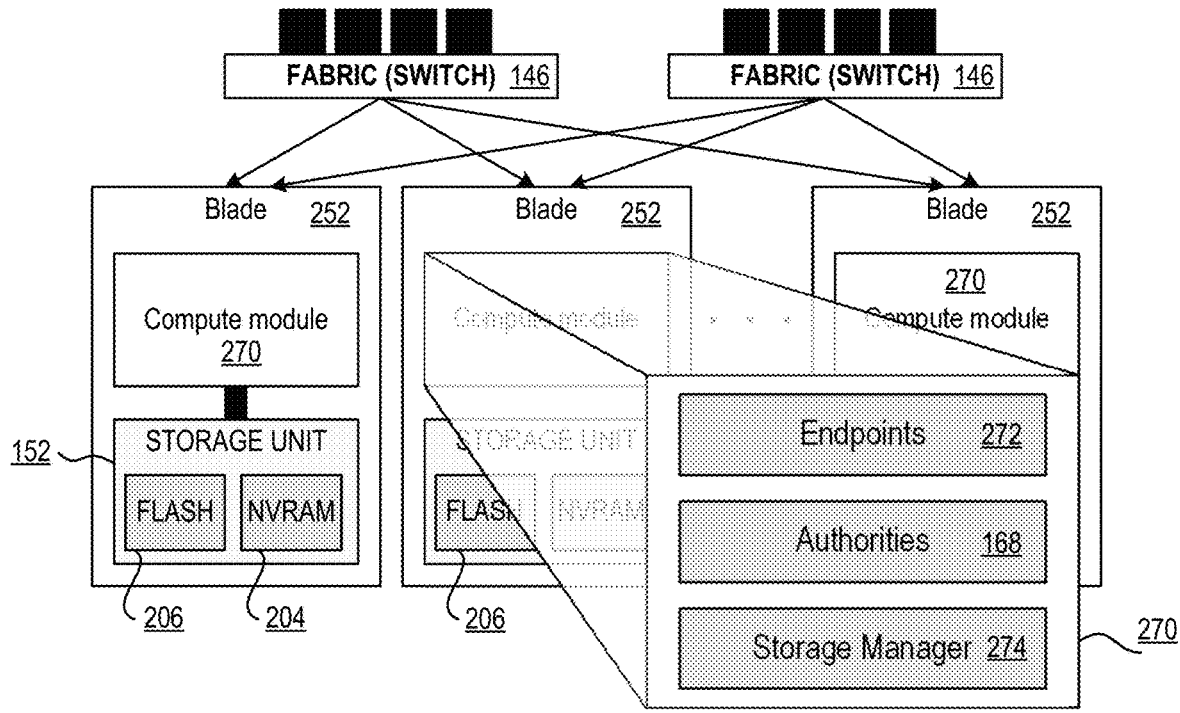
FIG. 2F depicts elasticity software layers in blades of a storage cluster, in accordance with some embodiments.

FIG. 2F depicts elasticity software layers in blades 252 of a storage cluster, in accordance with some embodiments. In the elasticity structure, elasticity software is symmetric, i.e., each blade's compute module 270 runs the three identical layers of processes depicted in FIG. 2F. Storage managers 274 execute read and write requests from other blades 252 for data and metadata stored in local storage unit 152 NVRAM 204 and flash 206. Authorities 168 fulfill client requests by issuing the necessary reads and writes to the blades 252 on whose storage units 152 the corresponding data or metadata resides. Endpoints 272 parse client connection requests received from switch fabric 146 supervisory software, relay the client connection requests to the authorities 168 responsible for fulfillment, and relay the authorities' 168 responses to clients. The symmetric three-layer structure enables the storage system's high degree of concurrency. Elasticity scales out efficiently and reliably in these embodiments. In addition, elasticity implements a unique scale-out technique that balances work evenly across all resources regardless of client access pattern, and maximizes concurrency by eliminating much of the need for inter-blade coordination that typically occurs with conventional distributed locking.

Still referring to FIG. 2F, authorities 168 running in the compute modules 270 of a blade 252 perform the internal operations required to fulfill client requests. One feature of elasticity is that authorities 168 are stateless, i.e., they cache active data and metadata in their own blades' 252 DRAMs for fast access, but the authorities store every update in their NVRAM 204 partitions on three separate blades 252 until the update has been written to flash 206. All the storage system writes to NVRAM 204 are in triplicate to partitions on three separate blades 252 in some embodiments. With triple-mirrored NVRAM 204 and persistent storage protected by parity and Reed-Solomon RAID checksums, the storage system can survive concurrent failure of two blades 252 with no loss of data, metadata, or access to either.

Because authorities 168 are stateless, they can migrate between blades 252. Each authority 168 has a unique identifier. NVRAM 204 and flash 206 partitions are associated with authorities' 168 identifiers, not with the blades 252 on which they are running in some. Thus, when an authority 168 migrates, the authority 168 continues to manage the same storage partitions from its new location. When a new blade 252 is installed in an embodiment of the storage cluster, the system automatically rebalances load by: partitioning the new blade's 252 storage for use by the system's authorities 168, migrating selected authorities 168 to the new blade 252, starting endpoints 272 on the new blade 252 and including them in the switch fabric's 146 client connection distribution algorithm.

From their new locations, migrated authorities 168 persist the contents of their NVRAM 204 partitions on flash 206, process read and write requests from other authorities 168, and fulfill the client requests that endpoints 272 direct to them. Similarly, if a blade 252 fails or is removed, the system redistributes its authorities 168 among the system's remaining blades 252. The redistributed authorities 168 continue to perform their original functions from their new locations.

Figure 2G:
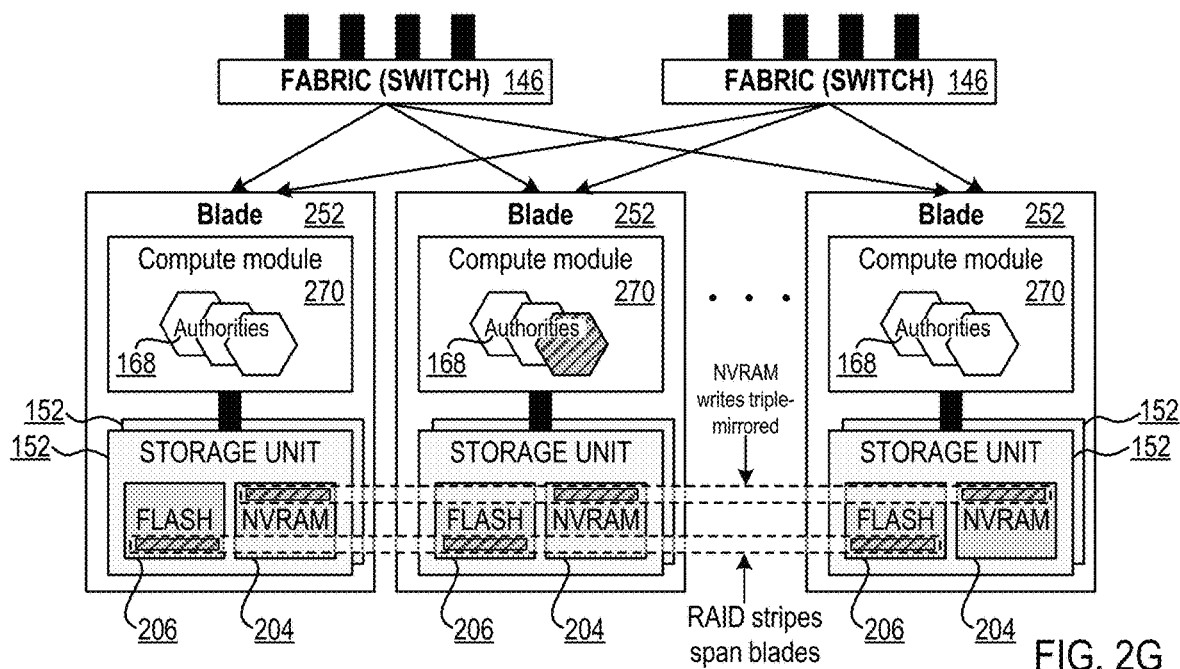
FIG. 2G depicts authorities and storage resources in blades of a storage cluster, in accordance with some embodiments.

FIG. 2G depicts authorities 168 and storage resources in blades 252 of a storage cluster, in accordance with some embodiments. Each authority 168 is exclusively responsible for a partition of the flash 206 and NVRAM 204 on each blade 252. The authority 168 manages the content and integrity of its partitions independently of other authorities 168. Authorities 168 compress incoming data and preserve it temporarily in their NVRAM 204 partitions, and then consolidate, RAID-protect, and persist the data in segments of the storage in their flash 206 partitions. As the authorities 168 write data to flash 206, storage managers 274 perform the necessary flash translation to optimize write performance and maximize media longevity. In the background, authorities 168 "garbage collect," or reclaim space occupied by data that clients have made obsolete by overwriting the data. It should be appreciated that since authorities' 168 partitions are disjoint, there is no need for distributed locking to execute client and writes or to perform background functions.

The embodiments described herein may utilize various software, communication and/or networking protocols. In addition, the configuration of the hardware and/or software may be adjusted to accommodate various protocols. For example, the embodiments may utilize Active Directory, which is a database based system that provides authentication, directory, policy, and other services in a WINDOWS™ environment. In these embodiments, LDAP (Lightweight Directory Access Protocol) is one example application protocol for querying and modifying items in directory service providers such as Active Directory. In some embodiments, a network lock manager ('NLM') is utilized as a facility that works in cooperation with the Network File System ('NFS') to provide a System V style of advisory file and record locking over a network. The Server Message Block ('SMB') protocol, one version of which is also known as Common Internet File System ('CIFS'), may be integrated with the storage systems discussed herein. SMP operates as an application-layer network protocol typically used for providing shared access to files, printers, and serial ports and miscellaneous communications between nodes on a network. SMB also provides an authenticated inter-process communication mechanism. AMAZON™ S3 (Simple Storage Service) is a web service offered by Amazon Web Services, and the systems described herein may interface with Amazon S3 through web services interfaces (REST (representational state transfer), SOAP (simple object access protocol), and BitTorrent). A RESTful API (application programming interface) breaks down a transaction to create a series of small modules. Each module addresses a particular underlying part of the transaction. The control or permissions provided with these embodiments, especially for object data, may include utilization of an access control list ('ACL'). The ACL is a list of permissions attached to an object and the ACL specifies which users or system processes are granted access to objects, as well as what operations are allowed on given objects. The systems may utilize Internet Protocol version 6 ('IPV6'), as well as IPv4, for the communications protocol that provides an identification and location system for computers on networks and routes traffic across the Internet. The routing of packets between networked systems may include Equal-cost multi-path routing ('ECMP'), which is a routing strategy where next-hop packet forwarding to a single destination can occur over multiple "best paths" which tie for top place in routing metric calculations. Multi-path routing can be used in conjunction with most routing protocols, because it is a per-hop decision limited to a single router. The software may support Multi-tenancy, which is an architecture in which a single instance of a software application serves multiple customers. Each customer may be referred to as a tenant. Tenants may be given the ability to customize some parts of the application, but may not customize the application's code, in some embodiments. The embodiments may maintain audit logs. An audit log is a document that records an event in a computing system. In addition to documenting what resources were accessed, audit log entries typically include destination and source addresses, a timestamp, and user login information for compliance with various regulations. The embodiments may support various key management policies, such as encryption key rotation. In addition, the system may support dynamic root passwords or some variation dynamically changing passwords.

Figure 3A:
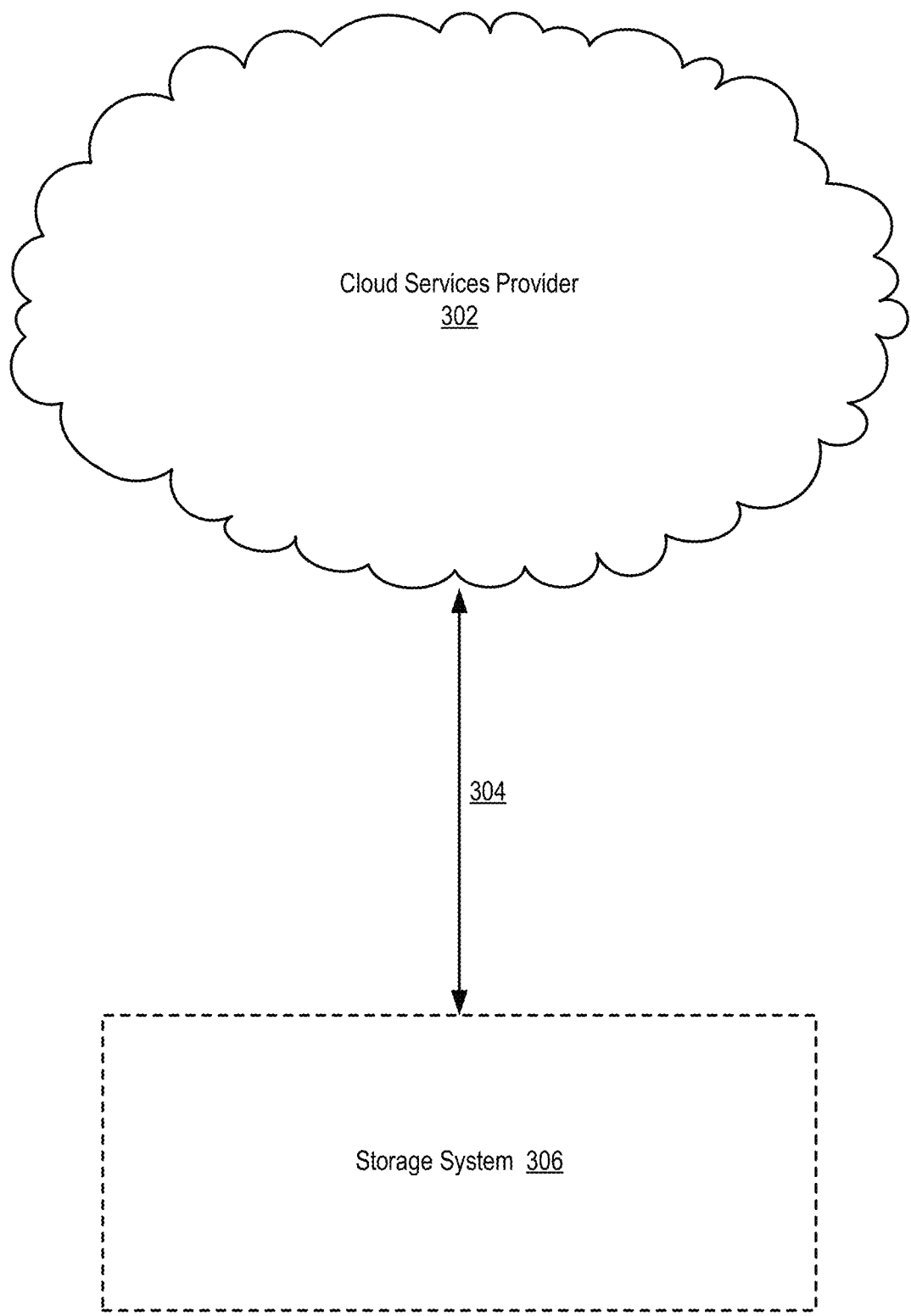
FIG. 3A sets forth a diagram of a storage system that is coupled for data communications with a cloud services provider in accordance with some embodiments of the present disclosure.

FIG. 3A sets forth a diagram of a storage system 306 that is coupled for data communications with a cloud services provider 302 in accordance with some embodiments of the present disclosure. Although depicted in less detail, the storage system 306 depicted in FIG. 3A may be similar to the storage systems described above with reference to FIGS. 1A-1D and FIGS. 2A-2G. In some embodiments, the storage system 306 depicted in FIG. 3A may be embodied as a storage system that includes imbalanced active/active controllers, as a storage system that includes balanced active/active controllers, as a storage system that includes active/active controllers where less than all of each controller's resources are utilized such that each controller has reserve resources that may be used to support failover, as a storage system that includes fully active/active controllers, as a storage system that includes dataset-segregated controllers, as a storage system that includes dual-layer architectures with front-end controllers and back-end integrated storage controllers, as a storage system that includes scale-out clusters of dual-controller arrays, as well as combinations of such embodiments.

In the example depicted in FIG. 3A, the storage system 306 is coupled to the cloud services provider 302 via a data communications link 304. The data communications link 304 may be embodied as a dedicated data communications link, as a data communications pathway that is provided through the use of one or data communications networks such as a wide area network ('WAN') or local area network ('LAN'), or as some other mechanism capable of transporting digital information between the storage system 306 and the cloud services provider 302. Such a data communications link 304 may be fully wired, fully wireless, or some aggregation of wired and wireless data communications pathways. In such an example, digital information may be exchanged between the storage system 306 and the cloud services provider 302 via the data communications link 304 using one or more data communications protocols. For example, digital information may be exchanged between the storage system 306 and the cloud services provider 302 via the data communications link 304 using the handheld device transfer protocol ('HDTP'), hypertext transfer protocol ('HTTP'), internet protocol ('IP'), real-time transfer protocol ('RTP'), transmission control protocol ('TCP'), user datagram protocol ('UDP'), wireless application protocol ('WAP'), or other protocol.

The cloud services provider 302 depicted in FIG. 3A may be embodied, for example, as a system and computing environment that provides services to users of the cloud services provider 302 through the sharing of computing resources via the data communications link 304. The cloud services provider 302 may provide on-demand access to a shared pool of configurable computing resources such as computer networks, servers, storage, applications and services, and so on. The shared pool of configurable resources may be rapidly provisioned and released to a user of the cloud services provider 302 with minimal management effort. Generally, the user of the cloud services provider 302 is unaware of the exact computing resources utilized by the cloud services provider 302 to provide the services. Although in many cases such a cloud services provider 302 may be accessible via the Internet, readers of skill in the art will recognize that any system that abstracts the use of shared resources to provide services to a user through any data communications link may be considered a cloud services provider 302.

In the example depicted in FIG. 3A, the cloud services provider 302 may be configured to provide a variety of services to the storage system 306 and users of the storage system 306 through the implementation of various service models. For example, the cloud services provider 302 may be configured to provide services to the storage system 306 and users of the storage system 306 through the implementation of an infrastructure as a service ('IaaS') service model where the cloud services provider 302 offers computing infrastructure such as virtual machines and other resources as a service to subscribers. In addition, the cloud services provider 302 may be configured to provide services to the storage system 306 and users of the storage system 306 through the implementation of a platform as a service ('PaaS') service model where the cloud services provider 302 offers a development environment to application developers. Such a development environment may include, for example, an operating system, programming-language execution environment, database, web server, or other components that may be utilized by application developers to develop and run software solutions on a cloud platform. Furthermore, the cloud services provider 302 may be configured to provide services to the storage system 306 and users of the storage system 306 through the implementation of a software as a service ('SaaS') service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. The cloud services provider 302 may be further configured to provide services to the storage system 306 and users of the storage system 306 through the implementation of an authentication as a service ('AaaS') service model where the cloud services provider 302 offers authentication services that can be used to secure access to applications, data sources, or other resources. The cloud services provider 302 may also be configured to provide services to the storage system 306 and users of the storage system 306 through the implementation of a storage as a service model where the cloud services provider 302 offers access to its storage infrastructure for use by the storage system 306 and users of the storage system 306. Readers will appreciate that the cloud services provider 302 may be configured to provide additional services to the storage system 306 and users of the storage system 306 through the implementation of additional service models, as the service models described above are included only for explanatory purposes and in no way represent a limitation of the services that may be offered by the cloud services provider 302 or a limitation as to the service models that may be implemented by the cloud services provider 302.

In the example depicted in FIG. 3A, the cloud services provider 302 may be embodied, for example, as a private cloud, as a public cloud, or as a combination of a private cloud and public cloud. In an embodiment in which the cloud services provider 302 is embodied as a private cloud, the cloud services provider 302 may be dedicated to providing services to a single organization rather than providing services to multiple organizations. In an embodiment where the cloud services provider 302 is embodied as a public cloud, the cloud services provider 302 may provide services to multiple organizations. Public cloud and private cloud deployment models may differ and may come with various advantages and disadvantages. For example, because a public cloud deployment involves the sharing of a computing infrastructure across different organization, such a deployment may not be ideal for organizations with security concerns, mission-critical workloads, uptime requirements demands, and so on. While a private cloud deployment can address some of these issues, a private cloud deployment may require on-premises staff to manage the private cloud. In still alternative embodiments, the cloud services provider 302 may be embodied as a mix of a private and public cloud services with a hybrid cloud deployment.

Although not explicitly depicted in FIG. 3A, readers will appreciate that additional hardware components and additional software components may be necessary to facilitate the delivery of cloud services to the storage system 306 and users of the storage system 306. For example, the storage system 306 may be coupled to (or even include) a cloud storage gateway. Such a cloud storage gateway may be embodied, for example, as hardware-based or software-based appliance that is located on premise with the storage system 306. Such a cloud storage gateway may operate as a bridge between local applications that are executing on the storage array 306 and remote, cloud-based storage that is utilized by the storage array 306. Through the use of a cloud storage gateway, organizations may move primary iSCSI or NAS to the cloud services provider 302, thereby enabling the organization to save space on their on-premises storage systems. Such a cloud storage gateway may be configured to emulate a disk array, a block-based device, a file server, or other storage system that can translate the SCSI commands, file server commands, or other appropriate command into REST-space protocols that facilitate communications with the cloud services provider 302.

In order to enable the storage system 306 and users of the storage system 306 to make use of the services provided by the cloud services provider 302, a cloud migration process may take place during which data, applications, or other elements from an organization's local systems (or even from another cloud environment) are moved to the cloud services provider 302. In order to successfully migrate data, applications, or other elements to the cloud services provider's 302 environment, middleware such as a cloud migration tool may be utilized to bridge gaps between the cloud services provider's 302 environment and an organization's environment. Such cloud migration tools may also be configured to address potentially high network costs and long transfer times associated with migrating large volumes of data to the cloud services provider 302, as well as addressing security concerns associated with sensitive data to the cloud services provider 302 over data communications networks. In order to further enable the storage system 306 and users of the storage system 306 to make use of the services provided by the cloud services provider 302, a cloud orchestrator may also be used to arrange and coordinate automated tasks in pursuit of creating a consolidated process or workflow. Such a cloud orchestrator may perform tasks such as configuring various components, whether those components are cloud components or on-premises components, as well as managing the interconnections between such components. The cloud orchestrator can simplify the inter-component communication and connections to ensure that links are correctly configured and maintained.

In the example depicted in FIG. 3A, and as described briefly above, the cloud services provider 302 may be configured to provide services to the storage system 306 and users of the storage system 306 through the usage of a SaaS service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. Such applications may take many forms in accordance with various embodiments of the present disclosure. For example, the cloud services provider 302 may be configured to provide access to data analytics applications to the storage system 306 and users of the storage system 306. Such data analytics applications may be configured, for example, to receive telemetry data phoned home by the storage system 306. Such telemetry data may describe various operating characteristics of the storage system 306 and may be analyzed, for example, to determine the health of the storage system 306, to identify workloads that are executing on the storage system 306, to predict when the storage system 306 will run out of various resources, to recommend configuration changes, hardware or software upgrades, workflow migrations, or other actions that may improve the operation of the storage system 306.

The cloud services provider 302 may also be configured to provide access to virtualized computing environments to the storage system 306 and users of the storage system 306. Such virtualized computing environments may be embodied, for example, as a virtual machine or other virtualized computer hardware platforms, virtual storage devices, virtualized computer network resources, and so on. Examples of such virtualized environments can include virtual machines that are created to emulate an actual computer, virtualized desktop environments that separate a logical desktop from a physical machine, virtualized file systems that allow uniform access to different types of concrete file systems, and many others.

Figure 3B:
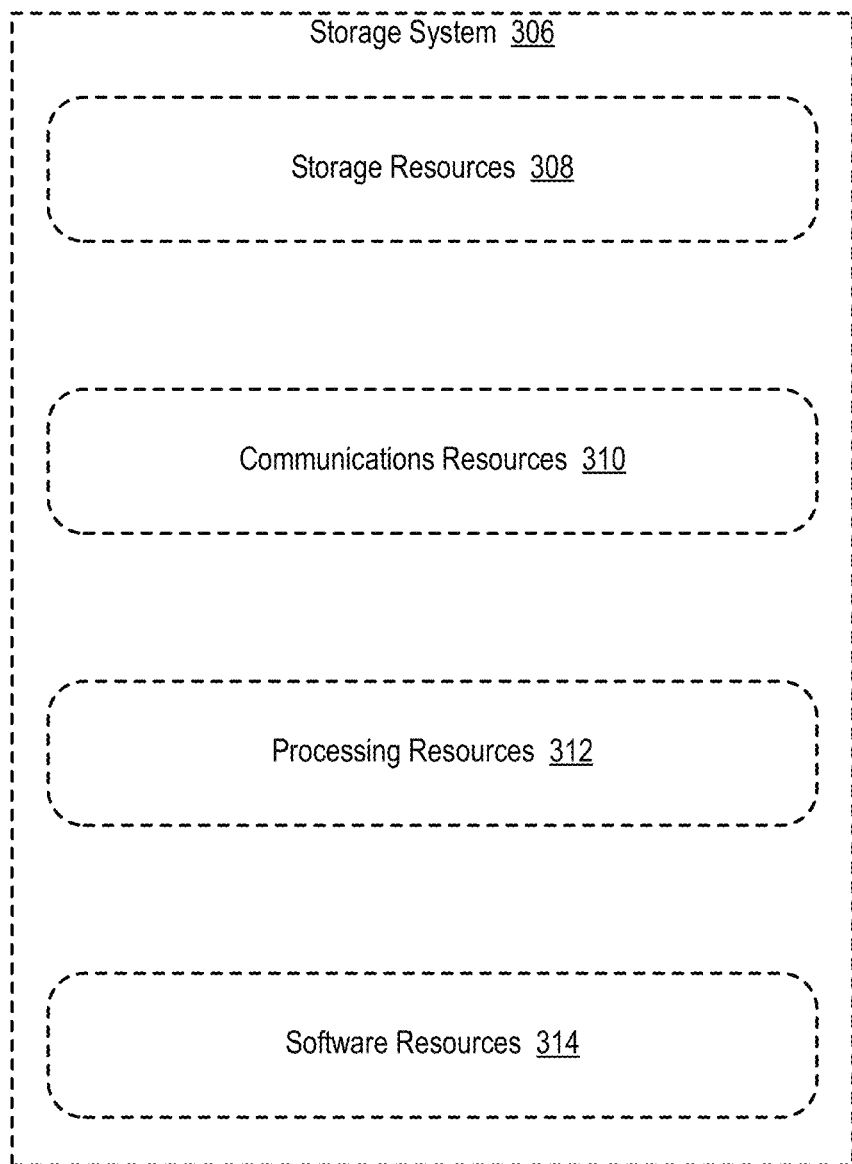
FIG. 3B sets forth a diagram of a storage system in accordance with some embodiments of the present disclosure.

For further explanation, FIG. 3B sets forth a diagram of a storage system 306 in accordance with some embodiments of the present disclosure. Although depicted in less detail, the storage system 306 depicted in FIG. 3B may be similar to the storage systems described above with reference to FIGS. 1A-1D and FIGS. 2A-2G as the storage system may include many of the components described above.

The storage system 306 depicted in FIG. 3B may include storage resources 308, which may be embodied in many forms. For example, in some embodiments the storage resources 308 can include nano-RAM or another form of nonvolatile random access memory that utilizes carbon nanotubes deposited on a substrate. In some embodiments, the storage resources 308 may include 3D crosspoint non-volatile memory in which bit storage is based on a change of bulk resistance, in conjunction with a stackable cross-gridded data access array. In some embodiments, the storage resources 308 may include flash memory, including single-level cell ('SLC') NAND flash, multi-level cell ('MLC') NAND flash, triple-level cell ('TLC') NAND flash, quad-level cell ('QLC') NAND flash, and others. In some embodiments, the storage resources 308 may include non-volatile magnetoresistive random-access memory ('MRAM'), including spin transfer torque ('STT') MRAM, in which data is stored through the use of magnetic storage elements. In some embodiments, the example storage resources 308 may include non-volatile phase-change memory ('PCM') that may have the ability to hold multiple bits in a single cell as cells can achieve a number of distinct intermediary states. In some embodiments, the storage resources 308 may include quantum memory that allows for the storage and retrieval of photonic quantum information. In some embodiments, the example storage resources 308 may include resistive random-access memory ('ReRAM') in which data is stored by changing the resistance across a dielectric solid-state material. In some embodiments, the storage resources 308 may include storage class memory ('SCM') in which solid-state nonvolatile memory may be manufactured at a high density using some combination of sub-lithographic patterning techniques, multiple bits per cell, multiple layers of devices, and so on. Readers will appreciate that other forms of computer memories and storage devices may be utilized by the storage systems described above, including DRAM, SRAM, EEPROM, universal memory, and many others. The storage resources 308 depicted in FIG. 3A may be embodied in a variety of form factors, including but not limited to, dual in-line memory modules ('DIMMs'), non-volatile dual in-line memory modules ('NVDIMMs'), M.2, U.2, and others.

The example storage system 306 depicted in FIG. 3B may implement a variety of storage architectures. For example, storage systems in accordance with some embodiments of the present disclosure may utilize block storage where data is stored in blocks, and each block essentially acts as an individual hard drive. Storage systems in accordance with some embodiments of the present disclosure may utilize object storage, where data is managed as objects. Each object may include the data itself, a variable amount of metadata, and a globally unique identifier, where object storage can be implemented at multiple levels (e.g., device level, system level, interface level). Storage systems in accordance with some embodiments of the present disclosure utilize file storage in which data is stored in a hierarchical structure. Such data may be saved in files and folders, and presented to both the system storing it and the system retrieving it in the same format.

The example storage system 306 depicted in FIG. 3B may be embodied as a storage system in which additional storage resources can be added through the use of a scale-up model, additional storage resources can be added through the use of a scale-out model, or through some combination thereof. In a scale-up model, additional storage may be added by adding additional storage devices. In a scale-out model, however, additional storage nodes may be added to a cluster of storage nodes, where such storage nodes can include additional processing resources, additional networking resources, and so on.

The storage system 306 depicted in FIG. 3B also includes communications resources 310 that may be useful in facilitating data communications between components within the storage system 306, as well as data communications between the storage system 306 and computing devices that are outside of the storage system 306. The communications resources 310 may be configured to utilize a variety of different protocols and data communication fabrics to facilitate data communications between components within the storage systems as well as computing devices that are outside of the storage system. For example, the communications resources 310 can include fibre channel ('FC')

technologies such as FC fabrics and FC protocols that can transport SCSI commands over FC networks. The communications resources 310 can also include FC over ethernet ('FCOE') technologies through which FC frames are encapsulated and transmitted over Ethernet networks. The communications resources 310 can also include InfiniBand ('IB') technologies in which a switched fabric topology is utilized to facilitate transmissions between channel adapters. The communications resources 310 can also include NVM Express ('NVMe') technologies and NVMe over fabrics ('NVMeoF') technologies through which non-volatile storage media attached via a PCI express ('PCIe') bus may be accessed. The communications resources 310 can also include mechanisms for accessing storage resources 308 within the storage system 306 utilizing serial attached SCSI ('SAS'), serial ATA ('SATA') bus interfaces for connecting storage resources 308 within the storage system 306 to host bus adapters within the storage system 306, internet small computer systems interface ('iSCSI') technologies to provide block-level access to storage resources 308 within the storage system 306, and other communications resources that that may be useful in facilitating data communications between components within the storage system 306, as well as data communications between the storage system 306 and computing devices that are outside of the storage system 306.

The storage system 306 depicted in FIG. 3B also includes processing resources 312 that may be useful in useful in executing computer program instructions and performing other computational tasks within the storage system 306. The processing resources 312 may include one or more application-specific integrated circuits ('ASICs') that are customized for some particular purpose as well as one or more central processing units ('CPUs'). The processing resources 312 may also include one or more digital signal processors ('DSPs'), one or more field-programmable gate arrays ('FPGAs'), one or more systems on a chip ('SoCs'), or other form of processing resources 312. The storage system 306 may utilize the storage resources 312 to perform a variety of tasks including, but not limited to, supporting the execution of software resources 314 that will be described in greater detail below.

The storage system 306 depicted in FIG. 3B also includes software resources 314 that, when executed by processing resources 312 within the storage system 306, may perform various tasks. The software resources 314 may include, for example, one or more modules of computer program instructions that when executed by processing resources 312 within the storage system 306 are useful in carrying out various data protection techniques to preserve the integrity of data that is stored within the storage systems. Readers will appreciate that such data protection techniques may be carried out, for example, by system software executing on computer hardware within the storage system, by a cloud services provider, or in other ways. Such data protection techniques can include, for example, data archiving techniques that cause data that is no longer actively used to be moved to a separate storage device or separate storage system for long-term retention, data backup techniques through which data stored in the storage system may be copied and stored in a distinct location to avoid data loss in the event of equipment failure or some other form of catastrophe with the storage system, data replication techniques through which data stored in the storage system is replicated to another storage system such that the data may be accessible via multiple storage systems, data snapshotting techniques through which the state of data within the storage system is captured at various points in time, data and database cloning techniques through which duplicate copies of data and databases may be created, and other data protection techniques. Through the use of such data protection techniques, business continuity and disaster recovery objectives may be met as a failure of the storage system may not result in the loss of data stored in the storage system.

The software resources 314 may also include software that is useful in implementing software-defined storage ('SDS'). In such an example, the software resources 314 may include one or more modules of computer program instructions that, when executed, are useful in policy-based provisioning and management of data storage that is independent of the underlying hardware. Such software resources 314 may be useful in implementing storage virtualization to separate the storage hardware from the software that manages the storage hardware.

The software resources 314 may also include software that is useful in facilitating and optimizing I/O operations that are directed to the storage resources 308 in the storage system 306. For example, the software resources 314 may include software modules that perform carry out various data reduction techniques such as, for example, data compression, data deduplication, and others. The software resources 314 may include software modules that intelligently group together I/O operations to facilitate better usage of the underlying storage resource 308, software modules that perform data migration operations to migrate from within a storage system, as well as software modules that perform other functions. Such software resources 314 may be embodied as one or more software containers or in many other ways.

Readers will appreciate that the presence of such software resources 314 may provide for an improved user experience of the storage system 306, an expansion of functionality supported by the storage system 306, and many other benefits. Consider the specific example of the software resources 314 carrying out data backup techniques through which data stored in the storage system may be copied and stored in a distinct location to avoid data loss in the event of equipment failure or some other form of catastrophe. In such an example, the systems described herein may more reliably (and with less burden placed on the user) perform backup operations relative to interactive backup management systems that require high degrees of user interactivity, offer less robust automation and feature sets, and so on.

The storage systems described above may carry out intelligent data backup techniques through which data stored in the storage system may be copied and stored in a distinct location to avoid data loss in the event of equipment failure or some other form of catastrophe. For example, the storage systems described above may be configured to examine each backup to avoid restoring the storage system to an undesirable state. Consider an example in which malware infects the storage system. In such an example, the storage system may include software resources 314 that can scan each backup to identify backups that were captured before the malware infected the storage system and those backups that were captured after the malware infected the storage system. In such an example, the storage system may restore itself from a backup that does not include the malware—or at least not restore the portions of a backup that contained the malware. In such an example, the storage system may include software resources 314 that can scan each backup to identify the presences of malware (or a virus, or some other undesirable), for example, by identifying write operations that were serviced by the storage system and originated from a network subnet that is suspected to have delivered the malware, by identifying write operations that were serviced by the storage system and originated from a user that is suspected to have delivered the malware, by identifying write operations that were serviced by the storage system and examining the content of the write operation against fingerprints of the malware, and in many other ways.

Readers will further appreciate that the backups (often in the form of one or more snapshots) may also be utilized to perform rapid recovery of the storage system. Consider an example in which the storage system is infected with ransomware that locks users out of the storage system. In such an example, software resources 314 within the storage system may be configured to detect the presence of ransomware and may be further configured to restore the storage system to a point-in-time, using the retained backups, prior to the point-in-time at which the ransomware infected the storage system. In such an example, the presence of ransomware may be explicitly detected through the use of software tools utilized by the system, through the use of a key (e.g., a USB drive) that is inserted into the storage system, or in a similar way. Likewise, the presence of ransomware may be inferred in response to system activity meeting a predetermined fingerprint such as, for example, no reads or writes coming into the system for a predetermined period of time.

Readers will appreciate that the various components depicted in FIG. 3B may be grouped into one or more optimized computing packages as converged infrastructures. Such converged infrastructures may include pools of computers, storage and networking resources that can be shared by multiple applications and managed in a collective manner using policy-driven processes. Such converged infrastructures may minimize compatibility issues between various components within the storage system 306 while also reducing various costs associated with the establishment and operation of the storage system 306. Such converged infrastructures may be implemented with a converged infrastructure reference architecture, with standalone appliances, with a software driven hyper-converged approach (e.g., hyper-converged infrastructures), or in other ways.

Readers will appreciate that the storage system 306 depicted in FIG. 3B may be useful for supporting various types of software applications. For example, the storage system 306 may be useful in supporting artificial intelligence ('AI') applications, database applications, DevOps projects, electronic design automation tools, event-driven software applications, high performance computing applications, simulation applications, high-speed data capture and analysis applications, machine learning applications, media production applications, media serving applications, picture archiving and communication systems ('PACS') applications, software development applications, virtual reality applications, augmented reality applications, and many other types of applications by providing storage resources to such applications.

The storage systems described above may operate to support a wide variety of applications. In view of the fact that the storage systems include compute resources, storage resources, and a wide variety of other resources, the storage systems may be well suited to support applications that are resource intensive such as, for example, AI applications. Such AI applications may enable devices to perceive their environment and take actions that maximize their chance of success at some goal. Examples of such AI applications can include IBM Watson, Microsoft Oxford, Google DeepMind, Baidu Minwa, and others. The storage systems described above may also be well suited to support other types of applications that are resource intensive such as, for example, machine learning applications. Machine learning applications may perform various types of data analysis to automate analytical model building. Using algorithms that iteratively learn from data, machine learning applications can enable computers to learn without being explicitly programmed.

In addition to the resources already described, the storage systems described above may also include graphics processing units ('GPUs'), occasionally referred to as visual processing unit ('VPUs'). Such GPUs may be embodied as specialized electronic circuits that rapidly manipulate and alter memory to accelerate the creation of images in a frame buffer intended for output to a display device. Such GPUs may be included within any of the computing devices that are part of the storage systems described above, including as one of many individually scalable components of a storage system, where other examples of individually scalable components of such storage system can include storage components, memory components, compute components (e.g., CPUs, FPGAs, ASICs), networking components, software components, and others. In addition to GPUs, the storage systems described above may also include neural network processors ('NNPs') for use in various aspects of neural network processing. Such NNPs may be used in place of (or in addition to) GPUs and may be also be independently scalable.

As described above, the storage systems described herein may be configured to support artificial intelligence applications, machine learning applications, big data analytics applications, and many other types of applications. The rapid growth in these sort of applications is being driven by three technologies: deep learning (DL), GPU processors, and Big Data. Deep learning is a computing model that makes use of massively parallel neural networks inspired by the human brain. Instead of experts handcrafting software, a deep learning model writes its own software by learning from lots of examples. A GPU is a modern processor with thousands of cores, well-suited to run algorithms that loosely represent the parallel nature of the human brain.

Advances in deep neural networks have ignited a new wave of algorithms and tools for data scientists to tap into their data with artificial intelligence (AI). With improved algorithms, larger data sets, and various frameworks (including open-source software libraries for machine learning across a range of tasks), data scientists are tackling new use cases like autonomous driving vehicles, natural language processing and understanding, computer vision, machine reasoning, strong AI, and many others. Applications of such techniques may include: machine and vehicular object detection, identification and avoidance; visual recognition, classification and tagging; algorithmic financial trading strategy performance management; simultaneous localization and mapping; predictive maintenance of high-value machinery; prevention against cyber security threats, expertise automation; image recognition and classification; question answering; robotics; text analytics (extraction, classification) and text generation and translation; and many others. Applications of AI techniques has materialized in a wide array of products include, for example, Amazon Echo's speech recognition technology that allows users to talk to their machines, Google Translate™ which allows for machine-based language translation, Spotify's Discover Weekly that provides recommendations on new songs and artists that a user may like based on the user's usage and traffic analysis, Quill's text generation offering that takes structured data and turns it into narrative stories, Chatbots that provide real-time, contextually specific answers to questions in a dialog format, and many others. Furthermore, AI may impact a wide variety of industries and sectors. For example, AI solutions may be used in healthcare to take clinical notes, patient files, research data, and other inputs to generate potential treatment options for doctors to explore. Likewise, AI solutions may be used by retailers to personalize consumer recommendations based on a person's digital footprint of behaviors, profile data, or other data.

Training deep neural networks, however, requires both high quality input data and large amounts of computation. GPUs are massively parallel processors capable of operating on large amounts of data simultaneously. When combined into a multi-GPU cluster, a high throughput pipeline may be required to feed input data from storage to the compute engines. Deep learning is more than just constructing and training models. There also exists an entire data pipeline that must be designed for the scale, iteration, and experimentation necessary for a data science team to succeed.

Data is the heart of modern AI and deep learning algorithms. Before training can begin, one problem that must be addressed revolves around collecting the labeled data that is crucial for training an accurate AI model. A full scale AI deployment may be required to continuously collect, clean, transform, label, and store large amounts of data. Adding additional high quality data points directly translates to more accurate models and better insights. Data samples may undergo a series of processing steps including, but not limited to: 1) ingesting the data from an external source into the training system and storing the data in raw form, 2) cleaning and transforming the data in a format convenient for training, including linking data samples to the appropriate label, 3) exploring parameters and models, quickly testing with a smaller dataset, and iterating to converge on the most promising models to push into the production cluster, 4) executing training phases to select random batches of input data, including both new and older samples, and feeding those into production GPU servers for computation to update model parameters, and 5) evaluating including using a holdback portion of the data not used in training in order to evaluate model accuracy on the holdout data. This lifecycle may apply for any type of parallelized machine learning, not just neural networks or deep learning. For example, standard machine learning frameworks may rely on CPUs instead of GPUs but the data ingest and training workflows may be the same. Readers will appreciate that a single shared storage data hub creates a coordination point throughout the lifecycle without the need for extra data copies among the ingest, preprocessing, and training stages. Rarely is the ingested data used for only one purpose, and shared storage gives the flexibility to train multiple different models or apply traditional analytics to the data.

Readers will appreciate that each stage in the AI data pipeline may have varying requirements from the data hub (e.g., the storage system or collection of storage systems). Scale-out storage systems must deliver uncompromising performance for all manner of access types and patterns—from small, metadata-heavy to large files, from random to sequential access patterns, and from low to high concurrency. The storage systems described above may serve as an ideal AI data hub as the systems may service unstructured workloads. In the first stage, data is ideally ingested and stored on to the same data hub that following stages will use, in order to avoid excess data copying. The next two steps can be done on a standard compute server that optionally includes a GPU, and then in the fourth and last stage, full training production jobs are run on powerful GPU-accelerated servers. Often, there is a production pipeline alongside an experimental pipeline operating on the same dataset. Further, the GPU-accelerated servers can be used independently for different models or joined together to train on one larger model, even spanning multiple systems for distributed training. If the shared storage tier is slow, then data must be copied to local storage for each phase, resulting in wasted time staging data onto different servers. The ideal data hub for the AI training pipeline delivers performance similar to data stored locally on the server node while also having the simplicity and performance to enable all pipeline stages to operate concurrently.

A data scientist works to improve the usefulness of the trained model through a wide variety of approaches: more data, better data, smarter training, and deeper models. In many cases, there will be teams of data scientists sharing the same datasets and working in parallel to produce new and improved training models. Often, there is a team of data scientists working within these phases concurrently on the same shared datasets. Multiple, concurrent workloads of data processing, experimentation, and full-scale training layer the demands of multiple access patterns on the storage tier. In other words, storage cannot just satisfy large file reads, but must contend with a mix of large and small file reads and writes. Finally, with multiple data scientists exploring datasets and models, it may be critical to store data in its native format to provide flexibility for each user to transform, clean, and use the data in a unique way. The storage systems described above may provide a natural shared storage home for the dataset, with data protection redundancy (e.g., by using RAID6) and the performance necessary to be a common access point for multiple developers and multiple experiments. Using the storage systems described above may avoid the need to carefully copy subsets of the data for local work, saving both engineering and GPU-accelerated servers use time. These copies become a constant and growing tax as the raw data set and desired transformations constantly update and change.

Readers will appreciate that a fundamental reason why deep learning has seen a surge in success is the continued improvement of models with larger data set sizes. In contrast, classical machine learning algorithms, like logistic regression, stop improving in accuracy at smaller data set sizes. As such, the separation of compute resources and storage resources may also allow independent scaling of each tier, avoiding many of the complexities inherent in managing both together. As the data set size grows or new data sets are considered, a scale out storage system must be able to expand easily. Similarly, if more concurrent training is required, additional GPUs or other compute resources can be added without concern for their internal storage. Furthermore, the storage systems described above may make building, operating, and growing an AI system easier due to the random read bandwidth provided by the storage systems, the ability to of the storage systems to randomly read small files (50 KB) high rates (meaning that no extra effort is required to aggregate individual data points to make larger, storage-friendly files), the ability of the storage systems to scale capacity and performance as either the dataset grows or the throughput requirements grow, the ability of the storage systems to support files or objects, the ability of the storage systems to tune performance for large or small files (i.e., no need for the user to provision filesystems), the ability of the storage systems to support non-disruptive upgrades of hardware and software even during production model training, and for many other reasons.

Small file performance of the storage tier may be critical as many types of inputs, including text, audio, or images will be natively stored as small files. If the storage tier does not handle small files well, an extra step will be required to pre-process and group samples into larger files. Storage, built on top of spinning disks, that relies on SSD as a caching tier, may fall short of the performance needed. Because training with random input batches results in more accurate models, the entire data set must be accessible with full performance. SSD caches only provide high performance for a small subset of the data and will be ineffective at hiding the latency of spinning drives.

Although the preceding paragraphs discuss deep learning applications, readers will appreciate that the storage systems described herein may also be part of a distributed deep learning ('DDL') platform to support the execution of DDL algorithms. Distributed deep learning may can be used to significantly accelerate deep learning with distributed computing on GPUs (or other form of accelerator or computer program instruction executor), such that parallelism can be achieved. In addition, the output of training machine learning and deep learning models, such as a fully trained machine learning model, may be used for a variety of purposes and in conjunction with other tools. For example, trained machine learning models may be used in conjunction with tools like Core ML to integrate a broad variety of machine learning model types into an application. In fact, trained models may be run through Core ML converter tools and inserted into a custom application that can be deployed on compatible devices. The storage systems described above may also be paired with other technologies such as TensorFlow, an open-source software library for dataflow programming across a range of tasks that may be used for machine learning applications such as neural networks, to facilitate the development of such machine learning models, applications, and so on.

Readers will further appreciate that the systems described above may be deployed in a variety of ways to support the democratization of AI, as AI becomes more available for mass consumption. The democratization of AI may include, for example, the ability to offer AI as a Platform-as-a-Service, the growth of Artificial general intelligence offerings, the proliferation of Autonomous level 4 and Autonomous level 5 vehicles, the availability of autonomous mobile robots, the development of conversational AI platforms, and many others. For example, the systems described above may be deployed in cloud environments, edge environments, or other environments that are useful in supporting the democratization of AI. As part of the democratization of AI, a movement may occur from narrow AI that consists of highly scoped machine learning solutions that target a particular task to artificial general intelligence where the use of machine learning is expanded to handle a broad range of use cases that could essentially perform any intelligent task that a human could perform and could learn dynamically, much like a human.

The storage systems described above may also be used in a neuromorphic computing environment. Neuromorphic computing is a form of computing that mimics brain cells. To support neuromorphic computing, an architecture of interconnected "neurons" replace traditional computing models with low-powered signals that go directly between neurons for more efficient computation. Neuromorphic computing may make use of very-large-scale integration (VLSI) systems containing electronic analog circuits to mimic neuro-biological architectures present in the nervous system, as well as analog, digital, mixed-mode analog/digital VLSI, and software systems that implement models of neural systems for perception, motor control, or multisensory integration.

Readers will appreciate that the storage systems described above may be configured to support the storage or use of (among other types of data) blockchains. Such blockchains may be embodied as a continuously growing list of records, called blocks, which are linked and secured using cryptography. Each block in a blockchain may contain a hash pointer as a link to a previous block, a timestamp, transaction data, and so on. Blockchains may be designed to be resistant to modification of the data and can serve as an open, distributed ledger that can record transactions between two parties efficiently and in a verifiable and permanent way. This makes blockchains potentially suitable for the recording of events, medical records, and other records management activities, such as identity management, transaction processing, and others. In addition to supporting the storage and use of blockchain technologies, the storage systems described above may also support the storage and use of derivative items such as, for example, open source blockchains and related tools that are part of the IBM™ Hyperledger project, permissioned blockchains in which a certain number of trusted parties are allowed to access the block chain, blockchain products that enable developers to build their own distributed ledger projects, and others. Readers will appreciate that blockchain technologies may impact a wide variety of industries and sectors. For example, blockchain technologies may be used in real estate transactions as blockchain based contracts whose use can eliminate the need for $3^{rd}$ parties and enable self-executing actions when conditions are met. Likewise, universal health records can be created by aggregating and placing a person's health history onto a blockchain ledger for any healthcare provider, or permissioned health care providers, to access and update.

Readers will appreciate that the usage of blockchains is not limited to financial transactions, contracts, and the like. In fact, blockchains may be leveraged to enable the decentralized aggregation, ordering, timestamping and archiving of any type of information, including structured data, correspondence, documentation, or other data. Through the usage of blockchains, participants can provably and permanently agree on exactly what data was entered, when and by whom, without relying on a trusted intermediary. For example, SAP's recently launched blockchain platform, which supports MultiChain and Hyperledger Fabric, targets a broad range of supply chain and other non-financial applications.

One way to use a blockchain for recording data is to embed each piece of data directly inside a transaction. Every blockchain transaction may be digitally signed by one or more parties, replicated to a plurality of nodes, ordered and timestamped by the chain's consensus algorithm, and stored permanently in a tamper-proof way. Any data within the transaction will therefore be stored identically but independently by every node, along with a proof of who wrote it and when. The chain's users are able to retrieve this information at any future time. This type of storage may be referred to as on-chain storage. On-chain storage may not be particularly practical, however, when attempting to store a very large dataset. As such, in accordance with embodiments of the present disclosure, blockchains and the storage systems described herein may be leveraged to support on-chain storage of data as well as off-chain storage of data.

Off-chain storage of data can be implemented in a variety of ways and can occur when the data itself is not stored within the blockchain. For example, in one embodiment, a hash function may be utilized and the data itself may be fed into the hash function to generate a hash value. In such an example, the hashes of large pieces of data may be embedded within transactions, instead of the data itself. Each hash may serve as a commitment to its input data, with the data itself being stored outside of the blockchain. Readers will appreciate that any blockchain participant that needs an off-chain piece of data cannot reproduce the data from its hash, but if the data can be retrieved in some other way, then the on-chain hash serves to confirm who created it and when. Just like regular on-chain data, the hash may be embedded inside a digitally signed transaction, which was included in the chain by consensus.

Readers will appreciate that, in other embodiments, alternatives to blockchains may be used to facilitate the decentralized storage of information. For example, one alternative to a blockchain that may be used is a blockweave. While conventional blockchains store every transaction to achieve validation, a blockweave permits secure decentralization without the usage of the entire chain, thereby enabling low cost on-chain storage of data. Such blockweaves may utilize a consensus mechanism that is based on proof of access (PoA) and proof of work (PoW). While typical PoW systems only depend on the previous block in order to generate each successive block, the PoA algorithm may incorporate data from a randomly chosen previous block. Combined with the blockweave data structure, miners do not need to store all blocks (forming a blockchain), but rather can store any previous blocks forming a weave of blocks (a blockweave). This enables increased levels of scalability, speed and low-cost and reduces the cost of data storage in part because miners need not store all blocks, thereby resulting in a substantial reduction in the amount of electricity that is consumed during the mining process because, as the network expands, electricity consumption decreases because a blockweave demands less and less hashing power for consensus as data is added to the system. Furthermore, blockweaves may be deployed on a decentralized storage network in which incentives are created to encourage rapid data sharing. Such decentralized storage networks may also make use of blockshadowing techniques, where nodes only send a minimal block "shadow" to other nodes that allows peers to reconstruct a full block, instead of transmitting the full block itself.

The storage systems described above may, either alone or in combination with other computing devices, be used to support in-memory computing applications. In memory computing involves the storage of information in RAM that is distributed across a cluster of computers. In-memory computing helps business customers, including retailers, banks and utilities, to quickly detect patterns, analyze massive data volumes on the fly, and perform their operations quickly. Readers will appreciate that the storage systems described above, especially those that are configurable with customizable amounts of processing resources, storage resources, and memory resources (e.g., those systems in which blades that contain configurable amounts of each type of resource), may be configured in a way so as to provide an infrastructure that can support in-memory computing. Likewise, the storage systems described above may include component parts (e.g., NVDIMMs, 3D crosspoint storage that provide fast random access memory that is persistent) that can actually provide for an improved in-memory computing environment as compared to in-memory computing environments that rely on RAM distributed across dedicated servers.

In some embodiments, the storage systems described above may be configured to operate as a hybrid in-memory computing environment that includes a universal interface to all storage media (e.g., RAM, flash storage, 3D crosspoint storage). In such embodiments, users may have no knowledge regarding the details of where their data is stored but they can still use the same full, unified API to address data. In such embodiments, the storage system may (in the background) move data to the fastest layer available— including intelligently placing the data in dependence upon various characteristics of the data or in dependence upon some other heuristic. In such an example, the storage systems may even make use of existing products such as Apache Ignite and GridGain to move data between the various storage layers, or the storage systems may make use of custom software to move data between the various storage layers. The storage systems described herein may implement various optimizations to improve the performance of in-memory computing such as, for example, having computations occur as close to the data as possible.

Readers will further appreciate that in some embodiments, the storage systems described above may be paired with other resources to support the applications described above. For example, one infrastructure could include primary compute in the form of servers and workstations which specialize in using General-purpose computing on graphics processing units ('GPGPU') to accelerate deep learning applications that are interconnected into a computation engine to train parameters for deep neural networks. Each system may have Ethernet external connectivity, InfiniBand external connectivity, some other form of external connectivity, or some combination thereof. In such an example, the GPUs can be grouped for a single large training or used independently to train multiple models. The infrastructure could also include a storage system such as those described above to provide, for example, a scale-out all-flash file or object store through which data can be accessed via high-performance protocols such as NFS, S3, and so on. The infrastructure can also include, for example, redundant top-of-rack Ethernet switches connected to storage and compute via ports in MLAG port channels for redundancy. The infrastructure could also include additional compute in the form of whitebox servers, optionally with GPUs, for data ingestion, pre-processing, and model debugging. Readers will appreciate that additional infrastructures are also be possible.

Readers will appreciate that the systems described above may be better suited for the applications described above relative to other systems that may include, for example, a distributed direct-attached storage (DDAS) solution deployed in server nodes. Such DDAS solutions may be built for handling large, less sequential accesses but may be less able to handle small, random accesses. Readers will further appreciate that the storage systems described above may be utilized to provide a platform for the applications described above that is preferable to the utilization of cloud-based resources as the storage systems may be included in an on-site or in-house infrastructure that is more secure, more locally and internally managed, more robust in feature sets and performance, or otherwise preferable to the utilization of cloud-based resources as part of a platform to support the applications described above. For example, services built on platforms such as IBM's Watson may require a business enterprise to distribute individual user information, such as financial transaction information or identifiable patient records, to other institutions. As such, cloud-based offerings of AI as a service may be less desirable than internally managed and offered AI as a service that is supported by storage systems such as the storage systems described above, for a wide array of technical reasons as well as for various business reasons.

Readers will appreciate that the storage systems described above, either alone or in coordination with other computing machinery may be configured to support other AI related tools. For example, the storage systems may make use of tools like ONXX or other open neural network exchange formats that make it easier to transfer models written in different AI frameworks. Likewise, the storage systems may be configured to support tools like Amazon's Gluon that allow developers to prototype, build, and train deep learning models. In fact, the storage systems described above may be part of a larger platform, such as IBM™ Cloud Private for Data, that includes integrated data science, data engineering and application building services. Such platforms may seamlessly collect, organize, secure, and analyze data across an enterprise, as well as simplify hybrid data management, unified data governance and integration, data science and business analytics with a single solution.

Readers will further appreciate that the storage systems described above may also be deployed as an edge solution. Such an edge solution may be in place to optimize cloud computing systems by performing data processing at the edge of the network, near the source of the data. Edge computing can push applications, data and computing power (i.e., services) away from centralized points to the logical extremes of a network. Through the use of edge solutions such as the storage systems described above, computational tasks may be performed using the compute resources provided by such storage systems, data may be storage using the storage resources of the storage system, and cloud-based services may be accessed through the use of various resources of the storage system (including networking resources). By performing computational tasks on the edge solution, storing data on the edge solution, and generally making use of the edge solution, the consumption of expensive cloud-based resources may be avoided and, in fact, performance improvements may be experienced relative to a heavier reliance on cloud-based resources.

While many tasks may benefit from the utilization of an edge solution, some particular uses may be especially suited for deployment in such an environment. For example, devices like drones, autonomous cars, robots, and others may require extremely rapid processing—so fast, in fact, that sending data up to a cloud environment and back to receive data processing support may simply be too slow. Likewise, machines like locomotives and gas turbines that generate large amounts of information through the use of a wide array of data-generating sensors may benefit from the rapid data processing capabilities of an edge solution. As an additional example, some IoT devices such as connected video cameras may not be well-suited for the utilization of cloud-based resources as it may be impractical (not only from a privacy perspective, security perspective, or a financial perspective) to send the data to the cloud simply because of the pure volume of data that is involved. As such, many tasks that really on data processing, storage, or communications may be better suited by platforms that include edge solutions such as the storage systems described above.

Consider a specific example of inventory management in a warehouse, distribution center, or similar location. A large inventory, warehousing, shipping, order-fulfillment, manufacturing or other operation has a large amount of inventory on inventory shelves, and high resolution digital cameras that produce a firehose of large data. All of this data may be taken into an image processing system, which may reduce the amount of data to a firehose of small data. All of the small data may be stored on-premises in storage. The on-premises storage, at the edge of the facility, may be coupled to the cloud, for external reports, real-time control and cloud storage. Inventory management may be performed with the results of the image processing, so that inventory can be tracked on the shelves and restocked, moved, shipped, modified with new products, or discontinued/obsolescent products deleted, etc. The above scenario is a prime candidate for an embodiment of the configurable processing and storage systems described above. A combination of compute-only blades and offload blades suited for the image processing, perhaps with deep learning on offload-FPGA or offload-custom blade(s) could take in the firehose of large data from all of the digital cameras, and produce the firehose of small data. All of the small data could then be stored by storage nodes, operating with storage units in whichever combination of types of storage blades best handles the data flow. This is an example of storage and function acceleration and integration. Depending on external communication needs with the cloud, and external processing in the cloud, and depending on reliability of network connections and cloud resources, the system could be sized for storage and compute management with bursty workloads and variable conductivity reliability. Also, depending on other inventory management aspects, the system could be configured for scheduling and resource management in a hybrid edge/cloud environment.

The storage systems described above may alone, or in combination with other computing resources, serves as a network edge platform that combines compute resources, storage resources, networking resources, cloud technologies and network virtualization technologies, and so on. As part of the network, the edge may take on characteristics similar to other network facilities, from the customer premise and backhaul aggregation facilities to Points of Presence (PoPs) and regional data centers. Readers will appreciate that network workloads, such as Virtual Network Functions (VNFs) and others, will reside on the network edge platform. Enabled by a combination of containers and virtual machines, the network edge platform may rely on controllers and schedulers that are no longer geographically co-located with the data processing resources. The functions, as microservices, may split into control planes, user and data planes, or even state machines, allowing for independent optimization and scaling techniques to be applied. Such user and data planes may be enabled through increased accelerators, both those residing in server platforms, such as FPGAs and Smart NICs, and through SDN-enabled merchant silicon and programmable ASICs.

The storage systems described above may also be optimized for use in big data analytics. Big data analytics may be generally described as the process of examining large and varied data sets to uncover hidden patterns, unknown correlations, market trends, customer preferences and other useful information that can help organizations make more-informed business decisions. Big data analytics applications enable data scientists, predictive modelers, statisticians and other analytics professionals to analyze growing volumes of structured transaction data, plus other forms of data that are often left untapped by conventional business intelligence (BI) and analytics programs. As part of that process, semi-structured and unstructured data such as, for example, internet clickstream data, web server logs, social media content, text from customer emails and survey responses, mobile-phone call-detail records, IoT sensor data, and other data may be converted to a structured form. Big data analytics is a form of advanced analytics, which involves complex applications with elements such as predictive models, statistical algorithms and what-if analyses powered by high-performance analytics systems.

The storage systems described above may also support (including implementing as a system interface) applications that perform tasks in response to human speech. For example, the storage systems may support the execution intelligent personal assistant applications such as, for example, Amazon's Alexa, Apple Siri, Google Voice, Samsung Bixby, Microsoft Cortana, and others. While the examples described in the previous sentence make use of voice as input, the storage systems described above may also support chatbots, talkbots, chatterbots, or artificial conversational entities or other applications that are configured to conduct a conversation via auditory or textual methods. Likewise, the storage system may actually execute such an application to enable a user such as a system administrator to interact with the storage system via speech. Such applications are generally capable of voice interaction, music playback, making to-do lists, setting alarms, streaming podcasts, playing audiobooks, and providing weather, traffic, and other real time information, such as news, although in embodiments in accordance with the present disclosure, such applications may be utilized as interfaces to various system management operations.

The storage systems described above may also implement AI platforms for delivering on the vision of self-driving storage. Such AI platforms may be configured to deliver global predictive intelligence by collecting and analyzing large amounts of storage system telemetry data points to enable effortless management, analytics and support. In fact, such storage systems may be capable of predicting both capacity and performance, as well as generating intelligent advice on workload deployment, interaction and optimization. Such AI platforms may be configured to scan all incoming storage system telemetry data against a library of issue fingerprints to predict and resolve incidents in real-time, before they impact customer environments, and captures hundreds of variables related to performance that are used to forecast performance load.

The storage systems described above may support the serialized or simultaneous execution artificial intelligence applications, machine learning applications, data analytics applications, data transformations, and other tasks that collectively may form an AI ladder. Such an AI ladder may effectively be formed by combining such elements to form a complete data science pipeline, where exist dependencies between elements of the AI ladder. For example, AI may require that some form of machine learning has taken place, machine learning may require that some form of analytics has taken place, analytics may require that some form of data and information architecting has taken place, and so on. As such, each element may be viewed as a rung in an AI ladder that collectively can form a complete and sophisticated AI solution.

The storage systems described above may also, either alone or in combination with other computing environments, be used to deliver an AI everywhere experience where AI permeates wide and expansive aspects of business and life. For example, AI may play an important role in the delivery of deep learning solutions, deep reinforcement learning solutions, artificial general intelligence solutions, autonomous vehicles, cognitive computing solutions, commercial UAVs or drones, conversational user interfaces, enterprise taxonomies, ontology management solutions, machine learning solutions, smart dust, smart robots, smart workplaces, and many others. The storage systems described above may also, either alone or in combination with other computing environments, be used to deliver a wide range of transparently immersive experiences where technology can introduce transparency between people, businesses, and things. Such transparently immersive experiences may be delivered as augmented reality technologies, connected homes, virtual reality technologies, brain-computer interfaces, human augmentation technologies, nanotube electronics, volumetric displays, 4D printing technologies, or others. The storage systems described above may also, either alone or in combination with other computing environments, be used to support a wide variety of digital platforms. Such digital platforms can include, for example, 5G wireless systems and platforms, digital twin platforms, edge computing platforms, IoT platforms, quantum computing platforms, serverless PaaS, software-defined security, neuromorphic computing platforms, and so on.

Readers will appreciate that some transparently immersive experiences may involve the use of digital twins of various "things" such as people, places, processes, systems, and so on. Such digital twins and other immersive technologies can alter the way that humans interact with technology, as conversational platforms, augmented reality, virtual reality and mixed reality provide a more natural and immersive interaction with the digital world. In fact, digital twins may be linked with the real-world, perhaps even in real-time, to understand the state of a thing or system, respond to changes, and so on. Because digital twins consolidate massive amounts of information on individual assets and groups of assets (even possibly providing control of those assets), digital twins may communicate with each other to digital factory models of multiple linked digital twins.

The storage systems described above may also be part of a multi-cloud environment in which multiple cloud computing and storage services are deployed in a single heterogeneous architecture. In order to facilitate the operation of such a multi-cloud environment, DevOps tools may be deployed to enable orchestration across clouds. Likewise, continuous development and continuous integration tools may be deployed to standardize processes around continuous integration and delivery, new feature rollout and provisioning cloud workloads. By standardizing these processes, a multi-cloud strategy may be implemented that enables the utilization of the best provider for each workload. Furthermore, application monitoring and visibility tools may be deployed to move application workloads around different clouds, identify performance issues, and perform other tasks. In addition, security and compliance tools may be deployed for to ensure compliance with security requirements, government regulations, and so on. Such a multi-cloud environment may also include tools for application delivery and smart workload management to ensure efficient application delivery and help direct workloads across the distributed and heterogeneous infrastructure, as well as tools that ease the deployment and maintenance of packaged and custom applications in the cloud and enable portability amongst clouds. The multi-cloud environment may similarly include tools for data portability.

The storage systems described above may be used as a part of a platform to enable the use of crypto-anchors that may be used to authenticate a product's origins and contents to ensure that it matches a blockchain record associated with the product. Such crypto-anchors may take many forms including, for example, as edible ink, as a mobile sensor, as a microchip, and others. Similarly, as part of a suite of tools to secure data stored on the storage system, the storage systems described above may implement various encryption technologies and schemes, including lattice cryptography. Lattice cryptography can involve constructions of cryptographic primitives that involve lattices, either in the construction itself or in the security proof. Unlike public-key schemes such as the RSA, Diffie-Hellman or Elliptic-Curve cryptosystems, which are easily attacked by a quantum computer, some lattice-based constructions appear to be resistant to attack by both classical and quantum computers.

A quantum computer is a device that performs quantum computing. Quantum computing is computing using quantum-mechanical phenomena, such as superposition and entanglement. Quantum computers differ from traditional computers that are based on transistors, as such traditional computers require that data be encoded into binary digits (bits), each of which is always in one of two definite states (0 or 1). In contrast to traditional computers, quantum computers use quantum bits, which can be in superpositions of states. A quantum computer maintains a sequence of qubits, where a single qubit can represent a one, a zero, or any quantum superposition of those two qubit states. A pair of qubits can be in any quantum superposition of 4 states, and three qubits in any superposition of 8 states. A quantum computer with n qubits can generally be in an arbitrary superposition of up to $2^n$ different states simultaneously, whereas a traditional computer can only be in one of these states at any one time. A quantum Turing machine is a theoretical model of such a computer.

The storage systems described above may also be paired with FPGA-accelerated servers as part of a larger AI or ML infrastructure. Such FPGA-accelerated servers may reside near (e.g., in the same data center) the storage systems described above or even incorporated into an appliance that includes one or more storage systems, one or more FPGA-accelerated servers, networking infrastructure that supports communications between the one or more storage systems and the one or more FPGA-accelerated servers, as well as other hardware and software components. Alternatively, FPGA-accelerated servers may reside within a cloud computing environment that may be used to perform compute-related tasks for AI and ML jobs. Any of the embodiments described above may be used to collectively serve as a FPGA-based AI or ML platform. Readers will appreciate that, in some embodiments of the FPGA-based AI or ML platform, the FPGAs that are contained within the FPGA-accelerated servers may be reconfigured for different types of ML models (e.g., LSTMs, CNNs, GRUs). The ability to reconfigure the FPGAs that are contained within the FPGA-accelerated servers may enable the acceleration of a ML or AI application based on the most optimal numerical precision and memory model being used. Readers will appreciate that by treating the collection of FPGA-accelerated servers as a pool of FPGAs, any CPU in the data center may utilize the pool of FPGAs as a shared hardware microservice, rather than limiting a server to dedicated accelerators plugged into it.

The FPGA-accelerated servers and the GPU-accelerated servers described above may implement a model of computing where, rather than keeping a small amount of data in a CPU and running a long stream of instructions over it as occurred in more traditional computing models, the machine learning model and parameters are pinned into the high-bandwidth on-chip memory with lots of data streaming though the high-bandwidth on-chip memory. FPGAs may even be more efficient than GPUs for this computing model, as the FPGAs can be programmed with only the instructions needed to run this kind of computing model.

The storage systems described above may be configured to provide parallel storage, for example, through the use of a parallel file system such as BeeGFS. Such parallel files systems may include a distributed metadata architecture. For example, the parallel file system may include a plurality of metadata servers across which metadata is distributed, as well as components that include services for clients and storage servers. Through the use of a parallel file system, file contents may be distributed over a plurality of storage servers using striping and metadata may be distributed over a plurality of metadata servers on a directory level, with each server storing a part of the complete file system tree. Readers will appreciate that in some embodiments, the storage servers and metadata servers may run in userspace on top of an existing local file system. Furthermore, dedicated hardware is not required for client services, the metadata servers, or the hardware servers as metadata servers, storage servers, and even the client services may be run on the same machines.

Readers will appreciate that, in part due to the emergence of many of the technologies discussed above including mobile devices, cloud services, social networks, big data analytics, and so on, an information technology platform may be needed to integrate all of these technologies and drive new business opportunities by quickly delivering revenue-generating products, services, and experiences—rather than merely providing the technology to automate internal business processes. Information technology organizations may need to balance resources and investments needed to keep core legacy systems up and running while also integrating technologies to build an information technology platform that can provide the speed and flexibility in areas such as, for example, exploiting big data, managing unstructured data, and working with cloud applications and services. One possible embodiment of such an information technology platform is a composable infrastructure that includes fluid resource pools, such as many of the systems described above that, can meet the changing needs of applications by allowing for the composition and recomposition of blocks of disaggregated compute, storage, and fabric infrastructure. Such a composable infrastructure can also include a single management interface to eliminate complexity and a unified API to discover, search, inventory, configure, provision, update, and diagnose the composable infrastructure.

Figure 4A:
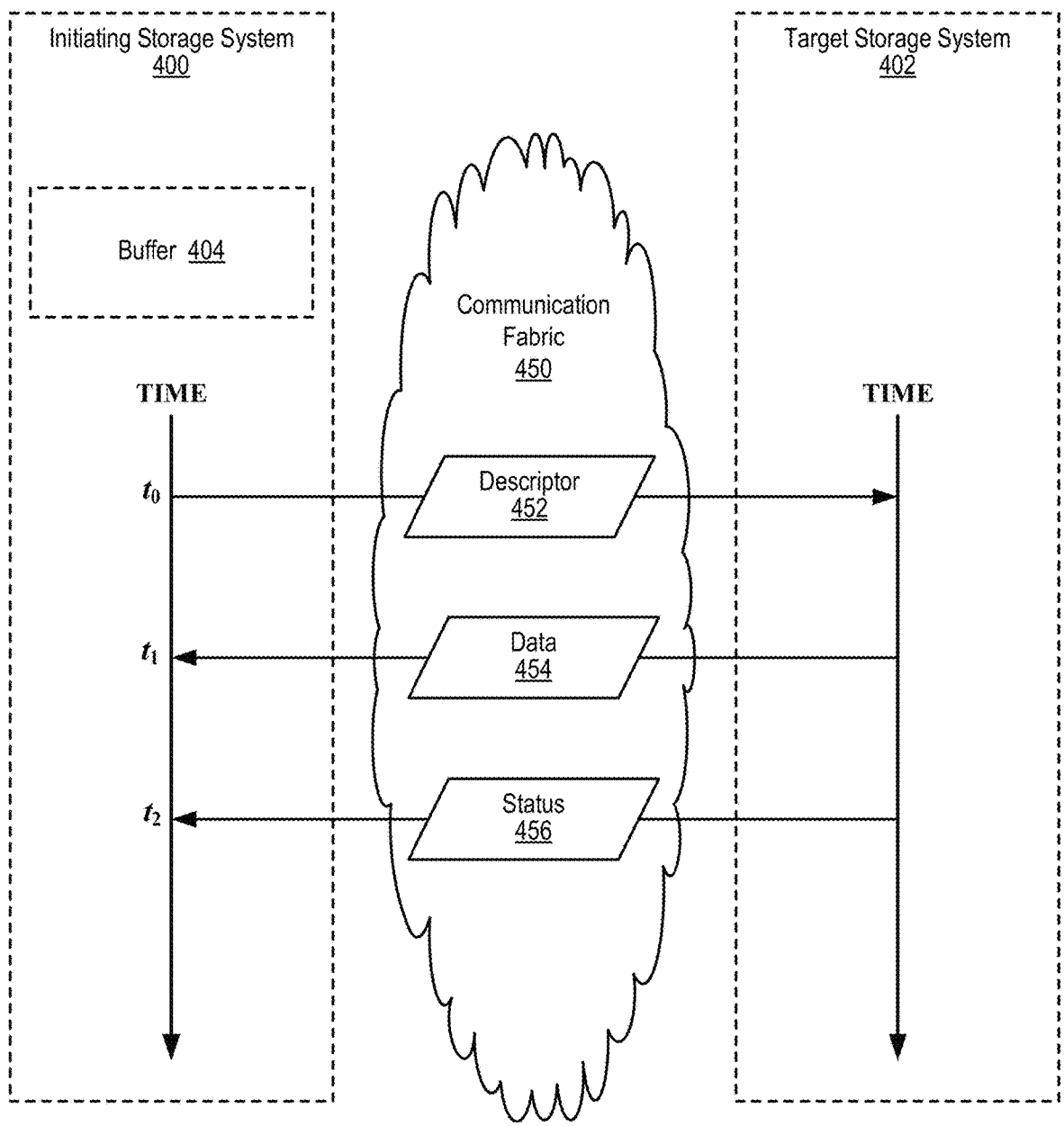
FIG. 4A sets forth a diagram of storage systems in accordance with some embodiments of the present disclosure.

For further explanation, FIG. 4A sets forth a diagram of storage systems (400, 402) implementing layering communication fabric protocols in accordance with some embodiments of the present disclosure. The storage systems (400, 402) may implement data storage features described above with reference to FIGS. 1A-1D, 2A-2G, 3A and 3B as the storage systems (400, 402) may include some or all of the components described above.

In the example networking environment depicted in FIG. 4A, multiple storage systems (400, 402) may be connected over a communication fabric (450) with a given communication latency, where the given communication latency may cause disruptions or unacceptable delays in the responsiveness of the multiple storage systems (400, 402) implementing one or more types of storage system protocols layered on top of the communication fabric (450). While two storage systems (400, 402) are depicted in FIG. 4A for the sake of clarity, in other examples, any number of storage systems may be connected via the communication fabric depicted, one or more other communication fabrics, directly, or via a combination of direct connections and communication fabric(s).

Further, in some examples, the communication fabric (450) may implement one or more communication protocols, such as NVMe over Fibre Channel, among other combinations of communication protocols. In this example, a standard number of messages that are exchanged to perform a given read or write may be defined by NVMe protocol standards and Fibre Channel standards.

In the example computing environment depicted in FIG. 4A, a sender of a message may be a computer system that is sending messages associated with a given communication protocol from one computer system to another computer system, where the given communication protocol is layered atop a storage command protocol, such as NVMe over FibreChannel. In this example, a receiver of messages may be a system that is receiving messages from the sender, where the messages are associated with the given communication protocol that is layered over the storage command protocol. Further in this example, an initiator, or initiating computer system, may initiate the storage commands that are being layered on top of the given communication protocol, and a target, or target computer system, may operate as a recipient of messages from the initiating computer system. In the case where the given communication protocol is an NVMe read command, or read-type command, the messages sender may be the storage command protocol target, and the message receiver may be the storage command protocol initiator. Further, in this example, the first part of the message exchange may be that the initiator/receiver allocates resources and initiates a storage command protocol, where subsequent message exchanges may be deliveries of data transfers and status messages from the sender/target to the receiver/initiator. In the case where the given communication protocol is a multi-phase NVMe write command, or write-type command, the sender may be the storage command protocol initiator and the receiver may be the storage command protocol target. Further, in this example, a receiver may allocate resources in response to receiving the storage protocol command and may send back a ready-to-receive indication, where the ready-to-receive indication may result in layered protocol messages being sent as a data transfer. Further, in this example, and subsequent to the data transfer, the target may send a completion status message to the initiator—however, higher level layer, such as an operating system layer or user interface, may not wait for the completion status message unless there may be some effect on freeing resources for subsequent command initiations. In short, in some implementations, a goal is for a sending computer system to receive an indication of some number of storage protocol commands that are available for sending higher-layer messages in advance of actually having such messages to send—where the number of such storage protocol commands and the total capacity for transferring higher-layer messages may account for, or depend upon, available bandwidth and latency associated with one or more network links between a sending computer system and a receiving computer system.

In some embodiments, given two different communication protocols at two different layers, a higher level protocol may implement a distributed storage system, such as a distributed storage system that synchronously replicates a dataset between one storage system at one location and another storage system at another location. In this example, storage systems synchronously replicating a dataset may be implemented to minimize a number of trips across a network link between storage systems in order to reduce an impact that distance between the storage system locations may have on network latency for storage system operations. For example, by minimizing the number of trips over a network link for storage command protocol implementations, the storage command protocol may become responsive enough to satisfy performance requirements or quality of service terms that may otherwise not be able to be satisfied. Consequently, a protocol such as Fibre Channel may be used between storage systems operating over moderate or long distances to synchronously replicate a dataset that may require specific response times between storage systems. In this way, an implementation may build a higher layer protocol on top of a data transfer port of the NVMe command exchanges, and have any remaining NVMe command processing be completed prior to data to transfer being available or to occur after we have transferred the data. In short, by readying some number of outstanding NVMe commands in advance, a higher layer protocol may then simply transfer data over an available NVMe command that is known to be in a ready-to-transfer state, such as the open exchanges described below.

In some implementations, one example of such a layering of protocols is to perform a first part of an NVMe write command in advance so that some number of write commands may be in the ready-to-transfer state when higher-layer protocols are ready to send a message between storage systems over an NVMe over Fibre Channel link. In this case, a write command and the ready-to-transfer messages may be set up in advance of a data transfer, and the data transfer may send data when there is data to be transferred. In this example, a follow-up completion status message may be sent from a receiving storage system to a sending storage system may be unnecessary or irrelevant except in that it may be used to clean up NVMe driver or hardware resources; however, the completion status message may have no significant effect on latency for a higher-level protocol.

In some implementations, another example of such layering of protocols is to reverse the operation described in the previous paragraph, where instead of performing a write command from a sending storage system to a receiving storage system, a read command is performed from the receiving storage system to the sending storage system. In this case, a read command may occur outside of (and prior to) a higher-layer protocol having messages ready to be sent. Further, in this example, when a sending storage system receives a read command, that read command may be in the ready-to-transfer state and a data transfer may occur when the sending storage system has data ready to transfer. Continuing with this example, as with the write commands, there may also be an NVMe read command completion status message that is sent, which a higher-layer may ignore even though it may not add to latency. Further, as with the NVMe write command, the completion status message may be used to clean up NVMe driver or hardware resources.

In this way, in some implementations of layering communication fabric protocols, the NVMe standard may be used to implement commands that use fewer messages than specified by the NVMe standard—where such a reduction in message exchanges may be based on using a first type of command within the NVMe standard to prepare for a second type of command, which reduces the number of message exchanges needed to perform the second type of command. In other words, an NVMe command to send data may be replaced by a set of outstanding, but simpler or requiring fewer exchanged messages, NVMe commands to receive data, where the command to receive data may be initiated by a receiver in advance of a sender having data to send, and the sender may then respond to one of these data commands when there is data available to send to the receiver. In this way, preparation work or resources may be performed or allocated by using parts of the NVMe protocol that are designed to do work, but do that work in advance prior to when the actual work is needed. Consequently, in this example, a quantity of messages exchanged at the NVMe level is less important so long as subsystem-to-subsystem message may be sent with one, or fewer than specified by a standard, latency delay across a network—thereby enabling higher-level software that may operation with single round trips for their own operation (send data and get a response, request data and get a response) without concern for the latency impact from the NVMe protocol. In some implementations that include using NVMe over Fibre Channel, there may be a requirement to ensure that a higher layer protocol may send messages in both directions, which may be accomplished by using NVMe write operations for one direction and NVMe read operations for the other direction—or each side of the protocol may operate as both an NVMe initiator and an NVMe target.

Such a reduction in exchanged messages to perform a command may overcome the use of NVMe within a networking environment that is characterized by temporary or persistent latencies that would otherwise prevent an implementation of NVMe using a defined number of message exchanges in accordance with the NVMe standard. For example, based on the reduced message exchanges to perform a particular command—where the particular command would otherwise use more message exchanges in accordance with a standard implementation of NVMe—the NVMe protocol may serve as a basis for implementing commands that avoid latencies due to exchanging additional commands.

For example, some implementations may use long-running open exchanges with open buffer space for transporting unsolicited messages. In one example, an outstanding read may be used for preparing for a subsequent, unsolicited data transfer, where a first storage system may issue a read command to a second storage system, where issuance of the read command causes an allocation of buffer space on the first storage system—where the second storage system does not respond to the read, thereby leaving the read command outstanding—and when the second storage system is ready to initiate a data transfer, such as for a write command, the second storage system may begin sending data without notifying the first storage system that the second storage system intends to issue the write command because the first storage system already has a buffer allocated to receive data. In some examples, the storage systems may use a portion of the opcode for a standard implementation of NVMe, or some other standard protocol, to indicate whether or not an initiating command is intended to be responded to or whether the initiating command is intended to create an open exchange without a response to the initiating command.

While this example makes use of a read command issued by a first storage system to allocate a buffer in preparation for a subsequent write command by a second storage system, in other examples, a type of command other than a read command may be used as a basis for opening a long-running exchange that also serves to allocate resources on the first storage system for preparing for a subsequent, second type of command from the second storage system—without the second storage system sending an initial message to prepare the first storage system for the second type of command.

Such a use of a standard protocol may result in an implementation that enables commands to be perform with fewer messages exchanged in comparison to a standard protocol implementation.

Further, the creation of a long-running, open exchange between storage systems, and the use of existing communication protocols to serve as a trigger or basis for preparing for subsequently issued commands—which also serves to reduce message exchanges to perform the subsequent command—may be considered one of the implementations of techniques by which storage systems may layer on additional meaning and actions, in other words, a protocol, on top of an existing communication protocol.

In short, in some embodiments, a technical effect is an optimized transport protocol that is layered on top of one or more existing communication protocols by, in part, re-interpreting or re-defining the standard behavior of the underlying communication protocol. As discussed above, an embodiment of the optimized transport protocol may be layered on top of NVMe, where NVMe is layered on top of Fibre Channel—where different implementations of the optimized transport protocol may be layered on top of different standard communication protocols. In this way, a communication protocol that is otherwise impractical or inefficient beyond an acceptable user threshold due to long-distance communications or high network latencies, may serve as a basis for an optimized transport protocol that is acceptable within user thresholds due to reducing a number of standard communication protocol messages in implementing one or more commands.

As another example, with reference to FIG. 4A, and with regard to an implementation of Fibre Channel as a communication fabric (450), an optimized transport protocol may be implemented such that each storage system (400, 402) at each side of a communication link may allocate one or more receive buffers and open an exchange for each allocated buffer by sending a descriptor to a storage system across a communication link. Further, in this example, because there is no required time limit for how long an exchange may remain open, each allocated buffer may remain ready for as long as needed, including until data is received. In this way, when a storage system is ready to send a message to another storage system, the sending storage system may select an open exchange and completes the exchange by sending data and/or status. Such an implementation enables sending an unsolicited message, and when the exchange completes after the data is transferred, the receiving storage system of the data may send a new descriptor to re-open an exchange, where the receiving storage system also allocates another buffer to correspond to the new descriptor and the open exchange.

Continuing with this example, and with continued reference to FIG. 4A within the context of NVMe over Fibre Channel, an initiating storage system (400) may initiate an open exchange by sending a command descriptor (452) to a target storage system (402)—and correspondingly create a buffer (404) on the initiating storage system (400) to receive data from a subsequent command from the target storage system (402) transferring data by making use of the open exchange. For example, the command descriptor (452) may be an NVMe SQE (submission queue entry) message using a Fibre Chanel IU (information unit). In this example, either storage system (400, 402) may allocate one or more receive buffers and use the open exchange to transfer data, where for a command transferring data from the initiating storage system (400) to a target storage system (402), the target storage system (402) may send a ready command (e.g.

XFER_RDY) and wait for the initiating storage system (400) to send data, and where a command transferring data (454) from the target storage system (402) to the initiating storage system (400), the target storage system (402) may, given the open exchange, transfer the data (454) to the initiating storage system (400), and the target storage system (402) may send a status message (456) (e.g. NVMe CQE "completion queue entry") to the initiating storage system (400).

In this way, in this example, commands that transfer data from a target storage system (402) back to the initiating storage system (400), minimize transmit time and because of the minimized transit time, may be a suitable implementation of NVMe over a WAN (wide-area network), which may include both NVMe commands, in addition to any commands implemented by the storage systems (400, 402). In short, as discussed above, to have a buffer already allocated on the initiating storage system (400) prior to the target storage system (402) transferring data to the initiating storage system (400), the initiating storage system (400) may issue a read command, or a similar command that results in the creating of a buffer on the initiating storage system (400), to the target storage system (402) prior to the point in time where the target storage system (402) attempts a data transfer to the initiating storage system (400)—for example, as part of a process to replicate data from the target storage system (402) to the initiating storage system (400).

In some implementations, the storage systems (400, 402) may implement multiple types of storage system protocols, including synchronous replication of data, as described in U.S. patent application Ser. Nos. 15/842,850 and 16/050, 698, which are herein incorporated in their entirety for all purposes. Further, in this example, performance characteristics of synchronous replication of data may be dependent upon quality of service commitments or other specified response times—where if the given communication latency within the communication fabric (450) is below a particular threshold that enables the multiple storage systems to satisfy quality of service terms, then a storage controller of one or more of the storage systems (400, 402) may determine that no layering is to be performed. Otherwise, if a storage controller of one or more of the storage systems (400, 402) determines that the given communication latency within the communication fabric (450) is above the particular threshold, then the multiple storage systems may initiate a layering protocol on top of the communication protocol of the communication fabric (450) to reduce a number of messages that may otherwise be needed to implement a given communication protocol between the multiple storage systems.

In some examples, NVMe over Fibre Channel may support a "first burst" variation of an NVMe write operation, where a data transfer is inline with, or immediately follows, the NVMe write operation. However, such a use case may not be reliable because an NVMe initiator may not be aware of whether there are sufficient resources available to receive the data transfer, and consequently, in such a case, an NVMe controller on the receiver side may reject the data transfer, which results in a multi-phase write operation instead of an inline data transfer. To work around this limitation, in some implementations, a higher-layer protocol may use a credit scheme to negotiate how many resources are available for a particular network link, which enables an initiator to be assured that a particular quantity—in dependence upon the credit scheme allowance of credits—of NVMe write first burst data transfers that have been initiated may be reliably received. In this example, using the credit scheme, a receiver (in this case, the NVMe target) provides an available resources count to a sender (in this case, the NVMe initiator), where the resource count is likely a number of allowed concurrent commands and a limit on a total allowed concurrent data transfers. Continuing with this example, as the initiator begins operations, the initiator counts down the resources until some number falls below a threshold (such as zero), at which point, in response, sending may stop. Further in this example, as the target receives, processes, and releases the resources consumed by receiving and processing these NVMe write commands for these data transfers, resources become available, and messages are sent back to the initiator to increase the number of available resources. As these messages are received by the initiator, the resource count is increased, and the increased resource count enables further NVMe write commands and data transfers to be reliably initiated. In other words, given a sufficient resource count held by an initiator, the initiator may determine that an inline data transfer will be reliably received—where the initiator has a resource count decreased as data transfers are performed and increased as a receiver provides an increase to the initiator of more credits, or resource counts due to the receiver having additional resources to use for data transfers.

For further explanation, FIG. 4B sets forth a flow chart illustrating an example method of layering communication protocols between one or more storage systems (400, 402) according to some embodiments of the present disclosure. Although depicted in less detail, the storage systems (400, 402) depicted in FIG. 4B may be similar to the storage systems described above with reference to FIGS. 1A-ID, FIGS. 2A-2G, FIGS. 3A-3C, FIG. 4A, or any combination thereof. Further, the storage systems (400, 402) depicted in FIG. 4B may include the same, fewer, or additional components as the storage systems described above.

The example method depicted in FIG. 4B includes: allocating (410) storage resources (460) on an initiating (400) storage system for a data transfer, where a command protocol to implement the data transfer specifies an exchange of multiple messages; receiving (412), from a target storage system (402) and into the allocated storage resources (460) at the initiating storage system (400), data (470) within a single message (462) corresponding to the command protocol that specifies an exchange of multiple messages to implement the data transfer; and in response to receiving (412) the data (470) within the single message (462) corresponding to the command protocol that specifies an exchange of multiple messages to implement the data transfer, generate a status message (464) indicating receipt of the data (470).

Allocating (410) storage resources (460) on the initiating storage system (400) for the data transfer may be implemented by a controller on the initiating storage system (400) allocating one or more memory buffers for receiving data that corresponds to an open exchange between the initiating storage system (400) and the target storage system (402), as described in greater detail above with regard to FIG. 4A.

Receiving (412), from the target storage system (400) and into the allocated storage resource (460) at the initiating storage system (400), data (470) within a single message (462) corresponding to the command protocol that specifies an exchange of multiple messages to implement the data transfer may be implemented as described above with regard to FIG. 4A with respect to an initiating storage system (400) receiving data (454) into a memory buffer (404) from a data transfer from a target storage system (402).

Generating (414)—in response to receiving (412) the data (470) within the single message (462) corresponding to the command protocol that specifies an exchange of multiple messages to implement the data transfer—a status message (464) indicating receipt of the data (470) may be implemented as described above with regard to FIG. 4A with respect to generating a status (456) message.

Figure 5:
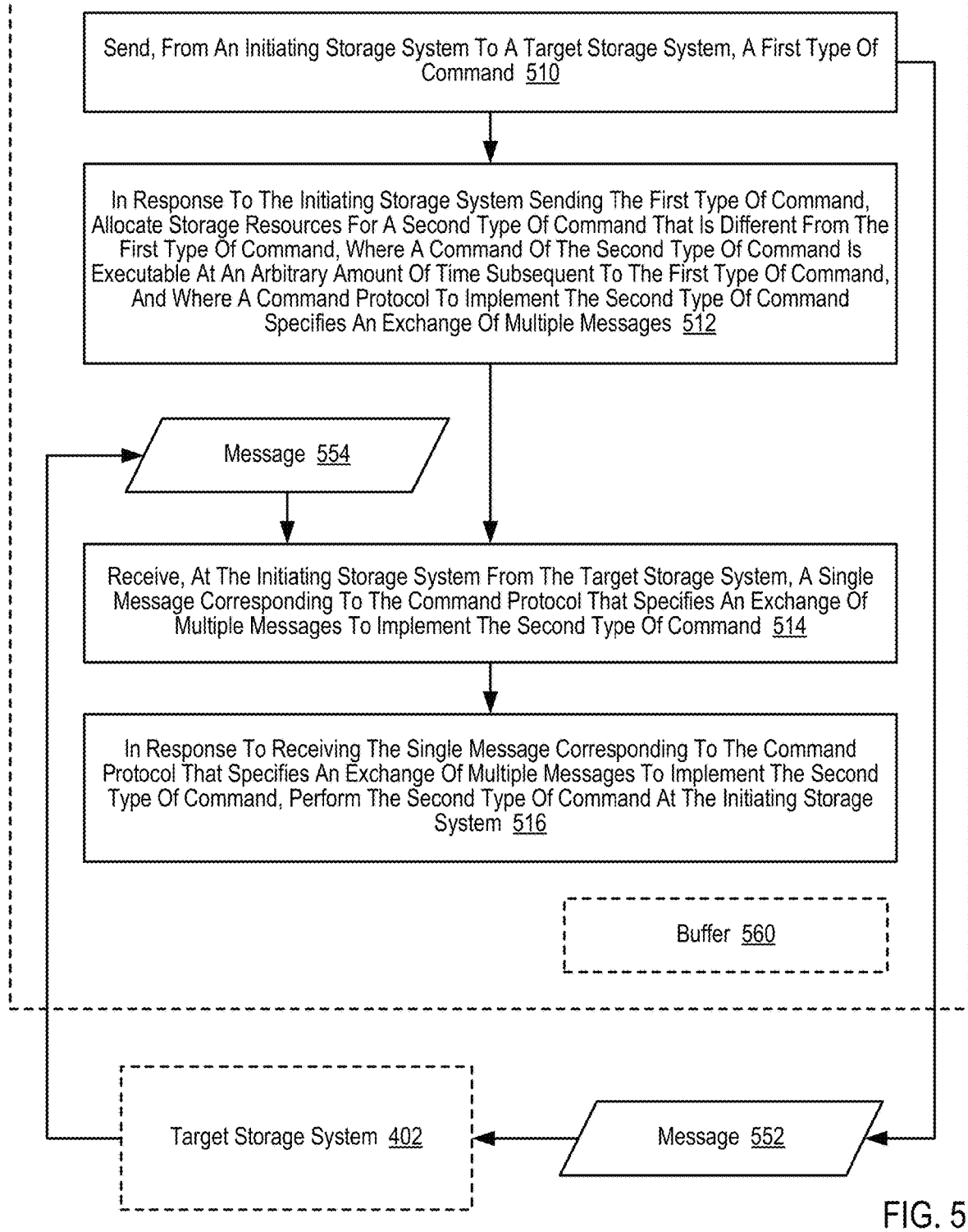
FIG. 5 sets forth a flow chart illustrating an example method of layering communication protocols in accordance with some embodiments of the present disclosure.

For further explanation, FIG. 5 sets forth a flow chart illustrating an example method of layering communication protocols between one or more storage systems (400, 402) according to some embodiments of the present disclosure. Although depicted in less detail, the storage systems (400, 402) depicted in FIG. 5 may be similar to the storage systems described above with reference to FIGS. 1A-1D, FIGS. 2A-2G, FIGS. 3A-3C, FIGS. 4A and 4B, or any combination thereof. Further, the storage systems (400, 402) depicted in FIG. 5 may include the same, fewer, or additional components as the storage systems described above.

The example method depicted in FIG. 5 includes sending (510), from an initiating storage system (400) to a target storage system (402), a first type of command (552). Sending (510), from the initiating storage system (400) to the target storage system (402), the first type of command (552) may be implemented by, as described above with reference to FIG. 4A, creating an open exchange by sending a command descriptor such as an NVMe SQE (submission queue entry) message using a Fibre Channel IU (information unit). In this example, these messages may be transmitted over a host bus adapter configured to support multiple communication protocols, including NVMe, Fibre Channel, and others described above with regard to FIGS. 1A-1D and 2A-2G. Further, in some examples, multiple exchanges may be initiated, and may be kept open simultaneously.

The example method depicted in FIG. 5 also includes, in response to the initiating storage system (400) sending (510) the first type of command (552), allocating (512) storage resources (560) for a second type of command that is different from the first type of command, where a command of the second type of command is executable at an arbitrary amount of time subsequent to the first type of command, and where a command protocol to implement the second type of command specifies an exchange of multiple messages. Allocating (512) the storage resources (560) for the second type of command may be implemented by, as described above with reference to FIG. 4, creating a buffer (560) with enough storage capacity for receiving data corresponding to the second type of command. In some examples, the size of the buffer may be dependent upon one or more factors, including communication link bandwidth, communication protocol payload specifications, or network latencies. Further, in some examples, the size of the buffer, or in some cases, multiple buffers, may be determined to be equal or greater than a quantity of data that may be in transit at a given time between the initiating storage system (400) and the target storage system (402), or equal or greater than multiples of the quantity of data that may be in transit at a given time between the initiating storage system (400) and the target storage system (402).

The example method depicted in FIG. 5 also includes receiving (514), at the initiating storage system (400) from the target storage system (402), a single message (554) corresponding to the command protocol that specifies an exchange of multiple messages to implement the second type of command. Receiving (514), at the initiating storage system (400) from the target storage system (402), the single message (554) corresponding to the command protocol that specifies the exchange of multiple messages to implement the second type of command may be implemented by a controller for the initiating storage system (400) handling an incoming message over a host bus adapter connected to a communication fabric (not depicted for clarity) or connected directly linking the target storage system (402) and the initiating storage system (400). For example, as discussed above with reference to FIGS. 4A and 4B, the single message (554) may be a message that includes data (454) and corresponds to a write operation.

The example method depicted in FIG. 5 also includes, in response to receiving the single message (554) corresponding to the command protocol that specifies the exchange of multiple messages to implement the second type of command, performing (516) the second type of command at the initiating storage system (400). Performing (516) the second type of command at the initiating storage system (400) may be implemented by the initiating storage system (400) determining that the data received in the message (554) corresponds to the previously opened exchange and to the corresponding storage buffer (560), and in response to this determination, storing the received data in the buffer (560), thereby performing the write operation. As discussed above, the second type of command, the write operation in this example, may be performed after receiving the single message (554) without receiving all messages that are specified by a standard implementation of an NVMe write operation. However, the first type of command and the second type of command may be considered to be disconnected to the extent that subsequent to the first type of command being issued, there is no expectation or period of time within which the second type of command needs to be received for proper functionality. In other words, the open exchange created by the first type of command may remain open indeterminably prior to a data transfer.

Figure 6A:
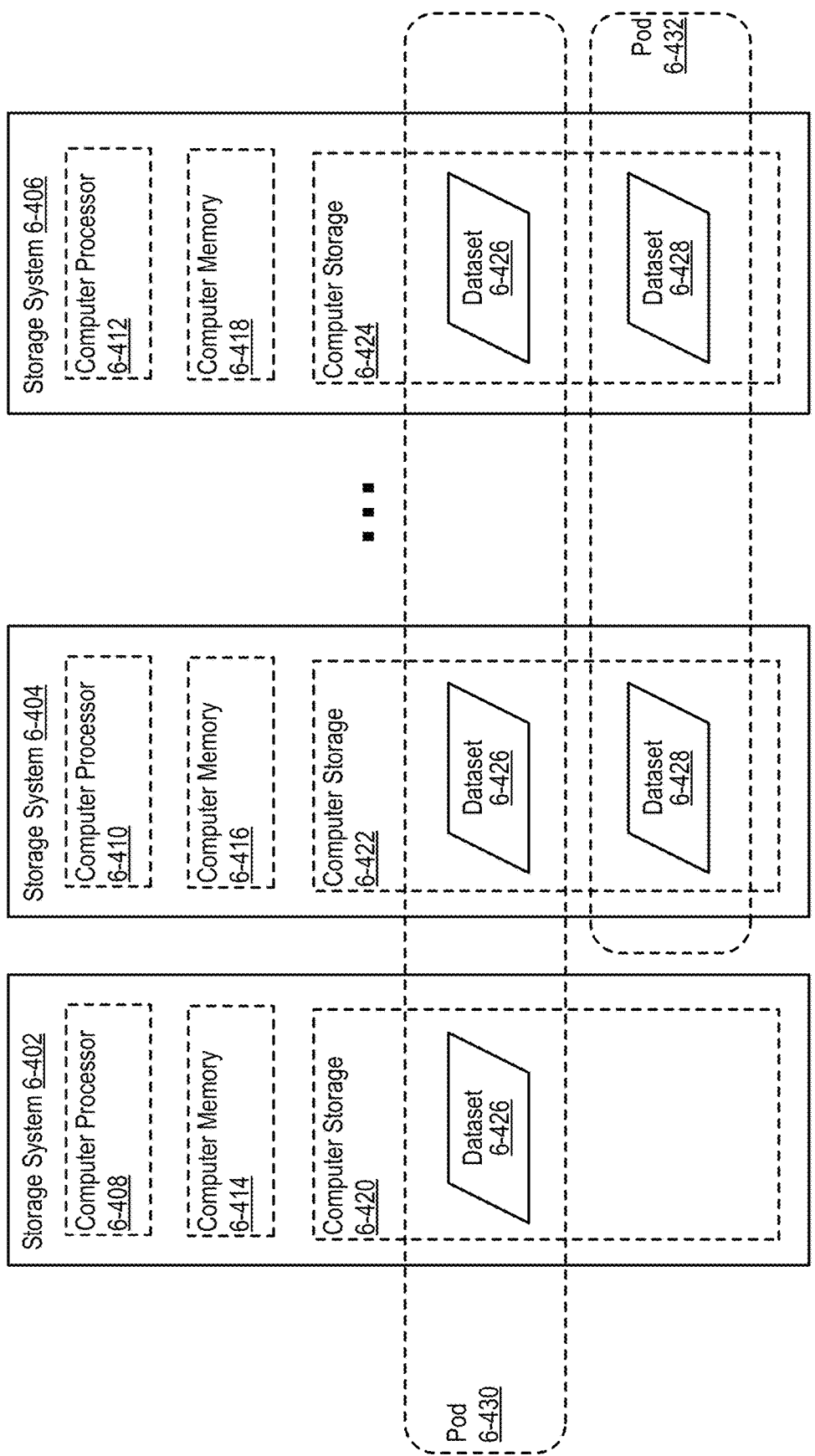
FIGS. 6A-6C sets forth diagrams and a flow chart illustrating an example method of synchronous replication of data among multiple storage systems in accordance with some embodiments of the present disclosure.

For further explanation, FIG. 6 sets forth a block diagram illustrating a plurality of storage systems (6-402, 6-404, 6-406) that support a pod according to some embodiments of the present disclosure. Although depicted in less detail, the storage systems (6-402, 6-404, 6-406) depicted in FIG. 6A may be similar to the storage systems described above with reference to FIGS. 1A-1D, FIGS. 2A-2G, FIGS. 3A-3B, or any combination thereof. In fact, the storage systems (6-402, 6-404, 6-406) depicted in FIG. 6A may include the same, fewer, or additional components as the storage systems described above.

In the example depicted in FIG. 6A, each of the storage systems (6-402, 6-404, 6-406) is depicted as having at least one computer processor (6-408, 6-410, 6-412), computer memory (6-414, 6-416, 6-418), and computer storage (6-420, 6-422, 6-424). Although in some embodiments the computer memory (6-414, 6-416, 6-418) and the computer storage (6-420, 6-422, 6-424) may be part of the same hardware devices, in other embodiments the computer memory (6-414, 6-416, 6-418) and the computer storage (6-420, 6-422, 6-424) may be part of different hardware devices. The distinction between the computer memory (6-414, 6-416, 6-418) and the computer storage (6-420, 6-422, 6-424) in this particular example may be that the computer memory (6-414, 6-416, 6-418) is physically proximate to the computer processors (6-408, 6-410, 6-412) and may store computer program instructions that are executed by the computer processors (6-408, 6-410, 6-412), while the computer storage (6-420, 6-422, 6-424) is embodied as non-volatile storage for storing user data, metadata describing the user data, and so on. Referring to the example above in FIG. 1A, for example, the computer processors (6-408, 6-410, 6-412) and computer memory (6-414, 6-416, 6-418) for a particular storage system (6-402, 6-404, 6-406) may reside within one of more of the controllers (110A-110D) while the attached storage devices (171A-171F) may serve as the computer storage (6-420, 6-422, 6-424) within a particular storage system (6-402, 6-404, 6-406).

In the example depicted in FIG. 6A, the depicted storage systems (6-402, 6-404, 6-406) may attach to one or more pods (6-430, 6-432) according to some embodiments of the present disclosure. Each of the pods (6-430, 6-432) depicted in FIG. 6A can include a dataset (6-426, 6-428). For example, a first pod (6-430) that three storage systems (6-402, 6-404, 6-406) have attached to includes a first dataset (6-426) while a second pod (6-432) that two storage systems (6-404, 6-406) have attached to includes a second dataset (6-428). In such an example, when a particular storage system attaches to a pod, the pod's dataset is copied to the particular storage system and then kept up to date as the dataset is modified. Storage systems can be removed from a pod, resulting in the dataset being no longer kept up to date on the removed storage system. In the example depicted in FIG. 6A, any storage system which is active for a pod (it is an up-to-date, operating, non-faulted member of a non-faulted pod) can receive and process requests to modify or read the pod's dataset.

In the example depicted in FIG. 6A, each pod (6-430, 6-432) may also include a set of managed objects and management operations, as well as a set of access operations to modify or read the dataset (6-426, 6-428) that is associated with the particular pod (6-430, 6-432). In such an example, the management operations may modify or query managed objects equivalently through any of the storage systems. Likewise, access operations to read or modify the dataset may operate equivalently through any of the storage systems. In such an example, while each storage system stores a separate copy of the dataset as a proper subset of the datasets stored and advertised for use by the storage system, the operations to modify managed objects or the dataset performed and completed through any one storage system are reflected in subsequent management objects to query the pod or subsequent access operations to read the dataset.

Readers will appreciate that pods may implement more capabilities than just a clustered synchronously replicated dataset. For example, pods can be used to implement tenants, whereby datasets are in some way securely isolated from each other. Pods can also be used to implement virtual arrays or virtual storage systems where each pod is presented as a unique storage entity on a network (e.g., a Storage Area Network, or Internet Protocol network) with separate addresses. In the case of a multi-storage-system pod implementing a virtual storage system, all physical storage systems associated with the pod may present themselves as in some way the same storage system (e.g., as if the multiple physical storage systems were no different than multiple network ports into a single storage system).

Readers will appreciate that pods may also be units of administration, representing a collection of volumes, file systems, object/analytic stores, snapshots, and other administrative entities, where making administrative changes (e.g., name changes, property changes, managing exports or permissions for some part of the pod's dataset), on any one storage system is automatically reflected to all active storage systems associated with the pod. In addition, pods could also be units of data collection and data analysis, where performance and capacity metrics are presented in ways that aggregate across all active storage systems for the pod, or that call out data collection and analysis separately for each pod, or perhaps presenting each attached storage system's contribution to the incoming content and performance for each a pod.

One model for pod membership may be defined as a list of storage systems, and a subset of that list where storage systems are considered to be in-sync for the pod. A storage system may be considered to be in-sync for a pod if it is at least within a recovery of having identical idle content for the last written copy of the dataset associated with the pod. Idle content is the content after any in-progress modifications have completed with no processing of new modifications. Sometimes this is referred to as "crash recoverable" consistency. Recovery of a pod carries out the process of reconciling differences in applying concurrent updates to in-sync storage systems in the pod. Recovery can resolve any inconsistencies between storage systems in the completion of concurrent modifications that had been requested to various members of the pod but that were not signaled to any requestor as having completed successfully. Storage systems that are listed as pod members but that are not listed as in-sync for the pod can be described as "detached" from the pod. Storage systems that are listed as pod members, are in-sync for the pod, and are currently available for actively serving data for the pod are "online" for the pod.

Each storage system member of a pod may have its own copy of the membership, including which storage systems it last knew were in-sync, and which storage systems it last knew comprised the entire set of pod members. To be online for a pod, a storage system must consider itself to be in-sync for the pod and must be communicating with all other storage systems it considers to be in-sync for the pod. If a storage system can't be certain that it is in-sync and communicating with all other storage systems that are in-sync, then it must stop processing new incoming requests for the pod (or must complete them with an error or exception) until it can be certain that it is in-sync and communicating with all other storage systems that are in-sync. A first storage system may conclude that a second paired storage system should be detached, which will allow the first storage system to continue since it is now in-sync with all storage systems now in the list. But, the second storage system must be prevented from concluding, alternatively, that the first storage system should be detached and with the second storage system continuing operation. This would result in a "split brain" condition that can lead to irreconcilable datasets, dataset corruption, or application corruption, among other dangers.

The situation of needing to determine how to proceed when not communicating with paired storage systems can arise while a storage system is running normally and then notices lost communications, while it is currently recovering from some previous fault, while it is rebooting or resuming from a temporary power loss or recovered communication outage, while it is switching operations from one set of storage system controllers to another set for whatever reason, or during or after any combination of these or other kinds of events. In fact, any time a storage system that is associated with a pod can't communicate with all known non-detached members, the storage system can either wait briefly until communications can be established, go offline and continue waiting, or it can determine through some means that it is safe to detach the non-communicating storage system without risk of incurring a split brain due to the non-communicating storage system concluding the alternative view, and then continue. If a safe detach can happen quickly enough, the storage system can remain online for the pod with little more than a short delay and with no resulting application outages for applications that can issue requests to the remaining online storage systems.

One example of this situation is when a storage system may know that it is out-of-date. That can happen, for example, when a first storage system is first added to a pod that is already associated with one or more storage systems, or when a first storage system reconnects to another storage system and finds that the other storage system had already marked the first storage system as detached. In this case, this first storage system will simply wait until it connects to some other set of storage systems that are in-sync for the pod.

This model demands some degree of consideration for how storage systems are added to or removed from pods or from the in-sync pod members list. Since each storage system will have its own copy of the list, and since two independent storage systems can't update their local copy at exactly the same time, and since the local copy is all that is available on a reboot or in various fault scenarios, care must be taken to ensure that transient inconsistencies don't cause problems. For example, if one storage systems is in-sync for a pod and a second storage system is added, then if the second storage system is updated to list both storage systems as in-sync first, then if there is a fault and a restart of both storage systems, the second might startup and wait to connect to the first storage system while the first might be unaware that it should or could wait for the second storage system. If the second storage system then responds to an inability to connect with the first storage system by going through a process to detach it, then it might succeed in completing a process that the first storage system is unaware of, resulting in a split brain. As such, it may be necessary to ensure that storage systems won't disagree inappropriately on whether they might opt to go through a detach process if they aren't communicating.

One way to ensure that storage systems won't disagree inappropriately on whether they might opt to go through a detach process if they aren't communicating is to ensure that when adding a new storage system to the in-sync member list for a pod, the new storage system first stores that it is a detached member (and perhaps that it is being added as an in-sync member). Then, the existing in-sync storage systems can locally store that the new storage system is an in-sync pod member before the new storage system locally stores that same fact. If there is a set of reboots or network outages prior to the new storage system storing its in-sync status, then the original storage systems may detach the new storage system due to non-communication, but the new storage system will wait. A reverse version of this change might be needed for removing a communicating storage system from a pod: first the storage system being removed stores that it is no longer in-sync, then the storage systems that will remain store that the storage system being removed is no longer in-sync, then all storage systems delete the storage system being removed from their pod membership lists. Depending on the implementation, an intermediate persisted detached state may not be necessary. Whether or not care is required in local copies of membership lists may depend on the model storage systems use for monitoring each other or for validating their membership. If a consensus model is used for both, or if an external system (or an external distributed or clustered system) is used to store and validate pod membership, then inconsistencies in locally stored membership lists may not matter.

When communications fail or one or several storage systems in a pod fail, or when a storage system starts up (or fails over to a secondary controller) and can't communicate with paired storage systems for a pod, and it is time for one or more storage systems to decide to detach one or more paired storage systems, some algorithm or mechanism must be employed to decide that it is safe to do so and to follow through on the detach. One means of resolving detaches is use a majority (or quorum) model for membership. With three storage systems, as long as two are communicating, they can agree to detach a third storage system that isn't communicating, but that third storage system cannot by itself choose to detach either of the other two. Confusion can arise when storage system communication is inconsistent. For example, storage system A might be communicating with storage system B but not C, while storage system B might be communicating with both A and C. So, A and B could detach C, or B and C could detach A, but more communication between pod members may be needed to figure this out.

Care needs to be taken in a quorum membership model when adding and removing storage systems. For example, if a fourth storage system is added, then a "majority" of storage systems is at that point three. The transition from three storage systems (with two required for majority) to a pod including a fourth storage system (with three required for majority) may require something similar to the model described previously for carefully adding a storage system to the in-sync list. For example, the fourth storage system might start in an attaching state but not yet attached where it would never instigate a vote over quorum. Once in that state, the original three pod members could each be updated to be aware of the fourth member and the new requirement for a three storage system majority to detach a fourth. Removing a storage system from a pod might similarly move that storage system to a locally stored "detaching" state before updating other pod members. A variant scheme for this is to use a distributed consensus mechanism such as PAXOS or RAFT to implement any membership changes or to process detach requests.

Another means of managing membership transitions is to use an external system that is outside of the storage systems themselves to handle pod membership. In order to become online for a pod, a storage system must first contact the external pod membership system to verify that it is in-sync for the pod. Any storage system that is online for a pod should then remain in communication with the pod membership system and should wait or go offline if it loses communication. An external pod membership manager could be implemented as a highly available cluster using various cluster tools, such as Oracle RAC, Linux HA, VERITAS Cluster Server, IBM's HACMP, or others. An external pod membership manager could also use distributed configuration tools such as Etcd or Zookeeper, or a reliable distributed database such as Amazon's DynamoDB.

In the example depicted in FIG. 6A, the depicted storage systems (6-402, 6-404, 6-406) may receive a request to read a portion of the dataset (6-426, 6-428) and process the request to read the portion of the dataset locally according to some embodiments of the present disclosure. Readers will appreciate that although requests to modify (e.g., a write operation) the dataset (6-426, 6-428) require coordination between the storage systems (6-402, 6-404, 6-406) in a pod, as the dataset (6-426, 6-428) should be consistent across all storage systems (6-402, 6-404, 6-406) in a pod, responding to a request to read a portion of the dataset (6-426, 6-428) does not require similar coordination between the storage systems (6-402, 6-404, 6-406). As such, a particular storage system that receives a read request may service the read request locally by reading a portion of the dataset (6-426, 6-428) that is stored within the storage system's storage devices, with no synchronous communication with other storage systems in the pod. Read requests received by one storage system for a replicated dataset in a replicated cluster are expected to avoid any communication in the vast majority of cases, at least when received by a storage system that is running within a cluster that is also running nominally. Such reads should normally be processed simply by reading from the local copy of a clustered dataset with no further interaction required with other storage systems in the cluster Readers will appreciate that the storage systems may take steps to ensure read consistency such that a read request will return the same result regardless of which storage system processes the read request. For example, the resulting clustered dataset content for any set of updates received by any set of storage systems in the cluster should be consistent across the cluster, at least at any time updates are idle (all previous modifying operations have been indicated as complete and no new update requests have been received and processed in any way). More specifically, the instances of a clustered dataset across a set of storage systems can differ only as a result of updates that have not yet completed. This means, for example, that any two write requests which overlap in their volume block range, or any combination of a write request and an overlapping snapshot, compare-and-write, or virtual block range copy, must yield a consistent result on all copies of the dataset. Two operations should not yield a result as if they happened in one order on one storage system and a different order on another storage system in the replicated cluster.

Furthermore, read requests can be made time order consistent. For example, if one read request is received on a replicated cluster and completed and that read is then followed by another read request to an overlapping address range which is received by the replicated cluster and where one or both reads in any way overlap in time and volume address range with a modification request received by the replicated cluster (whether any of the reads or the modification are received by the same storage system or a different storage system in the replicated cluster), then if the first read reflects the result of the update then the second read should also reflect the results of that update, rather than possibly returning data that preceded the update. If the first read does not reflect the update, then the second read can either reflect the update or not. This ensures that between two read requests "time" for a data segment cannot roll backward.

In the example depicted in FIG. 6A, the depicted storage systems (6-402, 6-404, 6-406) may also detect a disruption in data communications with one or more of the other storage systems and determine whether to the particular storage system should remain in the pod. A disruption in data communications with one or more of the other storage systems may occur for a variety of reasons. For example, a disruption in data communications with one or more of the other storage systems may occur because one of the storage systems has failed, because a network interconnect has failed, or for some other reason. An important aspect of synchronous replicated clustering is ensuring that any fault handling doesn't result in unrecoverable inconsistencies, or any inconsistency in responses. For example, if a network fails between two storage systems, at most one of the storage systems can continue processing newly incoming I/O requests for a pod. And, if one storage system continues processing, the other storage system can't process any new requests to completion, including read requests.

In the example depicted in FIG. 6A, the depicted storage systems (6-402, 6-404, 6-406) may also determine whether the particular storage system should remain in the pod in response to detecting a disruption in data communications with one or more of the other storage systems. As mentioned above, to be 'online' as part of a pod, a storage system must consider itself to be in-sync for the pod and must be communicating with all other storage systems it considers to be in-sync for the pod. If a storage system can't be certain that it is in-sync and communicating with all other storage systems that are in-sync, then it may stop processing new incoming requests to access the dataset (6-426, 6-428). As such, the storage system may determine whether the particular storage system should remain online as part of the pod, for example, by determining whether it can communicate with all other storage systems it considers to be in-sync for the pod (e.g., via one or more test messages), by determining whether all other storage systems it considers to be in-sync for the pod also consider the storage system to be attached to the pod, through a combination of both steps where the particular storage system must confirm that it can communicate with all other storage systems it considers to be in-sync for the pod and that all other storage systems it considers to be in-sync for the pod also consider the storage system to be attached to the pod, or through some other mechanism.

In the example depicted in FIG. 6A, the depicted storage systems (6-402, 6-404, 6-406) may also keep the dataset on the particular storage system accessible for management and dataset operations in response to determining that the particular storage system should remain in the pod. The storage system may keep the dataset (6-426, 6-428) on the particular storage system accessible for management and dataset operations, for example, by accepting requests to access the version of the dataset (6-426, 6-428) that is stored on the storage system and processing such requests, by accepting and processing management operations associated with the dataset (6-426, 6-428) that are issued by a host or authorized administrator, by accepting and processing management operations associated with the dataset (6-426, 6-428) that are issued by one of the other storage systems, or in some other way.

In the example depicted in FIG. 6A, the depicted storage systems (6-402, 6-404, 6-406) may, however, make the dataset on the particular storage system inaccessible for management and dataset operations in response to determining that the particular storage system should not remain in the pod. The storage system may make the dataset (6-426, 6-428) on the particular storage system inaccessible for management and dataset operations, for example, by rejecting requests to access the version of the dataset (6-426, 6-428) that is stored on the storage system, by rejecting management operations associated with the dataset (6-426, 6-428) that are issued by a host or other authorized administrator, by rejecting management operations associated with the dataset (6-426, 6-428) that are issued by one of the other storage systems in the pod, or in some other way.

In the example depicted in FIG. 6A, the depicted storage systems (6-402, 6-404, 6-406) may also detect that the disruption in data communications with one or more of the other storage systems has been repaired and make the dataset on the particular storage system accessible for management and dataset operations. The storage system may detect that the disruption in data communications with one or more of the other storage systems has been repaired, for example, by receiving a message from the one or more of the other storage systems. In response to detecting that the disruption in data communications with one or more of the other storage systems has been repaired, the storage system may make the dataset (6-426, 6-428) on the particular storage system accessible for management and dataset operations once the previously detached storage system has been resynchronized with the storage systems that remained attached to the pod.

In the example depicted in FIG. 6A, the depicted storage systems (6-402, 6-404, 6-406) may also go offline from the pod such that the particular storage system no longer allows management and dataset operations. The depicted storage systems (6-402, 6-404, 6-406) may go offline from the pod such that the particular storage system no longer allows management and dataset operations for a variety of reasons. For example, the depicted storage systems (6-402, 6-404, 6-406) may also go offline from the pod due to some fault with the storage system itself, because an update or some other maintenance is occurring on the storage system, due to communications faults, or for many other reasons. In such an example, the depicted storage systems (6-402, 6-404, 6-406) may subsequently update the dataset on the particular storage system to include all updates to the dataset since the particular storage system went offline and go back online with the pod such that the particular storage system allows management and dataset operations, as will be described in greater detail in the resynchronization sections included below.

In the example depicted in FIG. 6A, the depicted storage systems (6-402, 6-404, 6-406) may also identifying a target storage system for asynchronously receiving the dataset, where the target storage system is not one of the plurality of storage systems across which the dataset is synchronously replicated. Such a target storage system may represent, for example, a backup storage system, as some storage system that makes use of the synchronously replicated dataset, and so on. In fact, synchronous replication can be leveraged to distribute copies of a dataset closer to some rack of servers, for better local read performance. One such case is smaller top-of-rack storage systems symmetrically replicated to larger storage systems that are centrally located in the data center or campus and where those larger storage systems are more carefully managed for reliability or are connected to external networks for asynchronous replication or backup services.

In the example depicted in FIG. 6A, the depicted storage systems (6-402, 6-404, 6-406) may also identify a portion of the dataset that is not being asynchronously replicated to the target storage system by any of the other storages systems and asynchronously replicate, to the target storage system, the portion of the dataset that is not being asynchronously replicated to the target storage system by any of the other storages systems, wherein the two or more storage systems collectively replicate the entire dataset to the target storage system. In such a way, the work associated with asynchronously replicating a particular dataset may be split amongst the members of a pod, such that each storage system in a pod is only responsible for asynchronously replicating a subset of a dataset to the target storage system.

In the example depicted in FIG. 6A, the depicted storage systems (6-402, 6-404, 6-406) may also detach from the pod, such that the particular storage system that detaches from the pod is no longer included in the set of storage systems across which the dataset is synchronously replicated. For example, if storage system (6-404) in FIG. 6A detached from the pod (6-430) illustrated in FIG. 6A, the pod (6-430) would only include storage systems (6-402, 6-406) as the storage systems across which the dataset (6-426) that is included in the pod (6-430) would be synchronously replicated across. In such an example, detaching the storage system from the pod could also include removing the dataset from the particular storage system that detached from the pod. Continuing with the example where the storage system (6-404) in FIG. 6A detached from the pod (6-430) illustrated in FIG. 6A, the dataset (6-426) that is included in the pod (6-430) could be deleted or otherwise removed from the storage system (6-404).

Readers will appreciate that there are a number of unique administrative capabilities enabled by the pod model that can further be supported. Also, the pod model itself introduces some issues that can be addressed by an implementation. For example, when a storage system is offline for a pod, but is otherwise running, such as because an interconnect failed and another storage system for the pod won out in mediation, there may still be a desire or need to access the offline pod's dataset on the offline storage system. One solution may be simply to enable the pod in some detached mode and allow the dataset to be accessed. However, that solution can be dangerous and that solution can cause the pod's metadata and data to be much more difficult to reconcile when the storage systems do regain communication. Furthermore, there could still be a separate path for hosts to access the offline storage system as well as the still online storage systems. In that case, a host might issue I/O to both storage systems even though they are no longer being kept in sync, because the host sees target ports reporting volumes with the same identifiers and the host I/O drivers presume it sees additional paths to the same volume. This can result in fairly damaging data corruption as reads and writes issued to both storage systems are no longer consistent even though the host presumes they are. As a variant of this case, in a clustered application, such as a shared storage clustered database, the clustered application running on one host might be reading or writing to one storage system and the same clustered application running on another host might be reading or writing to the "detached" storage system, yet the two instances of the clustered application are communicating between each other on the presumption that the dataset they each see is entirely consistent for completed writes. Since they aren't consistent, that presumption is violated and the application's dataset (e.g., the database) can quickly end up being corrupted.

One way to solve both of these problems is to allow for an offline pod, or perhaps a snapshot of an offline pod, to be copied to a new pod with new volumes that have sufficiently new identities that host I/O drivers and clustered applications won't confuse the copied volumes as being the same as the still online volumes on another storage system. Since each pod maintains a complete copy of the dataset, which is crash consistent but perhaps slightly different from the copy of the pod dataset on another storage system, and since each pod has an independent copy of all data and metadata needed to operate on the pod content, it is a straightforward problem to make a virtual copy of some or all volumes or snapshots in the pod to new volumes in a new pod. In a logical extent graph implementation, for example, all that is needed is to define new volumes in a new pod which reference logical extent graphs from the copied pod associated with the pod's volumes or snapshots, and with the logical extent graphs being marked as copy on write. The new volumes should be treated as new volumes, similarly to how volume snapshots copied to a new volume might be implemented. Volumes may have the same administrative name, though within a new pod namespace. But, they should have different underlying identifiers, and differing logical unit identifiers from the original volumes.

In some cases it may be possible to use virtual network isolation techniques (for example, by creating a virtual LAN in the case of IP networks or a virtual SAN in the case of fiber channel networks) in such a way that isolation of volumes presented to some interfaces can be assured to be inaccessible from host network interfaces or host SCSI initiator ports that might also see the original volumes. In such cases, it may be safe to provide the copies of volumes with the same SCSI or other storage identifiers as the original volumes. This could be used, for example, in cases where the applications expect to see a particular set of storage identifiers in order to function without an undue burden in reconfiguration.

Some of the techniques described herein could also be used outside of an active fault context to test readiness for handling faults. Readiness testing (sometimes referred to as "fire drills") is commonly required for disaster recovery configurations, where frequent and repeated testing is considered a necessity to ensure that most or all aspects of a disaster recovery plan are correct and account for any recent changes to applications, datasets, or changes in equipment. Readiness testing should be non-disruptive to current production operations, including replication. In many cases the real operations can't actually be invoked on the active configuration, but a good way to get close is to use storage operations to make copies of production datasets, and then perhaps couple that with the use of virtual networking, to create an isolated environment containing all data that is believed necessary for the important applications that must be brought up successfully in cases of disasters. Making such a copy of a synchronously replicated (or even an asynchronously replicated) dataset available within a site (or collection of sites) that is expected to perform a disaster recovery readiness test procedure and then starting the important applications on that dataset to ensure that it can startup and function is a great tool, since it helps ensure that no important parts of the application datasets were left out in the disaster recovery plan. If necessary, and practical, this could be coupled with virtual isolated networks coupled perhaps with isolated collection of physical or virtual machines, to get as close as possible to a real world disaster recovery takeover scenario. Virtually copying a pod (or set of pods) to another pod as a point-in-time image of the pod datasets immediately creates an isolated dataset that contains all the copied elements and that can then be operated on essentially identically to the originally pods, as well as allowing isolation to a single site (or a few sites) separately from the original pod. Further, these are fast operations and they can be torn down and repeated easily allowing testing to repeated as often as is desired.

Some enhancements could be made to get further toward perfect disaster recovery testing. For example, in conjunction with isolated networks, SCSI logical unit identities or other types of identities could be copied into the target pod so that the test servers, virtual machines, and applications see the same identities. Further, the administrative environment of the servers could be configured to respond to requests from a particular virtual set of virtual networks to respond to requests and operations on the original pod name so scripts don't require use of test-variants with alternate "test" versions of object names. A further enhancement can be used in cases where the host-side server infrastructure that will take over in the case of a disaster takeover can be used during a test. This includes cases where a disaster recovery data center is completely stocked with alternative server infrastructure that won't generally be used until directed to do so by a disaster. It also includes cases where that infrastructure might be used for non-critical operations (for example, running analytics on production data, or simply supporting application development or other functions which may be important but can be halted if needed for more critical functions). Specifically, host definitions and configurations and the server infrastructure that will use them can be set up as they will be for an actual disaster recovery takeover event and tested as part of disaster recovery takeover testing, with the tested volumes being connected to these host definitions from the virtual pod copy used to provide a snapshot of the dataset. From the standpoint of the storage systems involved, then, these host definitions and configurations used for testing, and the volume-to-host connection configurations used during testing, can be reused when an actual disaster takeover event is triggered, greatly minimizing the configuration differences between the test configuration and the real configuration that will be used in case of a disaster recovery takeover.

In some cases it may make sense to move volumes out of a first pod and into a new second pod including just those volumes. The pod membership and high availability and recovery characteristics can then be adjusted separately, and administration of the two resulting pod datasets can then be isolated from each other. An operation that can be done in one direction should also be possible in the other direction. At some point, it may make sense to take two pods and merge them into one so that the volumes in each of the original two pods will now track each other for storage system membership and high availability and recovery characteristics and events. Both operations can be accomplished safely and with reasonably minimal or no disruption to running applications by relying on the characteristics suggested for changing mediation or quorum properties for a pod which were discussed in an earlier section. With mediation, for example, a mediator for a pod can be changed using a sequence consisting of a step where each storage system in a pod is changed to depend on both a first mediator and a second mediator and each is then changed to depend only on the second mediator. If a fault occurs in the middle of the sequence, some storage systems may depend on both the first mediator and the second mediator, but in no case will recovery and fault handling result in some storage systems depending only on the first mediator and other storage systems only depending on the second mediator. Quorum can be handled similarly by temporarily depending on winning against both a first quorum model and a second quorum model in order to proceed to recovery. This may result in a very short time period where availability of the pod in the face of faults depend on additional resources, thus reducing potential availability, but this time period is very short and the reduction in availability is often very little. With mediation, if the change in mediator parameters is nothing more than the change in the key used for mediation and the mediation service used is the same, then the potential reduction in availability is even less, since it now depends only on two calls to the same service versus one call to that service, and rather than separate calls to two separate services.

Readers will note that changing the quorum model may be quite complex. An additional step may be necessary where storage systems will participate in the second quorum model but won't depend on winning in that second quorum model, which is then followed by the step of also depending on the second quorum model. This may be necessary to account for the fact that if only one system has processed the change to depend on the quorum model, then it will never win quorum since there will never be a majority. With this model in place for changing the high availability parameters (mediation relationship, quorum model, takeover preferences), we can create a safe procedure for these operations to split a pod into two or to join two pods into one. This may require adding one other capability: linking a second pod to a first pod for high availability such that if two pods include compatible high availability parameters the second pod linked to the first pod can depend on the first pod for determining and instigating detach-related processing and operations, offline and in-sync states, and recovery and resynchronization actions.

To split a pod into two, which is an operation to move some volumes into a newly created pod, a distributed operation may be formed that can be described as: form a second pod into which we will move a set of volumes which were previously in a first pod, copy the high availability parameters from the first pod into the second pod to ensure they are compatible for linking, and link the second pod to the first pod for high availability. This operation may be encoded as messages and should be implemented by each storage system in the pod in such a way that the storage system ensures that the operation happens completely on that storage system or does not happen at all if processing is interrupted by a fault. Once all in-sync storage systems for the two pods have processed this operation, the storage systems can then process a subsequent operation which changes the second pod so that it is no longer linked to the first pod. As with other changes to high availability characteristics for a pod, this involves first having each in-sync storage system change to rely on both the previous model (that model being that high availability is linked to the first pod) and the new model (that model being its own now independent high availability). In the case of mediation or quorum, this means that storage systems which processed this change will first depend on mediation or quorum being achieved as appropriate for the first pod and will additionally depend on a new separate mediation (for example, a new mediation key) or quorum being achieved for the second pod before the second pod can proceed following a fault that required mediation or testing for quorum. As with the previous description of changing quorum models, an intermediate step may set storage systems to participate in quorum for the second pod before the step where storage systems participate in and depend on quorum for the second pod. Once all in-sync storage systems have processed the change to depend on the new parameters for mediation or quorum for both the first pod and the second pod, the split is complete.

Joining a second pod into a first pod operates essentially in reverse. First, the second pod must be adjusted to be compatible with the first pod, by having an identical list of storage systems and by having a compatible high availability model. This may involve some set of steps such as those described elsewhere in this paper to add or remove storage systems or to change mediator and quorum models. Depending on implementation, it may be necessary only to reach an identical list of storage systems. Joining proceeds by processing an operation on each in-sync storage system to link the second pod to the first pod for high availability. Each storage system which processes that operation will then depend on the first pod for high availability and then the second pod for high availability. Once all in-sync storage systems for the second pod have processed that operation, the storage systems will then each process a subsequent operation to eliminate the link between the second pod and the first pod, migrate the volumes from the second pod into the first pod, and delete the second pod. Host or application dataset access can be preserved throughout these operations, as long as the implementation allows proper direction of host or application dataset modification or read operations to the volume by identity and as long as the identity is preserved as appropriate to the storage protocol or storage model (for example, as long as logical unit identifiers for volumes and use of target ports for accessing volumes are preserved in the case of SCSI).

Migrating a volume between pods may present issues. If the pods have an identical set of in-sync membership storage systems, then it may be straightforward: temporarily suspend operations on the volumes being migrated, switch control over operations on those volumes to controlling software and structures for the new pod, and then resume operations. This allows for a seamless migration with continuous uptime for applications apart from the very brief operation suspension, provided network and ports migrate properly between pods. Depending on the implementation, suspending operations may not even be necessary, or may be so internal to the system that the suspension of operations has no impact. Copying volumes between pods with different in-sync membership sets is more of a problem. If the target pod for the copy has a subset of in-sync members from the source pod, this isn't much of a problem: a member storage system can be dropped safely enough without having to do more work. But, if the target pod adds in-sync member storage systems to the volume over the source pod, then the added storage systems must be synchronized to include the volume's content before they can be used. Until synchronized, this leaves the copied volumes distinctly different from the already synchronized volumes, in that fault handling differs and request handling from the not yet synced member storage systems either won't work or must be forwarded or won't be as fast because reads will have to traverse an interconnect. Also, the internal implementation will have to handle some volumes being in sync and ready for fault handling and others not being in sync.

There are other problems relating to reliability of the operation in the face of faults. Coordinating a migration of volumes between multi-storage-system pods is a distributed operation. If pods are the unit of fault handling and recovery, and if mediation or quorum or whatever means are used to avoid split-brain situations, then a switch in volumes from one pod with a particular set of state and configurations and relationships for fault handling, recovery, mediation and quorum to another then storage systems in a pod have to be careful about coordinating changes related to that handling for any volumes. Operations can't be atomically distributed between storage systems, but must be staged in some way. Mediation and quorum models essentially provide pods with the tools for implementing distributed transactional atomicity, but this may not extend to inter-pod operations without adding to the implementation.

Consider even a simple migration of a volume from a first pod to a second pod even for two pods that share the same first and second storage systems. At some point the storage systems will coordinate to define that the volume is now in the second pod and is no longer in the first pod. If there is no inherent mechanism for transactional atomicity across the storage systems for the two pods, then a naive implementation could leave the volume in the first pod on the first storage system and the second pod on the second storage system at the time of a network fault that results in fault handling to detach storage systems from the two pods. If pods separately determine which storage system succeeds in detaching the other, then the result could be that the same storage system detaches the other storage system for both pods, in which case the result of the volume migration recovery should be consistent, or it could result in a different storage system detaching the other for the two pods. If the first storage system detaches the second storage system for the first pod and the second storage system detaches the first storage system for the second pod, then recovery might result in the volume being recovered to the first pod on the first storage system and into the second pod on the second storage system, with the volume then running and exported to hosts and storage applications on both storage systems. If instead the second storage system detaches the first storage system for the first pod and first storage detaches the second storage system for the second pod, then recovery might result in the volume being discarded from the second pod by the first storage system and the volume being discarded from the first pod by the second storage system, resulting in the volume disappearing entirely. If the pods a volume is being migrated between are on differing sets of storage systems, then things can get even more complicated.

A solution to these problems may be to use an intermediate pod along with the techniques described previously for splitting and joining pods. This intermediate pod may never be presented as visible managed objects associated with the storage systems. In this model, volumes to be moved from a first pod to a second pod are first split from the first pod into a new intermediate pod using the split operation described previously. The storage system members for the intermediate pod can then be adjusted to match the membership of storage systems by adding or removing storage systems from the pod as necessary. Subsequently, the intermediate pod can be joined with the second pod.

Figure 6B:
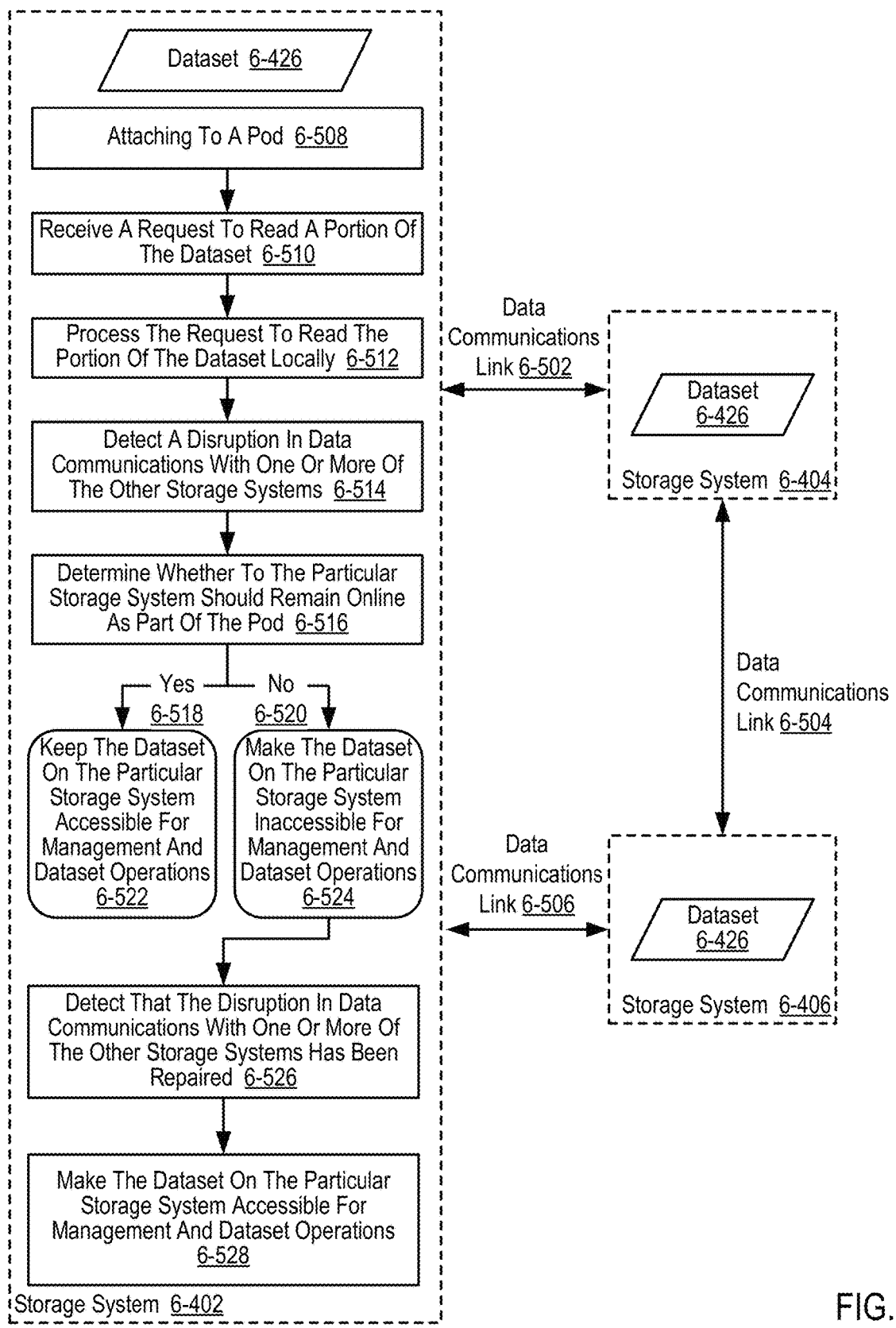

For further explanation, FIG. 6B sets forth a flow chart illustrating steps that may be performed by storage systems (6-402, 6-404, 6-406) that support a pod according to some embodiments of the present disclosure. Although depicted in less detail, the storage systems (6-402. 6-404, 6-406) depicted in FIG. 6B may be similar to the storage systems described above with reference to FIGS. 1A-ID, FIGS. 2A-2G, FIGS. 3A-3B, FIG. 6A, or any combination thereof. In fact, the storage systems (6-402, 6-404, 6-406) depicted in FIG. 6B may include the same, fewer, additional components as the storage systems described above.

In the example method depicted in FIG. 6B, a storage system (6-402) may attach (6-508) to a pod. The model for pod membership may include a list of storage systems and a subset of that list where storage systems are presumed to be in-sync for the pod. A storage system is in-sync for a pod if it is at least within a recovery of having identical idle content for the last written copy of the dataset associated with the pod. Idle content is the content after any in-progress modifications have completed with no processing of new modifications. Sometimes this is referred to as "crash recoverable" consistency. Storage systems that are listed as pod members but that are not listed as in-sync for the pod can be described as "detached" from the pod. Storage systems that are listed as pod members, are in-sync for the pod, and are currently available for actively serving data for the pod are "online" for the pod.

In the example method depicted in FIG. 6B, the storage system (6-402) may attach (6-508) to a pod, for example, by synchronizing its locally stored version of the dataset (6-426) along with an up-to-date version of the dataset (6-426) that is stored on other storage systems (6-404, 6-406) in the pod that are online, as the term is described above. In such an example, in order for the storage system (6-402) to attach (6-508) to the pod, a pod definition stored locally within each of the storage systems (6-402, 6-404, 6-406) in the pod may need to be updated in order for the storage system (6-402) to attach (6-508) to the pod. In such an example, each storage system member of a pod may have its own copy of the membership, including which storage systems it last knew were in-sync, and which storage systems it last knew comprised the entire set of pod members.

In the example method depicted in FIG. 6B, the storage system (6-402) may also receive (6-510) a request to read a portion of the dataset (6-426) and the storage system (6-402) may process (6-512) the request to read the portion of the dataset (6-426) locally. Readers will appreciate that although requests to modify (e.g., a write operation) the dataset (6-426) require coordination between the storage systems (6-402, 6-404, 6-406) in a pod, as the dataset (6-426) should be consistent across all storage systems (6-402, 6-404, 6-406) in a pod, responding to a request to read a portion of the dataset (6-426) does not require similar coordination between the storage systems (6-402, 6-404, 6-406). As such, a particular storage system (6-402) that receives a read request may service the read request locally by reading a portion of the dataset (6-426) that is stored within the storage system's (6-402) storage devices, with no synchronous communication with other storage systems (6-404, 6-406) in the pod. Read requests received by one storage system for a replicated dataset in a replicated cluster are expected to avoid any communication in the vast majority of cases, at least when received by a storage system that is running within a cluster that is also running nominally. Such reads should normally be processed simply by reading from the local copy of a clustered dataset with no further interaction required with other storage systems in the cluster Readers will appreciate that the storage systems may take steps to ensure read consistency such that a read request will return the same result regardless of which storage system processes the read request. For example, the resulting clustered dataset content for any set of updates received by any set of storage systems in the cluster should be consistent across the cluster, at least at any time updates are idle (all previous modifying operations have been indicated as complete and no new update requests have been received and processed in any way). More specifically, the instances of a clustered dataset across a set of storage systems can differ only as a result of updates that have not yet completed. This means, for example, that any two write requests which overlap in their volume block range, or any combination of a write request and an overlapping snapshot, compare-and-write, or virtual block range copy, must yield a consistent result on all copies of the dataset. Two operations cannot yield a result as if they happened in one order on one storage system and a different order on another storage system in the replicated cluster.

Furthermore, read requests may be time order consistent. For example, if one read request is received on a replicated cluster and completed and that read is then followed by another read request to an overlapping address range which is received by the replicated cluster and where one or both reads in any way overlap in time and volume address range with a modification request received by the replicated cluster (whether any of the reads or the modification are received by the same storage system or a different storage system in the replicated cluster), then if the first read reflects the result of the update then the second read should also reflect the results of that update, rather than possibly returning data that preceded the update. If the first read does not reflect the update, then the second read can either reflect the update or not. This ensures that between two read requests "time" for a data segment cannot roll backward.

In the example method depicted in FIG. 6B, the storage system (6-402) may also detect (6-514) a disruption in data communications with one or more of the other storage systems (6-404, 6-406). A disruption in data communications with one or more of the other storage systems (6-404, 6-406) may occur for a variety of reasons. For example, a disruption in data communications with one or more of the other storage systems (6-404, 6-406) may occur because one of the storage systems (6-402, 6-404, 6-406) has failed, because a network interconnect has failed, or for some other reason. An important aspect of synchronous replicated clustering is ensuring that any fault handling doesn't result in unrecoverable inconsistencies, or any inconsistency in responses. For example, if a network fails between two storage systems, at most one of the storage systems can continue processing newly incoming I/O requests for a pod. And, if one storage system continues processing, the other storage system can't process any new requests to completion, including read requests.

In the example method depicted in FIG. 6B, the storage system (6-402) may also determine (6-516) whether to the particular storage system (6-402) should remain online as part of the pod. As mentioned above, to be 'online' as part of a pod, a storage system must consider itself to be in-sync for the pod and must be communicating with all other storage systems it considers to be in-sync for the pod. If a storage system can't be certain that it is in-sync and communicating with all other storage systems that are in-sync, then it may stop processing new incoming requests to access the dataset (6-426). As such, the storage system (6-402) may determine (6-516) whether to the particular storage system (6-402) should remain online as part of the pod, for example, by determining whether it can communicate with all other storage systems (6-404, 6-406) it considers to be in-sync for the pod (e.g., via one or more test messages), by determining whether the all other storage systems (6-404, 6-406) it considers to be in-sync for the pod also consider the storage system (6-402) to be attached to the pod, through a combination of both steps where the particular storage system (6-402) must confirm that it can communicate with all other storage systems (6-404, 6-406) it considers to be in-sync for the pod and that all other storage systems (6-404, 6-406) it considers to be in-sync for the pod also consider the storage system (6-402) to be attached to the pod, or through some other mechanism.

In the example method depicted in FIG. 6B, the storage system (6-402) may also, responsive to affirmatively (6-518) determining that the particular storage system (6-402) should remain online as part of the pod, keep (6-522) the dataset (6-426) on the particular storage system (6-402) accessible for management and dataset operations. The storage system (6-402) may keep (6-522) the dataset (6-426) on the particular storage system (6-402) accessible for management and dataset operations, for example, by accepting requests to access the version of the dataset (6-426) that is stored on the storage system (6-402) and processing such requests, by accepting and processing management operations associated with the dataset (6-426) that are issued by a host or authorized administrator, by accepting and processing management operations associated with the dataset (6-426) that are issued by one of the other storage systems (6-404, 6-406) in the pod, or in some other way.

In the example method depicted in FIG. 6B, the storage system (6-402) may also, responsive to determining that the particular storage system should not (6-520) remain online as part of the pod, make (6-524) the dataset (6-426) on the particular storage system (6-402) inaccessible for management and dataset operations. The storage system (6-402) may make (6-524) the dataset (6-426) on the particular storage system (6-402) inaccessible for management and dataset operations, for example, by rejecting requests to access the version of the dataset (6-426) that is stored on the storage system (6-402), by rejecting management operations associated with the dataset (6-426) that are issued by a host or other authorized administrator, by rejecting management operations associated with the dataset (6-426) that are issued by one of the other storage systems (6-404, 6-406) in the pod, or in some other way.

In the example method depicted in FIG. 6B, the storage system (6-402) may also detect (6-526) that the disruption in data communications with one or more of the other storage systems (6-404, 6-406) has been repaired. The storage system (6-402) may detect (6-526) that the disruption in data communications with one or more of the other storage systems (6-404, 6-406) has been repaired, for example, by receiving a message from the one or more of the other storage systems (6-404, 6-406). In response to detecting (6-526) that the disruption in data communications with one or more of the other storage systems (6-404, 6-406) has been repaired, the storage system (6-402) may make (6-528) the dataset (6-426) on the particular storage system (6-402) accessible for management and dataset operations.

Readers will appreciate that the example depicted in FIG. 6B describes an embodiment in which various actions are depicted as occurring within some order, although no ordering is required. Furthermore, other embodiments may exist where the storage system (6-402) only carries out a subset of the described actions. For example, the storage system (6-402) may perform the steps of detecting (6-514) a disruption in data communications with one or more of the other storage systems (6-404, 6-406), determining (6-516) whether to the particular storage system (6-402) should remain in the pod, keeping (6-522) the dataset (6-426) on the particular storage system (6-402) accessible for management and dataset operations or making (6-524) the dataset (6-426) on the particular storage system (6-402) inaccessible for management and dataset operations without first receiving (6-510) a request to read a portion of the dataset (6-426) and processing (6-512) the request to read the portion of the dataset (6-426) locally. Furthermore, the storage system (6-402) may detect (6-526) that the disruption in data communications with one or more of the other storage systems (6-404, 6-406) has been repaired and make (6-528) the dataset (6-426) on the particular storage system (6-402) accessible for management and dataset operations without first receiving (6-510) a request to read a portion of the dataset (6-426) and processing (6-512) the request to read the portion of the dataset (6-426) locally. In fact, none of the steps described herein are explicitly required in all embodiments as prerequisites for performing other steps described herein.

Figure 6C:
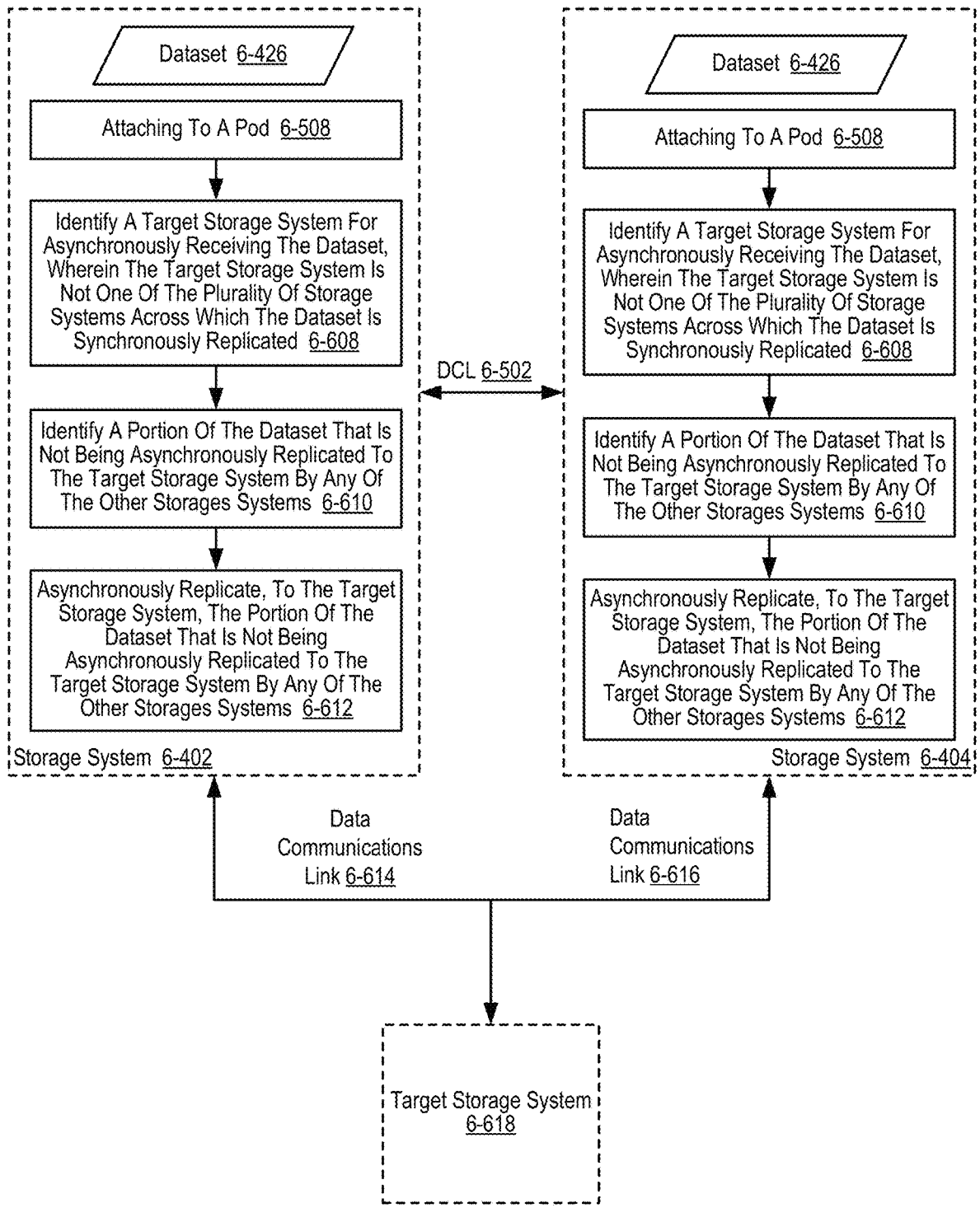

For further explanation, FIG. 6C sets forth a flow chart illustrating steps that may be performed by storage systems (6-402, 6-404, 6-406) that support a pod according to some embodiments of the present disclosure. Although depicted in less detail, the storage systems (6-402. 6-404, 6-406) depicted in FIG. 6C may be similar to the storage systems described above with reference to FIGS. 1A-1D, FIGS. 2A-2G, FIGS. 3A-3B, FIG. 6A or 6B, or any combination thereof. In fact, the storage systems (6-402, 6-404, 6-406) depicted in FIG. 6C may include the same, fewer, additional components as the storage systems described above.

In the example method depicted in FIG. 6C, two or more of the storage systems (6-402, 6-404) may each identify (6-608) a target storage system (6-618) for asynchronously receiving the dataset (6-426). The target storage system (6-618) for asynchronously receiving the dataset (6-426)

may be embodied, for example, as a backup storage system that is located in a different data center than either of the storage systems (6-402, 6-404) that are members of a particular pod, as cloud storage that is provided by a cloud services provider, or in many other ways. Readers will appreciate that the target storage system (6-618) is not one of the plurality of storage systems (6-402, 6-404) across which the dataset (6-426) is synchronously replicated, and as such, the target storage system (6-618) initially does not include an up-to-date local copy of the dataset (6-426).

In the example method depicted in FIG. 6C, two or more of the storage systems (6-402, 6-404) may each also identify (6-610) a portion of the dataset (6-426) that is not being asynchronously replicated to the target storage (6-618) system by any of the other storages systems that are members of a pod that includes the dataset (6-426). In such an example, the storage systems (6-402, 6-404) may each asynchronously replicate (6-612), to the target storage system (6-618), the portion of the dataset (6-426) that is not being asynchronously replicated to the target storage system by any of the other storages systems. Consider an example in which a first storage system (6-402) is responsible for asynchronously replicating a first portion (e.g., a first half of an address space) of the dataset (6-426) to the target storage system (6-618). In such an example, the second storage system (6-404) would be responsible for asynchronously replicating a second portion (e.g., a second half of an address space) of the dataset (6-426) to the target storage system (6-618), such that the two or more storage systems (6-402, 6-404) collectively replicate the entire dataset (6-426) to the target storage system (6-618).

Readers will appreciate that through the use of pods, as described above, the replication relationship between two storage systems may be switched from a relationship where data is asynchronously replicated to a relationship where data is synchronously replicated. For example, if storage system A is configured to asynchronously replicate a dataset to storage system B, creating a pod that includes the dataset, storage system A as a member, and storage system B as a member can switch the relationship where data is asynchronously replicated to a relationship where data is synchronously replicated. Likewise, through the use of pods, the replication relationship between two storage systems may be switched from a relationship where data is synchronously replicated to a relationship where data is asynchronously replicated. For example, if a pod is created that includes the dataset, storage system A as a member, and storage system B as a member, by merely unstretching the pod (to remove storage system A as a member or to remove storage system B as a member), a relationship where data is synchronously replicated between the storage systems can immediately be switched to a relationship where data is asynchronously replicated. In such a way, storage systems may switch back-and-forth as needed between asynchronous replication and synchronous replication.

This switching can be facilitated by the implementation relying on similar techniques for both synchronous and asynchronous replication. For example, if resynchronization for a synchronously replicated dataset relies on the same or a compatible mechanism as is used for asynchronous replication, then switching to asynchronous replication is conceptually identical to dropping the in-sync state and leaving a relationship in a state similar to a "perpetual recovery" mode. Likewise, switching from asynchronous replication to synchronous replication can operate conceptually by "catching up" and becoming in-sync just as is done when com- pleting a resynchronization with the switching system becoming an in-sync pod member.

Alternatively, or additionally, if both synchronous and asynchronous replication rely on similar or identical common metadata, or a common model for representing and identifying logical extents or stored block identities, or a common model for representing content-addressable stored blocks, then these aspects of commonality can be leveraged to dramatically reduce the content that may need to be transferred when switching to and from synchronous and asynchronous replication. Further, if a dataset is asynchronously replicated from a storage system A to a storage system B, and system B further asynchronously replicates that data set to a storage system C, then a common metadata model, common logical extent or block identities, or common representation of content-addressable stored blocks, can dramatically reduce the data transfers needed to enable synchronous replication between storage system A and storage system C.

Readers will further appreciate that that through the use of pods, as described above, replication techniques may be used to perform tasks other than replicating data. In fact, because a pod may include a set of managed objects, tasks like migrating a virtual machine may be carried out using pods and the replication techniques described herein. For example, if virtual machine A is executing on storage system A, by creating a pod that includes virtual machine A as a managed object, storage system A as a member, and storage system B as a member, virtual machine A and any associated images and definitions may be migrated to storage system B, at which time the pod could simply be destroyed, membership could be updated, or other actions may be taken as necessary.

Figure 7:
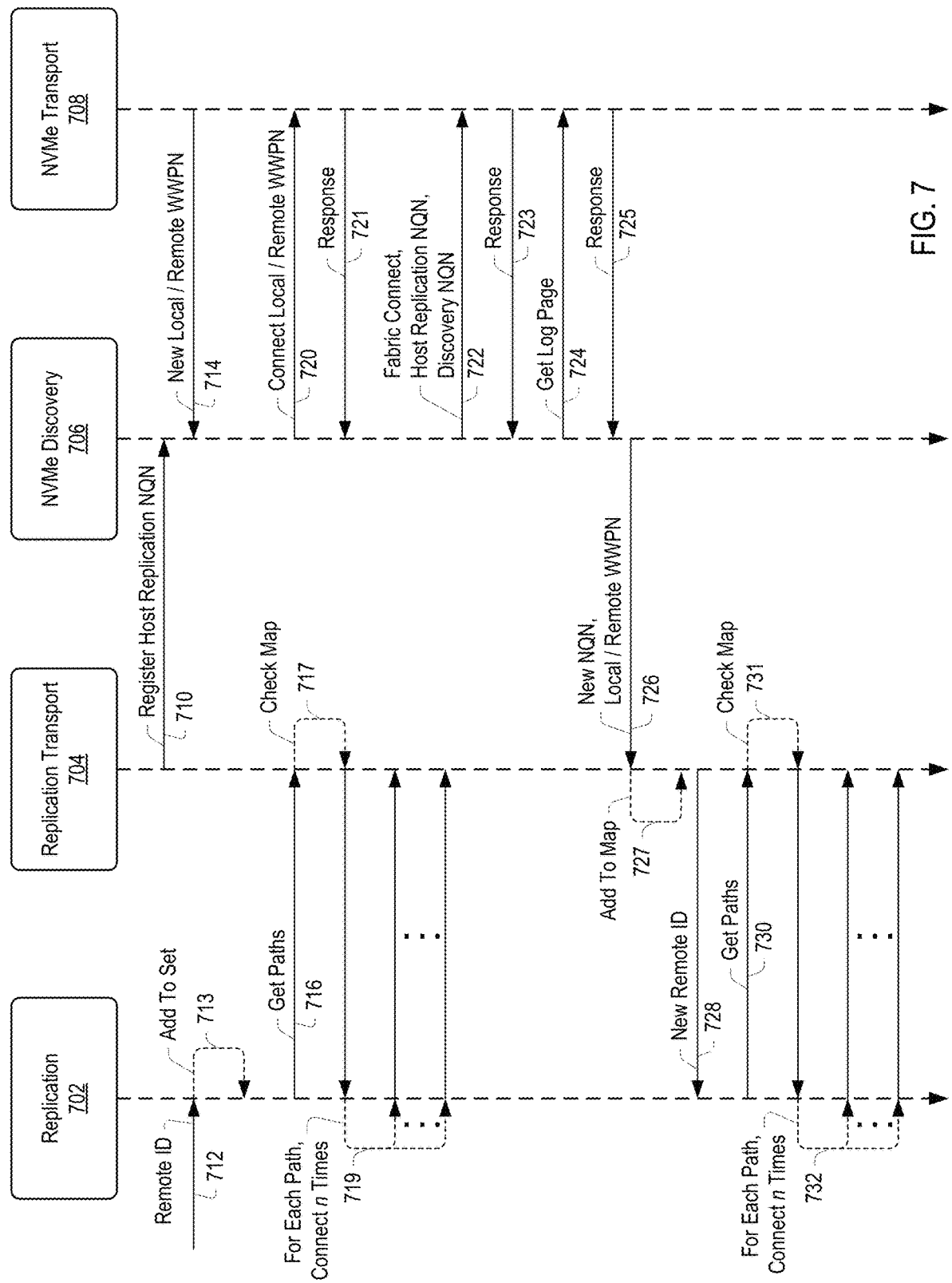
FIG. 7 sets forth a diagram illustrating example control flows for layering communication protocols in accordance with some embodiments of the present disclosure.
Figure 8:
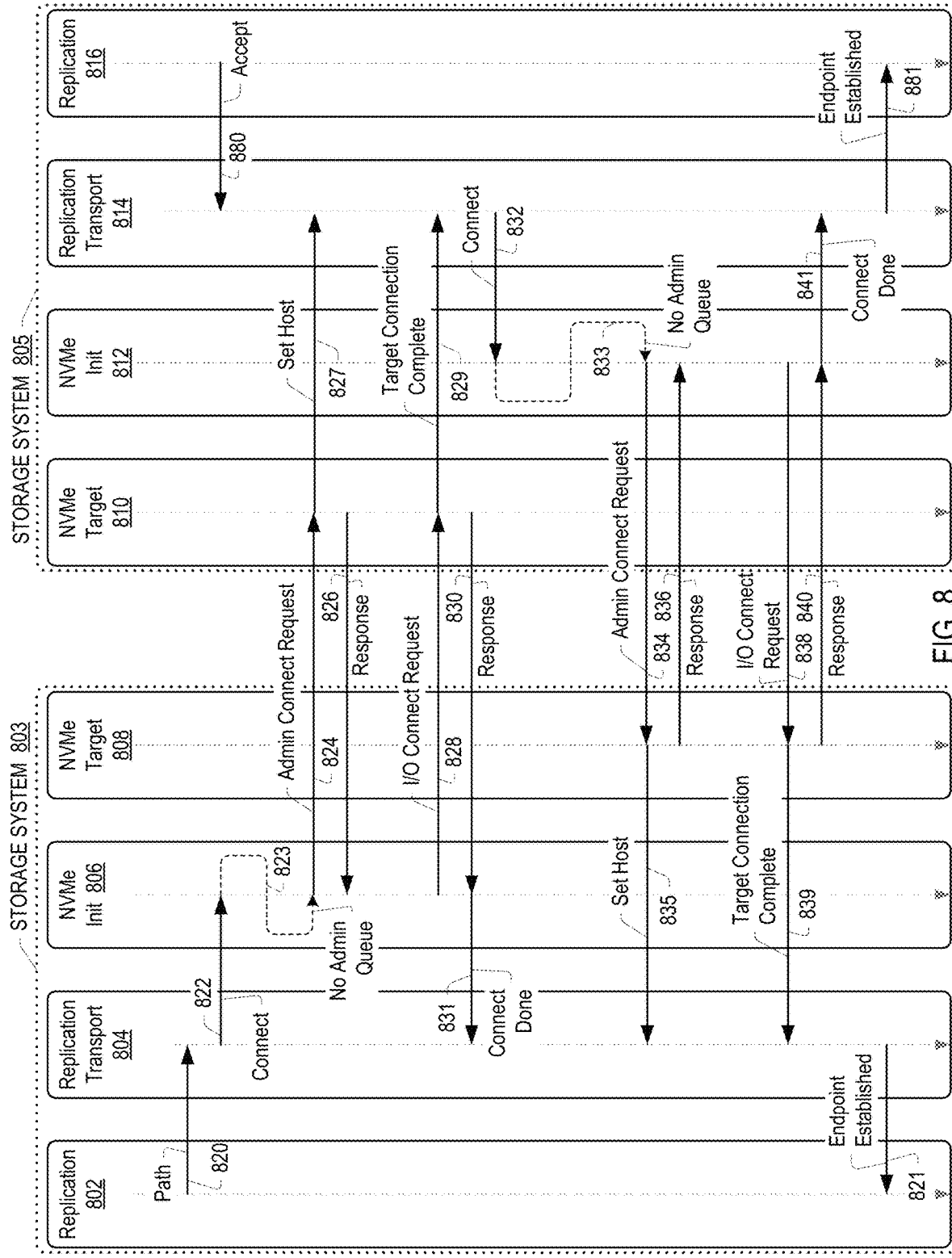
FIG. 8 sets forth a diagram illustrating example control flows for layering communication protocols in accordance with some embodiments of the present disclosure.
Figure 9:
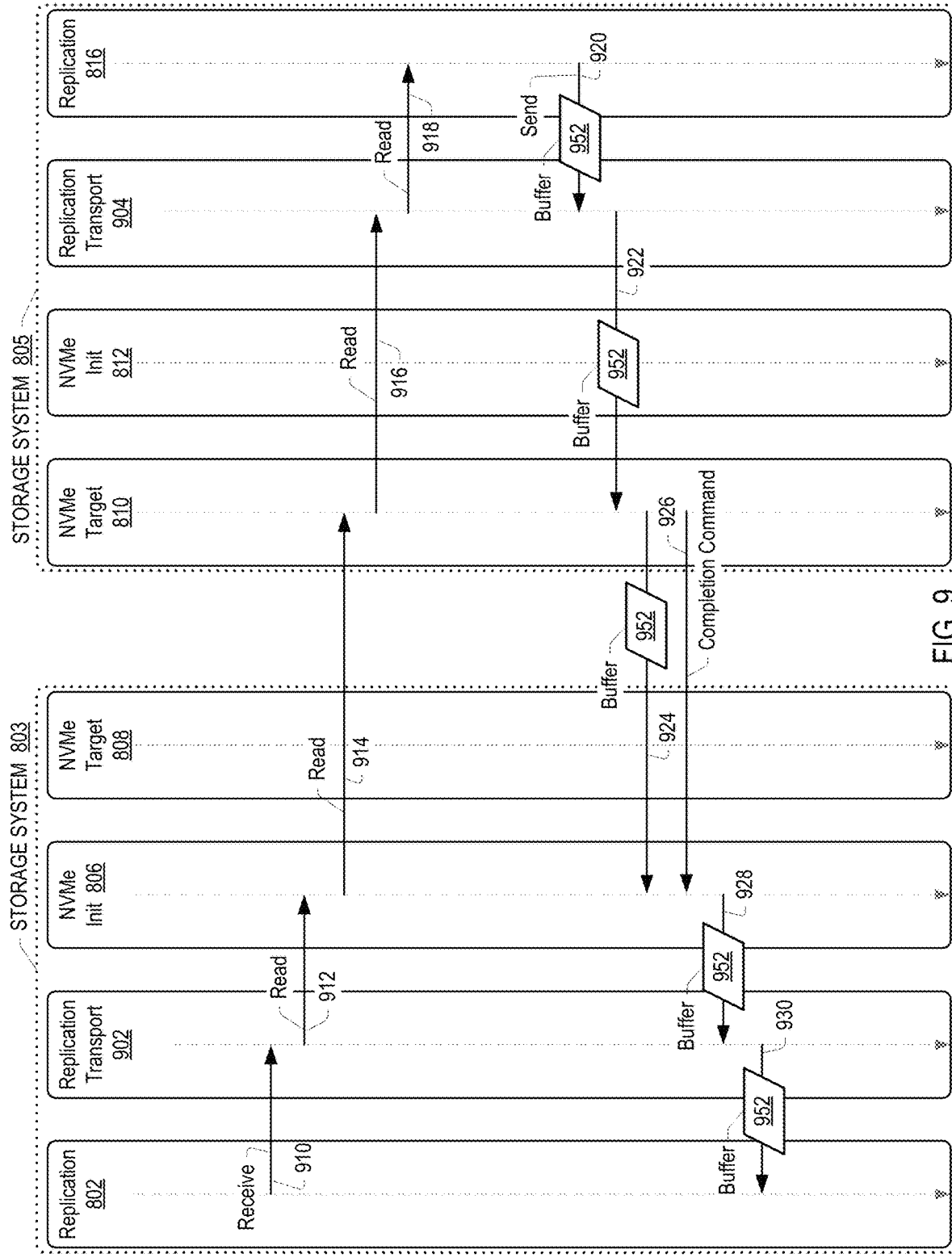
FIG. 9 sets forth a diagram illustrating example control flows for layering communication protocols in accordance with some embodiments of the present disclosure.

For further explanation, FIGS. 7, 8, and 9 illustrate aspects of selective communication protocol layering for synchronous replication between one or more storage systems according to some embodiments of the present disclosure. More specifically, as part of an example embodiment of selective communication protocol layering, FIG. 7 illustrates an example method of a listen control flow, FIG. 8 illustrates an example method of a connect/accept control flow, and FIG. 9 illustrates an example method of a send/read control flow.

FIG. 7 illustrates aspects of selective communication protocol layering for synchronous replication between one or more storage systems according to some embodiments of the present disclosure. More specifically, as part of an example embodiment of selective communication protocol layering, FIG. 7 illustrates example method of a connect/accept control flow that may be implemented on storage systems similar to the storage systems described above with reference to FIGS. 1A-1D, FIGS. 2A-2G, FIGS. 3A-3C, FIGS. 4A and 4B, FIGS. 5-6C, or any combination thereof.

In some implementations, a replication protocol may be specified to provide bidirectional communication paths established between storage systems using selective features of one or multiple standard communication protocols—where the underlying standard communication protocols are traditionally designed for data transmission in a single direction, from a computer system providing storage content to a storage system providing storage services.

Further, in some implementations, storage systems may then implement synchronous replication based on the replication protocol providing bidirectional communication between storage systems. In this way, the synchronous replication protocols described above with reference to FIGS. 6A-6C may be carried out by using the replication protocol providing bidirectional communication.

In the following examples, a group of multiple storage systems that are configured to synchronously replicate one or more datasets among each and every storage system within the group may be referred to as a cluster of storage systems, or may be equivalently referred to as an active cluster or active cluster of storage systems. As noted above, example implementations of an active cluster of storage systems synchronously replicating datasets and managing pods are described above with reference to FIGS. 6A-6C, and further described within the parent applications of the present disclosure.

In some implementation, as explained in greater detail below, some portions, but not all portions of multiple communication protocols are used to implement bidirectional data replication in a manner that is outside of the design scope of the underlying multiple communication protocols.

Further, in some implementations, by using selected aspects of the underlying communication protocols, in addition to reconfiguring aspects of the underlying communication protocols, various embodiments of a replication protocol provide for bidirectional replication of data that more efficiently—by, for example, using fewer messages as compared to a standard deployment of the underlying communication protocols—provides support for the synchronous replication protocols described above with reference to FIGS. 6A-6C, in addition to providing support for other types of replication services.

In some implementations, in addition to the replication protocols described above with reference to FIG. 6 implementing synchronous replication, the bidirectional features of the replication protocol may also be used to implement other types of data replication protocols, including asynchronous replication, or more generally, any protocol based on bidirectional transfer of data between computer systems and/or storage systems.

In some implementations, the communication protocols used may be: Fibre Channel, NVMe, NVMe over Fabrics (NVME-OF), TCP/IP, ROCE, or combinations of these communication protocols.

As one example of modifications to underlying protocols, during a discovery process for a Fibre Channel protocol layer, a given storage system may receive a log of other target storage systems. Further, in this example, at the NVMe protocol layer, the given storage system may receive a list of identifiers for the other target storage systems, where the list of identifiers may be a list of NVMe qualified names (NQNs).

However, in this example, in accordance with the replication protocol, a format of an NON may be modified to include an identifier usable by the replication protocol, where the replication protocol identifier is usable by the storage system to identify a list of storage systems that may be included within a data replication configuration. More specifically, in this example, the list of storage systems may be a list of storage systems that may be included within an active cluster of storage systems that are synchronously replicating a dataset.

Further, in some implementations, as noted above, Fibre Channel and NVMe are designed for a host computer or server to store data on a storage system, but are not designed for a connected storage system to reciprocally store storage content on the host computer, much less where the host computer and storage system are configured to synchronously replicate data.

By contrast, in some implementations, the replication protocol specifies logic that establishes bidirectional communication that is carried out by an initiator storage system establishing a communication channel in one direction with a given target storage system, and the target storage system—in response to establishing a communication channel from the initiator storage system to the target storage system and determining that there is no communication channel from the target storage system back to the initiator storage system establishes a communication channel back to the initiator storage system.

In this way, in some examples, bidirectional communication channels may be established to support the bidirectional data links described above with reference to the synchronous replication protocols described above with reference to FIGS. 6A-6C, where multiple storage systems within an active cluster provide synchronously replicated data services. In other words, the disclosed replication protocol specifies a distinct networking stack and communication protocol that is different from a deployment of standard implementations, either alone or combined, of the underlying Fibre Channel, NVMe, and IP protocols.

In some implementations, the replication protocol may provide multiple types of functionality to implement aspects of establishing connections between storage systems, listening for new storage systems coming online, and reading and sending as part of bidirectional communication between computer systems and/or storage systems.

More specifically, in some implementations that include one or more aspects of Fibre Channel, NVMe, and TCP/IP communication protocols, the replication protocol may include: (I) a replication protocol layer for active cluster (in this example, the highest layer); (II) a replication transport layer; (III) an NVMe-oF layer; and (IV) an NVMe transport layer, where, in some examples, the NVMe transport layer may be Fibre Channel.

For example, with regard to (I) above, the synchronous replication protocol layer, the replication protocol may include: (a) discovery functionality; (b) remote client connector functionality; (c) send functionality; (d) receive functionality; and (e) disconnect functionality, among others.

Discovery functionality, listed as (I)(a) above, may include:
(i) listening for remote storage system identifiers that may be interested in being included within a configuration for establishing synchronous replication—where the storage system identifier is used by the replication protocol, but not used or necessary for the underlying communication protocols;
(ii) listening to a replication transport service for new storage system identifiers or for new paths for existing storage system identifiers—where a given storage system may query other storage systems for path information, where the query may be based on respective storage system identifiers for the other storage systems in the active cluster; and
(iii) determining whether to connect using a particular one or more new paths to a given storage system in the active cluster or whether to keep using existing paths to the given storage system.

Remote client connector functionality, listed as (I)(b) above, may include:
(i) using a list or vector of paths to connect to remote storage systems;
(ii) controlling a quantity of connections to establish, and tracking if the connections are successful; and (iii) maintaining a list of paths accessible to the replication protocol layer.

Send, receive, and disconnect functionality, listed as (I)(c)(e) above, may include: sending data to other storage systems by using Fibre Channel; receiving data from other storage systems by using Fibre Channel; and disconnecting from other storage systems by initiating disposal of a transport layer endpoint or by detecting and responding to errors on a send. Further, disconnect functionality may be driven by the Fibre Channel detecting a disconnection of a target from a transport fabric.

Continuing with this example, with regard to (II) above, the replication transport layer, this layer may include: (a) messaging transport functionality; and (b) transport endpoint functionality.

Messaging transport functionality at a replication transport layer, listed as (II)(a) above, may include:
(i) listening, as an initiator and in accordance with the NVMe discovery protocol to get new NVMe qualified names (NQN) identifiers based on Fibre Channel world wide port names (WWPNs), and/or remote Fibre Channel WWPN identifiers, where in response to discovering a new storage system, the replication protocol layer listener, described above at (I)(a)(i), may be notified;
(ii) receiving connect/transport endpoint creation requests, which may include configuring or setting up a transport endpoint object that may: allocate buffers or trackers on the initiator side of a connection, allocate buffers or trackers on a target side of a connection, issue connect commands in accordance with an NVMe transport layer, wait for target connection in accordance with an NVMe transport layer;
(iii) tracking pending initiator-side connections waiting for target-side connects; and
(iv) listening to NVMe transport for target connects in order to complete an initiator connection, which may include setting up a transport endpoint object, as above, where the transport endpoint object may allocate data buffers and/or trackers for the initiator side of a connection, allocate data buffers and/or trackers for a target-side of a connection, send success messages over NVMe over Fibre Channel (FC-NVMe), and issue connect commands via an NVMe transport layer.

Transport endpoint functionality at a replication transport layer, listed as (II)(b) above, may include functionality for:
(i) receiving data as a Fibre Channel endpoint, where receiving data may also include allocating a buffer list, and further include sending a read for every allocated data buffer, where reading data is described in greater detail above with reference to FIG. 5;
(ii) sending data, where sending data may include receiving a buffer list from the replication protocol layer that interfaces with storage systems in an active cluster, and command messages to allocate target and connection specific data buffers, and may include initiating copying contents into respective NVMe read buffers;
(iii) receiving data at the replication transport layer corresponding to NVMe initiator and read completion protocols, where receiving data at the replication transport layer may also include providing a read task that may handle parsing header information, verification, allocating buffers, and copying in data;
(iv) error handling; and
(v) disconnecting from one or more storage systems in the active cluster, which may include disposing of connections at the replication transport layer and the NVMe layer.

Continuing with this example, with regard to (III) above, the NVMe-oF protocol layer, this layer may include: (a) polling; (b) initiator discovery; (c) initiator control; (d) initiator connections; (e) target control; and (f) target connections.

Polling functionality at the NVMe-oF protocol layer, listed as (III)(a) above, may determine whether an NVMe initiator connection has been successfully established, whether a target connection received a read request, whether a target control received a connection request, whether an initiator connection received a read completion, among other functions.

Initiator discovery functionality at the NVMe-oF protocol layer, listed as (III)(b) above, may get notification for new local WWPN/remote WWPN pairs, initiate NVMe discovery to obtain NVMe qualified names (NQNs), and also provide remote and local WWPNs and NQNs to the messaging transport functionality at the replication transport layer, listed as (II)(a) above.

Initiator control functionality at the NVMe-oF protocol layer, listed as (III)(c) above, may provide keep-alive services to an initiator, which may include sending keep-alive messages, terminating connections on timeouts, track keep-alive latencies, and, if no admin connections are established when a connection is requested, admin connections may be established.

Initiator connection functionality at the NVMe-oF protocol layer, listed as (III)(d) above, may maintain queue identifiers, send NVMe read commands, or answer read requests.

Target control functionality at the NVMe-oF protocol layer, listed as (III)(e) above, may determine whether a connection is accepted based on specified NQNs, and may provide callbacks to a target storage system in response to new connections.

Target connection functionality at the NVMe-oF protocol layer, listed as (III)(f) above, may provide external disconnect services or answer read requests.

Continuing with this example, with regard to (IV) above, the NVMe transport layer, this layer may include: (a) initiator functionality that may listen for local WWPNs and/or remote WWPNs, may connect to local WWPNs and/or remote WWPNs, and may send commands or data, receive data, requests for data, and responses, and disconnect; and (b) target functionality.

Turning toward FIG. 7, as noted above, FIG. 7 illustrates aspects of selective communication protocol layering for synchronous replication between one or more storage systems according to some embodiments of the present disclosure. More specifically, as part of an example embodiment of selective communication protocol layering, or a replication protocol, FIG. 7 illustrates an example method of a listen/get path control flow as part of a discovery process.

In some implementations, a storage system may listen for any path changes to a remote storage system, where if replication services are added, a notification may be received for each impacted storage system within the active cluster of storage systems.

Further, in some implementations, if any Fibre Channel switch configuration change impacts connectivity from a given storage system in an active cluster to any other storage system in the active cluster, a corresponding notification may be received for each impacted other storage system.

As illustrated in FIG. 7, establishing paths between storage systems to support bidirectional communication, where the bidirectional communication may support replication, including synchronous replication among an active cluster of storage systems, may include: replication 702, replication transport 704, NVMe discovery 706, and NVMe transport 708.

In some implementations, given one or more new replication protocol identifiers at the replication layer 702, where the replication protocol identifier is depicted as remote identifier 712, the remote identifier 712 is added 713 to a set of remote identifiers corresponding to a set of storage systems that may be included within an active cluster of storage systems replicating data among each other.

Continuing with this example, and as noted above with regard to (I)(a)(i) and (I)(a)(ii), the replication transport layer may listen for new replication protocol identifiers, and given one or more replication protocol identifiers, the replication transport 704 may be queried 716 to get paths for each of the one or more replication protocol identifiers. Further, in this example, for each of the one or more paths 717, a host, initiator, or storage system may connect 719 to each respective one or more storage system corresponding to each of the respective one or more replication protocol identifiers.

In some implementations, a host, storage system, or more generally, an initiator computing device, may register 710 a host replication NQN with a discovery service. Further, a host, or storage system, may, as part of a discovery process, receive new local/remote WWPNs for Fibre Channel addressing 714. Similarly, as depicted, a listening or discovery process for both NVMe and Fibre Channel may include connect requests 720 and corresponding responses 721, fabric connect 722, host replication NQN, discovery NQN and corresponding responses 727, and get log page requests 724 for NVMe discovery and corresponding responses 725 with the requested log pages with NVMe addressing information. However, in some examples, a discovery process may proceed without receiving log page requests.

Further, continuing with this example, in response to receiving new NQN and WWPN information 726, an update to mapping information 727 may be made, and given a new remote protocol identifier 728 obtained from parsing the new NQN, a new round of connecting may be performed—including, getting path information 730, checking mapping information 731, and, connecting for each of the new paths 732. However, in some examples, a discovery process may proceed without receiving new NQN and WWPN information. Further, in some examples, even if a protocol identifier 728 is not new, a corresponding notification is processed because a path may have changed.

In short, a listening process on a host or initiator storage system may obtain NVMe and Fibre Channel addressing information for storage systems that may become part of an active cluster of storage systems replicating a dataset among themselves, and where the host or initiator storage system may continually listen for and update path and connection information.

For further explanation, FIG. 8 illustrates aspects of selective communication protocol layering for synchronous replication between one or more storage systems according to some embodiments of the present disclosure. More specifically, as part of an example embodiment of selective communication protocol layering, or a replication protocol, FIG. 8 illustrates an example method of a connect/accept control flow.

As explained above with reference to FIG. 7, as storage systems come online or otherwise become available for storage use, a listen/get path process may establish paths between the storage systems, where available storage systems may be presented for configuration or use. For example, a user at a storage system management console may be presented with one or more storage options among the multiple storage systems, where a user may specify objects, datasets, volumes, or other storage data for replication among selected storage systems. In this example, given a set of storage systems, replication, or synchronous replication may be implemented as described above with reference to FIGS. 6A-6C, and also within the applications to which the present application draws priority.

In this example, given a path, where a path is obtained as described above with reference to FIG. 7, a storage system 803 may initiate a connection 820 with another storage system 805. Further, in this example, the responding storage system 805 may respond 880 by preparing the replication transport layer 814 to accept an incoming connect request—where selected steps of the replication protocol establishing a connection are depicted in FIG. 8 and described below.

Continuing with this example, as described above with reference to the replication protocol layer and remote client connector functionality, listed as (I)(b)(i)-(iii), given a list of paths, a storage system may initiate connections to one or more remote storage systems.

As described above, each storage system within an active cluster, or each storage system that may join an active cluster, may implement a replication protocol that includes a replication layer, a replication transport layer, an NVMe initiator layer, and an NVMe target layer. In this example, storage systems 803, 805 include these layers, respectively depicted as replication {802, 816}, replication transport {804, 814}, NVMe init {806, 812}, and NVMe target {808, 810}.

Overall, depicted in FIG. 8 are replication protocol exchanges for establishing—for each of one or more paths to one or more storage systems—bidirectional communication channels between storage systems based on selected aspects of underlying protocols. In this example, a result of establishing bidirectional communication between the storage systems 803, 805 is that each respective storage system 803, 805 will have a respective endpoint object 821, 881 usable for replication of data between the storage systems 803, 805, including synchronous replication of data.

More specifically, in this example, a storage system may initiate a discovery process and receive a list of NVMe qualified names (NQNs), where each NQN may be formatted to include both standard NVMe addressing information and a replication protocol identifier. As noted above, a replication protocol identifier may be independent of the underlying protocols, including NVMe and Fibre Channel, where the replication protocol identifier may be used to identify storage systems that may be included within an active cluster.

While storage systems, in some examples, may initiate a Fibre Channel discovery process upon storage system startup, or a reboot, where the Fibre Channel discovery process may make the storage system aware of other storage systems in a network, replication protocol identifiers may be used to identify other storage systems and storage pools for replication between the storage systems.

In some examples, a user may specify a set of storage systems that may be included within a set of storage systems in an active cluster, or more generally a user may specify storage systems that may be configured to bidirectionally replication data. For example, a user may specify a first storage system to be in a replication relationship with a second storage system, and in response, the first storage system may make a request over an IP network to the second storage system requesting the replication protocol identifier for the second storage system.

In this way, in this example, a given storage system may use replication protocol identifiers to determine which one or more other storage systems may be configured as part of a replication relationship, or which other one or more storage system may be configured to synchronously replicate data. Further, as described above, based on the replication protocol identifier, a corresponding storage system may be addressed without use of world wide port names (WWPNs) at the Fibre Channel layer.

In this example, a storage system 803 that initiates a connection may be referred to as an active side storage system, and a storage system 805 that responds to the connection request may be referred to as a passive side storage system. In this example, storage system 803, the active side storage system may issue an initial connect request to establish communication from storage system 803 to storage system 805.

Further, in this example, in response to the connect request from storage system 803, storage system 805 may connect to storage system 803—where bidirectional communication may be established based on successfully establishing communication channels from storage system 803 to storage system 805 and from storage system 805 to storage system 803. Given establishment of bidirectional communication between storage system 803 and storage system 805, the storage systems 803, 805 are configured to replicate data, including synchronously replicate data.

In general, active storage systems may listen for paths to storage systems with replication protocol identifiers that may be included in a replication relationship or active cluster, and initiate establishing bidirectional communication channels to support data replication. Further, in some examples, active storage system may also specify data to be replicated in the replication relationship, including specifying one or more datasets, volumes, objects, or other specified forms of storage content.

Continuing with this example, in response to, at the replication layer, discovering a new path 820, or an updated path, storage system 803 may initiate establishing a connection to connect 822 to the storage system corresponding to the new or updated path 820, which in this example is storage system 805. In this example, in response to the connect 822 request, a determination 823 is made as to whether an administrative queue is currently established for storage system 805, where if there is no current administrative queue for storage system 805, then an administrative connect request 824 is sent to storage system 805. Further, in this example, in response to the administrative connect request 824, storage system 805 may set 827 storage system 803 as a host system for providing data for storage.

Continuing with this example, in response to storage system 805 receiving the administrative connect request 824, storage system 805 may respond 826 to storage system 803 to establish the administrative queue.

Further, in addition to establishing an administrative queue, storage system 803 also sends an I/O connect request 828 to storage system 805 to establish I/O queues to hold data to be transferred from storage system 805 to storage system 803. Continuing with this example, in response to storage system 805 receiving the I/O connect request 828, storage system 805 may respond 830 to storage system 803 to establish one or more I/O queues on storage system 803. Further, in this example, in response to storage system 805 receiving the I/O connect request 828, storage system 805 may determine that the connection 829 on the target side, storage system 805, in this case, is complete. As discussed above with reference to FIGS. 4A-5, read operations may be made more efficient by pre-allocating buffer space to reduce a number of messages needed to transfer data between storage system 803 and storage system 805.

In this example, based on establishing the administrative queue and the one or more I/O queues on storage system 803, data may be transferred from storage system 805 to storage system 803, and a connection 831 from the direction of storage system 805 to storage system 803 may be considered established.

Continuing with this example, in accordance with the replication protocol, in response to the connection 822 request from storage system 803, and as part of the operations performed in response to storage system 805 preparing to send data to storage system 803, and in response to a connection being formed based on the connection complete 829 notification, storage system 805 may initiate a connection 832 from the direction of storage system 805 to storage system 803.

In this example, in response to the connect 832 request, a determination 833 is made as to whether an administrative queue is currently established for storage system 805, where if there is no current administrative queue for storage system 803, then an administrative connect request 834 is sent to storage system 803.

Continuing with this example, in response to storage system 803 receiving the administrative connect request 834, storage system 803 may respond 836 to storage system 805 to establish the administrative queue. Further, in this example, in response to the administrative connect request 834, storage system 803 may set 835 storage system 805 as a host system for providing data for storage.

Further, in addition to establishing an administrative queue, storage system 805 also sends an I/O connect request 838 to storage system 803 to establish I/O queues to hold data to be transferred from storage system 805 to storage system 803. Continuing with this example, in response to storage system 803 receiving the I/O connect request 838, storage system 803 may respond 840 to storage system 805 to establish one or more I/O queues on storage system 805. Further, in this example, in response to storage system 803 receiving the I/O connect request 838, storage system 803 may determine that the connection 839 on the target side, storage system 803, in this case, is complete.

In this example, based on establishing the administrative queue and the one or more I/O queues on storage system 805, data may be transferred from storage system 803 to storage system 805, and a connection 841 from the direction of storage system 803 to storage system 805 may be considered established.

In this way, given establishment of communication in both directions between storage system 803 and storage system 805, respective endpoints 821, 881 may be considered established, as described above with reference to the replication transport layer, described above with reference to (II)(b)(i)-(v).

For further explanation, FIG. 9 illustrates aspects of selective communication protocol layering for synchronous replication between one or more storage systems according to some embodiments of the present disclosure. More specifically, as part of an example embodiment of selective communication protocol layering, or a replication protocol, FIG. 9 illustrates an example method of a send/read control flow.

In this example, multiple storage systems are online or otherwise available for storage use, and listen/get path process, as described above with reference to FIG. 7, may have established paths between the storage systems. Further, in this example, the multiple storage systems may have performed a connect/accept control flow to establish bidirectional communication channels. In this example, given a set of storage systems, replication, or synchronous replication may be implemented as described above with reference to FIGS. 6A-6C, and also within the applications to which the present application draws priority.

In this example, therefore, the storage systems 803, 805 are configured in accordance with the replication protocol to replicate data among themselves. Continuing with this example, at the replication 802 layer, data may be read from storage system 805 beginning at receive 910, which initiates a read operation that moves through multiple layers of replication protocol, NVMe protocol, and Fibre Channel protocol.

More specifically, in this example, and as illustrated in FIG. 9, reads (912, 914, 916, 918) pass through, respectively, the replication transport 902 layer and the NVMe init 806 layer on the initiator storage system, storage system 803. Further, in this example, the read 914 is received at the target storage system 805 at the NVMe target layer 810, and reaches the replication 816 layer through the replication transport 904 layer.

In this example, for simplicity, a single read passes through the protocol layers directly, however, in an implementation, a storage system implementing a replication protocol may implement management of handling multiple reads and sends, including queues to hold pending reads, completed reads, pending sends, reads to reissue, and received payloads. Further, in some implementations, a pending reads queue may keep track of NVMe submission queue entries (SQEs), a completed reads queue may track data and status of NVMe reads ready for transmission, a pending sends queue may store buffers for use by a replication layer to send data, a reads to reissue queue may keep track of SQEs to send out, and a received payloads queue may hold received payloads, or storage content, from a read command in response to a completion queue entry (CQE) status being received.

Continuing with this example, in response to storage system 805 receiving a read from storage system 803, storage system 805, at the replication 816 layer, initiate a response that sends 920 storage content to storage system 803. More specifically, in this example, and as illustrated in FIG. 9, a buffer 952 of storage content passes through, respectively, the replication transport 902 layer, as indicated at 922, and the NVMe target 810 layer on storage system 805, where the payload or storage content in the buffer is sent 924, and where completion command 926 (CQE) is sent. Further, in this example, the buffer 952 is received at the initiator storage system 803 at the NVMe init layer 806, and reaches the replication 802 layer through the replication transport 904 layer, as indicated at 928, 930.

In this way, in this example, data may be replicated between storage systems 803, 805. In other words, given the bidirectional communication established by the replication protocol, data may be replicated between storage system 805 and storage system 803, where replication may be performed synchronously, as described in greater detail above with reference to FIGS. 6A-6C.

Figure 10:
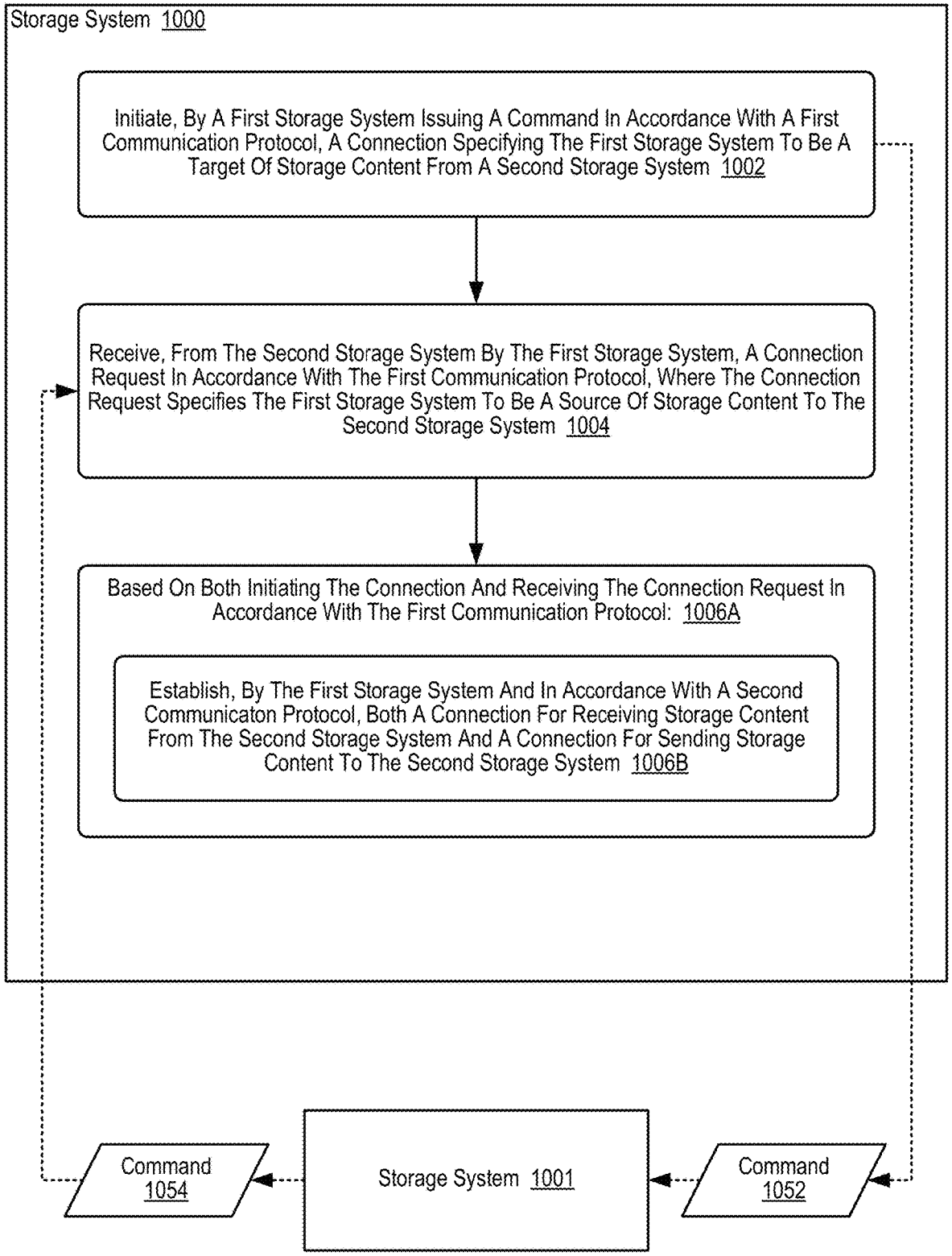
FIG. 10 sets forth a flow chart illustrating an example method of layering communication protocols in accordance with some embodiments of the present disclosure.

For further explanation, FIG. 10 sets forth an example method of selective communication protocol layering for synchronous replication between one or more storage systems according to some embodiments of the present disclosure. The example storage systems, storage system 1000 and storage system 1001, may be implemented as described above with reference to FIGS. 1A-9.

The example method depicted in FIG. 10 includes: initiating 1002, by a first storage system 1000 issuing a command 1052 in accordance with a first communication protocol, a connection specifying the first storage system 1000 to be a target of storage content from a second storage system 1001; receiving 1004, from the second storage system 1001 by the first storage system 1000, a connection request 1054 in accordance with the first communication protocol, where the connection request 1054 specifies the first storage system 1000 to be a source of storage content to the second storage system 1001; and based on 1006A both initiating 1002 the connection and receiving 1004 the connection request 1054 in accordance with the first communication protocol: establishing 1006B, by the first storage system 1000 and in accordance with a second communication protocol, both a connection for receiving storage content from the second storage system 1001 and a connection for sending storage content to the second storage system 1001.

Initiating 1002, by a first storage system 1000 issuing a command 1052 in accordance with a first communication protocol, a connection specifying the first storage system 1000 to be a target of storage content from a second storage system 1001 may be carried out as described above with reference to FIGS. 7-9. More specifically, initiating 1002, by the first storage system 1000, a connection may be carried out similarly to storage system 803, given a new path 820, or path update, initiating a connect 822, and making admin connect request 824 and I/O connect request 828, as part of establishing communication from storage system 803 to storage system 805.

Receiving 1004, from the second storage system 1001 by the first storage system 1000, a connection request 1054 in accordance with the first communication protocol, where the connection request 1054 specifies the first storage system 1000 to be a source of storage content to the second storage system 1001 may be carried out as described above with reference to FIGS. 7-9. More specifically, receiving 1004, by the first storage system 1001, a connection request 1054 may be carried out similarly to storage system 803 receiving an admin connect request 834, where establishing communication channel from storage system 805 to storage system 803 includes storage system setting 835 storage system 805 as a host and completing 839 the target connection.

Based on 1006A both initiating 1002 the connection and receiving 1004 the connection request 1054 in accordance with the first communication protocol: establishing 1006B, by the first storage system 1000 and in accordance with a second communication protocol, both a connection for receiving storage content from the second storage system 1001 and a connection for sending storage content to the second storage system 1001 may be carried out as described above with reference to FIGS. 7-9.

More specifically, as described above, NVMe may be a communication protocol that may be used to establish a given communication channel in one direction from storage system 803 to storage system 805. In this example, NVMe may be the first communication protocol, and the replication protocol described above may be the second communication protocol. However, in contrast to exclusively using NVMe, the replication protocol may specify that the passive storage system—where in these examples, storage system 803 is an active storage system and storage system 805 is a passive storage system—responds to establishing a communication channel from storage system 803 to storage system 805 by initiating establishment of a communication channel from storage system 805 to storage system 803.

In this way, storage systems 803, 805 are configured in accordance with the replication protocol to replicate data among themselves, and to implement synchronous replication within an active cluster of storage systems.

Figure 11:
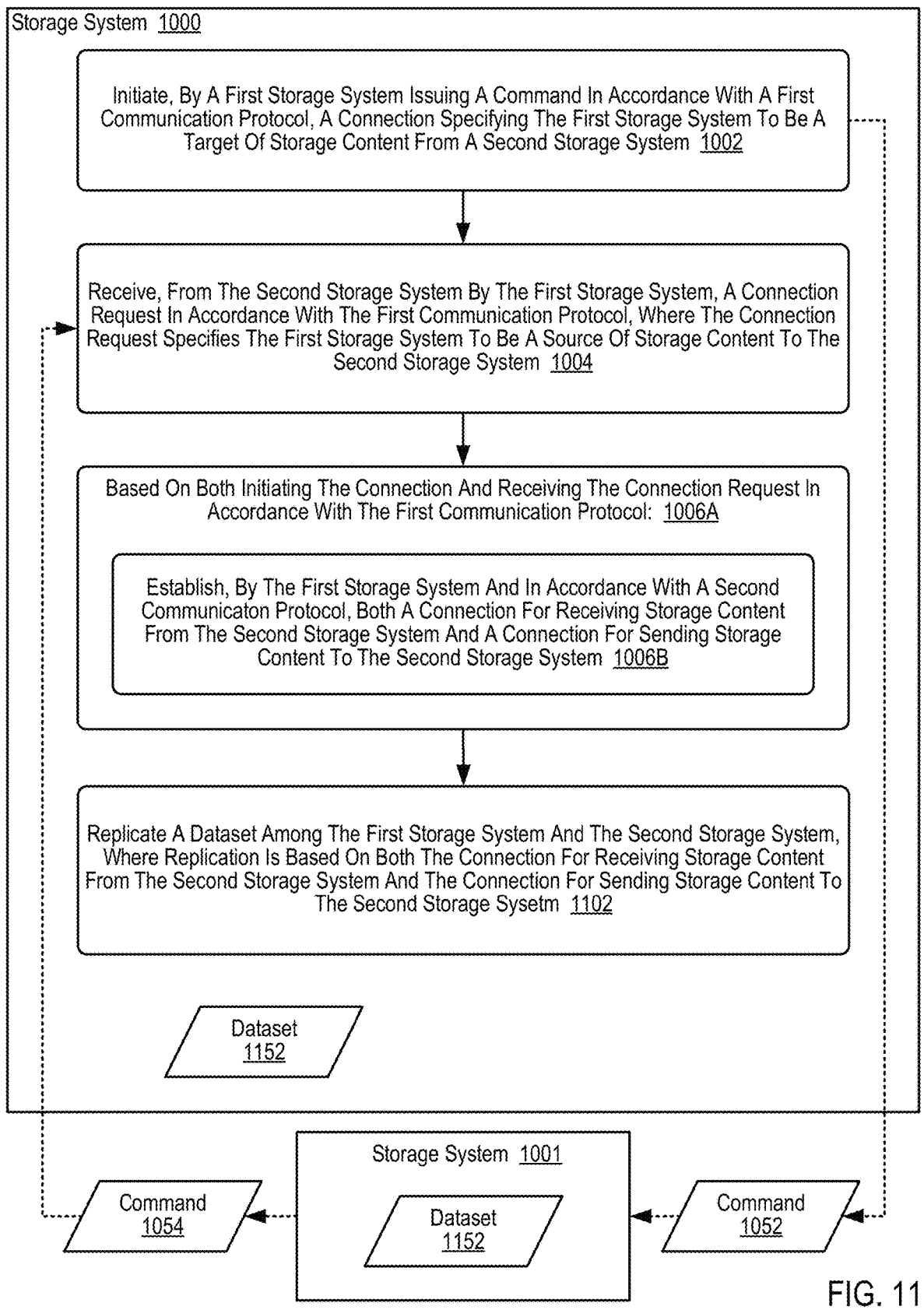
FIG. 11 sets forth a flow chart illustrating an example method of layering communication protocols in accordance with some embodiments of the present disclosure.

For further explanation, FIG. 11 sets forth an example method of selective communication protocol layering for synchronous replication between one or more storage systems according to some embodiments of the present disclosure. The example storage systems, storage system 1000 and storage system 1001, may be implemented as described above with reference to FIGS. 1A-9.

The example method depicted in FIG. 11 is similar to the example method depicted in FIG. 10 in that the example method depicted in FIG. 11 also includes: initiating 1002, by a first storage system 1000 issuing a command 1052 in accordance with a first communication protocol, a connection specifying the first storage system 1000 to be a target of storage content from a second storage system 1001; receiving 1004, from the second storage system 1001 by the first storage system 1000, a connection request 1054 in accordance with the first communication protocol, where the connection request 1054 specifies the first storage system 1000 to be a source of storage content to the second storage system 1001; and based on 1006A both initiating 1002 the connection and receiving 1004 the connection request 1054 in accordance with the first communication protocol: establishing 1006B, by the first storage system 1000 and in accordance with a second communication protocol, both a connection for receiving storage content from the second storage system 1001 and a connection for sending storage content to the second storage system 1001.

However, the example method depicted in FIG. 11, in contrast to the example method depicted in FIG. 10, further includes: replicating 1102 a dataset 1152 among the first storage system 1000 and the second storage system 1001, where the replication is based on both the connection for receiving storage content from the second storage system 1001 and the connection for sending storage content to the second storage system 1001.

Replicating 1102 a dataset 1152 among the first storage system 1000 and the second storage system 1001, where the replication is based on both the connection for receiving storage content from the second storage system 1001 and the connection for sending storage content to the second storage system 1001 may be carried out as described above with reference to FIGS. 6A-6C and 7-10.

More specifically, as described above, a user at a storage system management console may be presented with one or more storage options among the multiple storage systems, where a user may specify objects, datasets, volumes, or other storage data for replication among selected storage systems. In this example, given a set of storage systems, replication, or synchronous replication may be implemented as described above with reference to FIGS. 6A-6C, and also within the applications to which the present application draws priority.

Continuing with this example, a user may specify a first storage system to be in a replication relationship with a second storage system. Further, as described above, a replication relationship is established according to the replication protocol and may be synchronous, as in an active cluster, or asynchronous.

Example embodiments are described largely in the context of a fully functional computer system. Readers of skill in the art will recognize, however, that the present disclosure also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method as embodied in a computer program product. Persons skilled in the art will recognize also that, although some of the example embodiments described in this specification are oriented to software installed and executing on computer hardware, nevertheless, alternative embodiments implemented as firmware or as hardware are well within the scope of the present disclosure.

Embodiments can include be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to some embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Readers will appreciate that the steps described herein may be carried out in a variety ways and that no particular ordering is required. It will be further understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A method comprising:
    initiating, by a first storage system, using a first communication protocol, a first connection request specifying the first storage system to be a target of storage content from a second storage system;
    in response to the first storage system issuing the first connection request, receiving, from the second storage system by the first storage system, a second connection request that also uses the first communication protocol, wherein the second connection request specifies the first storage system to be a source of storage content to the second storage system; and
    based on the first connection request in accordance with and the second connection request that both use the first communication protocol:
        establishing, by the first storage system and in accordance with a second communication protocol, a bidirectional replication connection between the first storage system and the second storage system.

2. The method of claim 1, wherein the first communication protocol is non-volatile memory express over Fabrics (NVMeoF).

3. The method of claim 2, wherein the second communication protocol is a replication protocol specifying portions of the first communication protocol to use, specifying an active storage system as an initiator of bidirectional communication, and specifying a passive storage system as responsive to creating bidirectional communication.

4. The method of claim 3, wherein the replication protocol further specifies that an NVMe qualified name (NON) is formatted to include a replication protocol identifier that corresponds to a storage system.

5. The method of claim 4, wherein a third communication protocol is used for the first storage system to request one or more replication protocol identifiers for one or more storage systems, and wherein the third communication protocol is TCP/IP.

6. The method of claim 1, further comprising:
    replicating a dataset among the first storage system and the second storage system, and wherein replication of the dataset is based on both the first connection request for receiving storage content from the second storage system and the second connection request for sending storage content to the second storage system.

7. The method of claim 6, wherein replication of the dataset is synchronous or asynchronous.

8. The method of claim 1, further comprising:
based on the first connection request and the second connection request that both use the first communication protocol:
establishing, by the first storage system and in accordance with a second communication protocol, one or more of an administrative communication connection or a migration connection between the first storage system and the second storage system.

9. An apparatus comprising a computer processor, a computer memory operatively coupled to the computer processor, the computer memory having disposed within it computer program instructions that, when executed by the computer processor, cause the apparatus to carry out the steps of:
initiating, by a first storage system, using a first communication protocol, a first connection request specifying the first storage system to be a target of storage content from a second storage system;
in response to the first storage system issuing the first connection request, receiving, from the second storage system by the first storage system, a second connection request that also uses the first communication protocol, wherein the second connection request specifies the first storage system to be a source of storage content to the second storage system; and
based on the first connection request in accordance with and the second connection request that both use the first communication protocol:
establishing, by the first storage system and in accordance with a second communication protocol, a bidirectional replication connection between the first storage system and the second storage system.

10. The apparatus of claim 9, wherein the first communication protocol is non-volatile memory express over Fabrics (NVMeoF).

11. The apparatus of claim 10, wherein the second communication protocol is a replication protocol specifying portions of the first communication protocol to use, specifying an active storage system as an initiator of bidirectional communication, and specifying a passive storage system as responsive to creating bidirectional communication.

12. The apparatus of claim 11, wherein the replication protocol further specifies that an NVMe qualified name (NON) is formatted to include a replication protocol identifier that corresponds to a storage system.

13. The apparatus of claim 12, wherein a third communication protocol is used for the first storage system to request one or more replication protocol identifiers for one or more storage systems, and wherein the third communication protocol is TCP/IP.

14. The apparatus of claim 12, wherein the program instructions, when executed by the computer processor, further cause the processor to carry out the steps of:
replicating a dataset among the first storage system and the second storage system, and wherein replication of the dataset is based on both the first connection request for receiving storage content from the second storage system and the second connection request for sending storage content to the second storage system.

15. The apparatus of claim 14, wherein replication of the dataset is synchronous or asynchronous.

16. A computer program product disposed upon a computer readable medium, the computer program product comprising computer program instructions that, when executed, cause a computer to carry out the steps of:
initiating, by a first storage system, using a first communication protocol, a first connection request specifying the first storage system to be a target of storage content from a second storage system;
in response to the first storage system issuing the first connection request, receiving, from the second storage system by the first storage system, a second connection request that also uses the first communication protocol, wherein the second connection request specifies the first storage system to be a source of storage content to the second storage system; and
based on the first connection request in accordance with and the second connection request that both use the first communication protocol:
establishing, by the first storage system and in accordance with a second communication protocol, a bidirectional replication connection between the first storage system and the second storage system.

17. The computer program product of claim 16, wherein the first communication protocol is non-volatile memory express over Fabrics (NVMeoF).

18. The computer program product of claim 17, wherein the second communication protocol is a replication protocol specifying portions of the first communication protocol to use, specifying an active storage system as an initiator of bidirectional communication, and specifying a passive storage system as responsive to creating bidirectional communication.

19. The computer program product of claim 18, wherein the replication protocol further specifies that an NVMe qualified name (NON) is formatted to include a replication protocol identifier that corresponds to a storage system.

20. The computer program product of claim 19, wherein a third communication protocol is used for the first storage system to request one or more replication protocol identifiers for one or more storage systems, and wherein the third communication protocol is TCP/IP.

21. The computer program product of claim 16, wherein the computer program instructions, when executed, further cause a computer to carry out the steps of:
replicating a dataset among the first storage system and the second storage system, and wherein replication of the dataset is based on both the first connection request for receiving storage content from the second storage system and the second connection request for sending storage content to the second storage system.

* * * * *